(12) United States Patent
Zhou et al.

(10) Patent No.: US 10,868,025 B2
(45) Date of Patent: Dec. 15, 2020

(54) THREE-DIMENSIONAL MEMORY DEVICE INCLUDING REPLACEMENT CRYSTALLINE CHANNELS AND METHODS OF MAKING THE SAME

(71) Applicant: SANDISK TECHNOLOGIES LLC, Addison, TX (US)

(72) Inventors: Fei Zhou, San Jose, CA (US); Adarsh Rajashekhar, Santa Clara, CA (US); Rahul Sharangpani, Fremont, CA (US); Raghuveer S. Makala, Campbell, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 85 days.

(21) Appl. No.: 16/200,115

(22) Filed: Nov. 26, 2018

(65) Prior Publication Data
US 2020/0168619 A1   May 28, 2020

(51) Int. Cl.
| | |
|---|---|
| *H01L 27/1157* | (2017.01) |
| *H01L 27/11524* | (2017.01) |
| *H01L 27/11556* | (2017.01) |
| *H01L 23/522* | (2006.01) |
| *H01L 27/11582* | (2017.01) |

(52) U.S. Cl.
CPC .... *H01L 27/11524* (2013.01); *H01L 23/5226* (2013.01); *H01L 27/1157* (2013.01); *H01L 27/11556* (2013.01); *H01L 27/11582* (2013.01)

(58) Field of Classification Search
USPC ........................................................ 257/330
IPC ................ H01L 27/11582,27/11565, 27/11524, 23/5226, 27/1157, 27/11573, 27/11556, 27/11575
See application file for complete search history.

(56) References Cited

U.S. PATENT DOCUMENTS

| | | |
|---|---|---|
| 5,915,167 A | 6/1999 | Leedy |
| 9,230,980 B2 | 1/2016 | Rabkin et al. |
| (Continued) | | |

OTHER PUBLICATIONS

U.S. Appl. No. 15/626,444, filed Jun. 19, 2017, SanDisk Technologies LLC.

(Continued)

*Primary Examiner* — Hrayr A Sayadian
(74) *Attorney, Agent, or Firm* — The Marbury Law Group PLLC

(57) ABSTRACT

In-process source-level material layers including a source-level sacrificial layer are formed over a substrate. An alternating stack of insulating layers and sacrificial material layers is formed over the in-process source-level material layers. A memory opening is formed through the alternating stack, and is filled with a memory film and a sacrificial opening fill structure. The source-level sacrificial layer is replaced with a source contact layer including a doped polycrystalline semiconductor material. The source contact layer can be formed by diffusing a metal in a metallic catalyst material through a semiconductor fill material layer that fills a source cavity formed by removal of the source-level sacrificial layer. The sacrificial opening fill structure is replaced with a vertical semiconductor channel, which can be formed with large grains due to large crystal sizes in the source contact layer. The sacrificial material layers are replaced with electrically conductive layers.

13 Claims, 41 Drawing Sheets

(56) References Cited

U.S. PATENT DOCUMENTS

| | | |
|---|---|---|
| 9,267,395 B2 | 2/2016 | Nendel |
| 9,449,981 B2 | 9/2016 | Pachamuthu et al. |
| 9,478,495 B1 | 10/2016 | Pachamuthu et al. |
| 9,870,945 B2 | 1/2018 | Pachamuthu et al. |
| 9,985,098 B2 | 5/2018 | Matsumoto et al. |
| 10,008,570 B2 | 6/2018 | Yu et al. |
| 10,020,363 B2 | 7/2018 | Ogawa et al. |
| 10,115,681 B1 | 10/2018 | Ariyoshi |
| 10,121,794 B2 | 11/2018 | Gunji-Yoneoka et al. |
| 10,629,616 B1 * | 4/2020 | Kai .......................... H01L 24/80 |
| 2007/0029607 A1 | 2/2007 | Kouznetzov |
| 2017/0365613 A1 | 12/2017 | Gunji-Yoneoka et al. |
| 2018/0122904 A1 | 5/2018 | Matsumoto et al. |
| 2018/0122905 A1 | 5/2018 | Ogawa et al. |
| 2018/0122906 A1 | 5/2018 | Yu et al. |
| 2019/0148372 A1 * | 5/2019 | Miao .................... H01L 27/088 257/329 |
| 2019/0371807 A1 * | 12/2019 | Nishikawa ........ H01L 27/11556 |

OTHER PUBLICATIONS

U.S. Appl. No. 15/633,131, filed Jun. 26, 2017, SanDisk Technologies LLC.
U.S. Appl. No. 15/669,243, filed Aug. 4, 2017, SanDisk Technologies LLC.
U.S. Appl. No. 15/888,714, filed Feb. 5, 2018, SanDisk Technologies LLC.
U.S. Appl. No. 15/997,194, filed Jun. 4, 2018, SanDisk Technologies LLC.
U.S. Appl. No. 16/019,904, filed Jun. 27, 2018, SanDisk Technologies LLC.
U.S. Appl. No. 16/019,961, filed Jun. 27, 2018, SanDisk Technologies LLC.
U.S. Appl. No. 16/196,026, filed Nov. 20, 2018, SanDisk Technologies LLC.
Radnoczi, G.Z. et al., "Structural Characterization of Nanostructures Grown by Ni metal Induced lateral Crystallization of Amorphous-Si," Journal of Applied Physics, vol. 119, pp. 065303-1 to 065303-15, (2016).

* cited by examiner

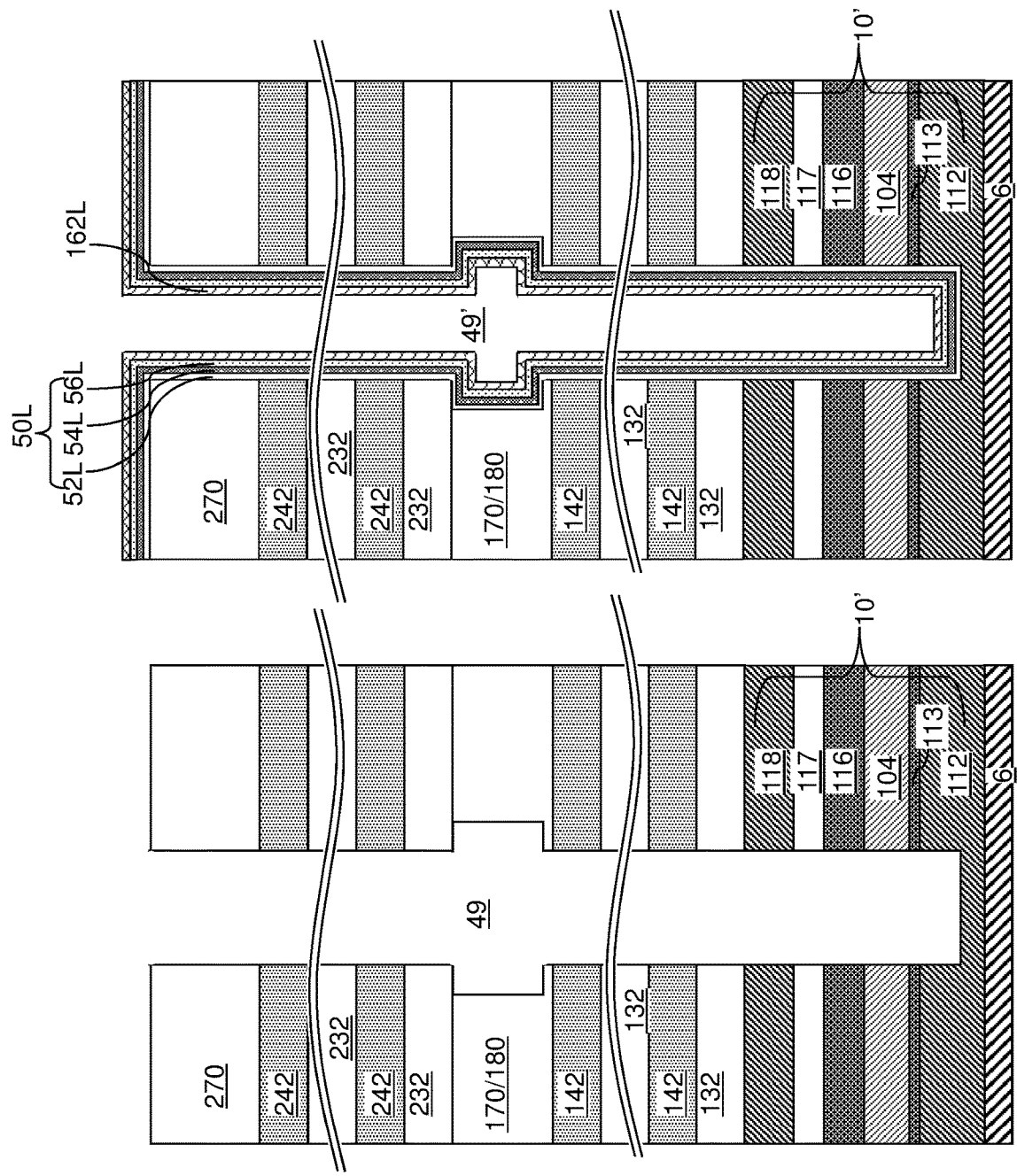

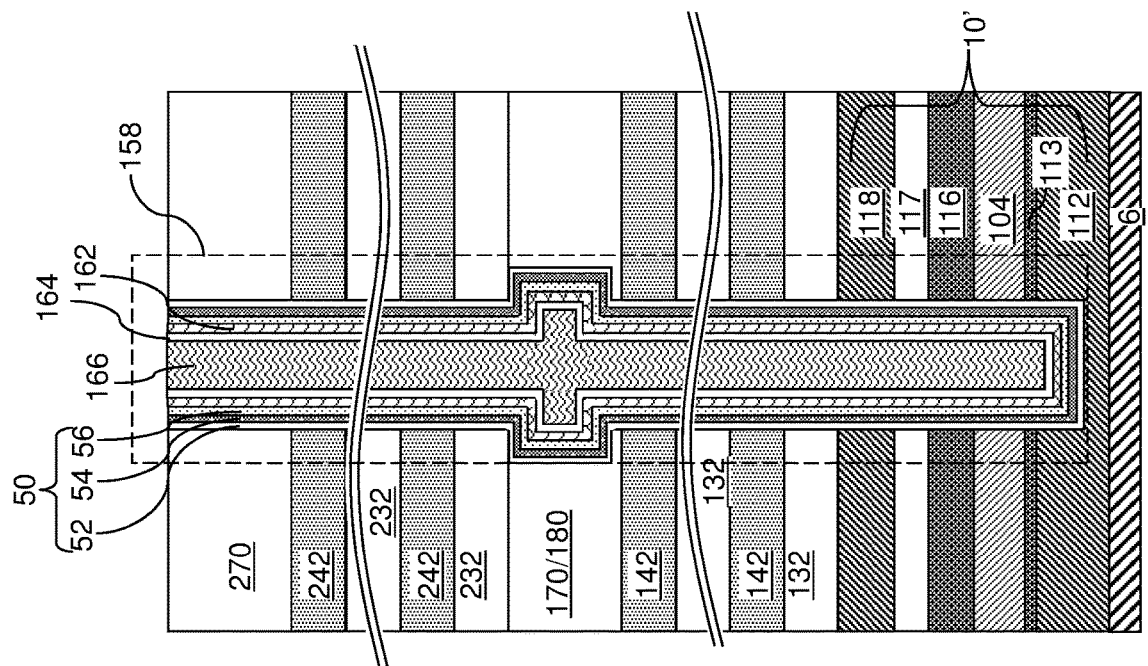
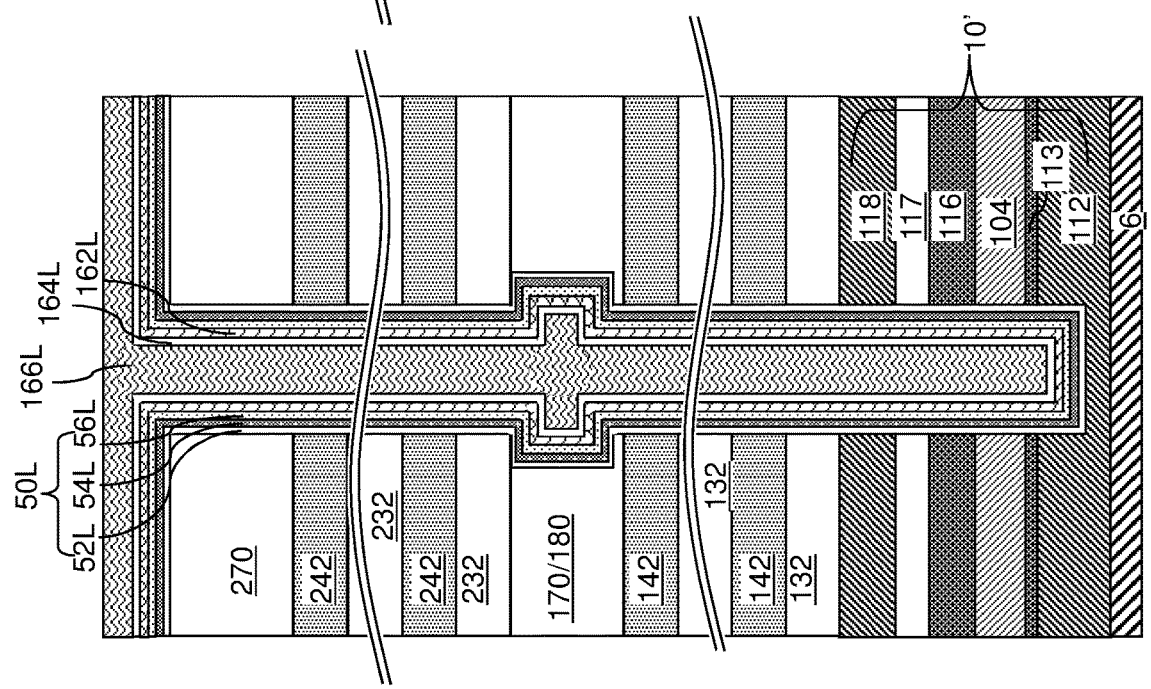

THREE-DIMENSIONAL MEMORY DEVICE INCLUDING REPLACEMENT CRYSTALLINE CHANNELS AND METHODS OF MAKING THE SAME

FIELD

The present disclosure relates generally to the field of semiconductor devices and specifically to a three-dimensional memory device including replacement crystalline channels and methods of making the same.

BACKGROUND

Recently, ultra-high-density storage devices using three-dimensional (3D) memory stack structures have been proposed. For example, a 3D NAND memory device can be formed from an array of an alternating stack of insulating materials and spacer material layers that are formed as electrically conductive layers or replaced with electrically conductive layers over a substrate. Memory openings are formed through the alternating stack, and are filled with memory stack structures, each of which includes a vertical stack of memory elements and a vertical semiconductor channel.

SUMMARY

According to an aspect of the present disclosure, a three-dimensional semiconductor device is provided, which comprises: source-level material layers comprising a source contact layer including a doped crystalline semiconductor material; an alternating stack of insulating layers and electrically conductive layers located over the source-level material layers; a memory opening extending through the alternating stack and through the source contact layer; and a memory opening fill structure including a memory film and a vertical semiconductor channel laterally surrounded by the memory film, wherein a semiconductor-to-semiconductor interface between the vertical semiconductor channel and the source contact layer is laterally offset farther away from a vertical axis passing through a geometrical center of the memory opening fill structure than a semiconductor-to-dielectric interface between the vertical semiconductor channel and the memory film is from the vertical axis.

According to another aspect of the present disclosure, a method of forming a three-dimensional memory device is provided, which comprises the steps of: forming in-process source-level material layers over driver circuitry located on a substrate, wherein the in-process source-level material layers comprise a source-level sacrificial layer; forming an alternating stack of insulating layers and sacrificial material layers over the in-process source-level material layers; forming a memory opening through the alternating stack and down to the source-level sacrificial layer; forming a memory film and a sacrificial opening fill structure in the memory opening; replacing the source-level sacrificial layer with a source contact layer including a doped polycrystalline semiconductor material; replacing the sacrificial opening fill structure with a vertical semiconductor channel; and replacing the sacrificial material layers with electrically conductive layers.

BRIEF DESCRIPTION OF THE DRAWINGS

FIGS. 9A-9D illustrate sequential vertical cross-sectional views of a memory opening during formation of an in-process memory opening fill structure according to an embodiment of the present disclosure.

DETAILED DESCRIPTION

Figure 1A:
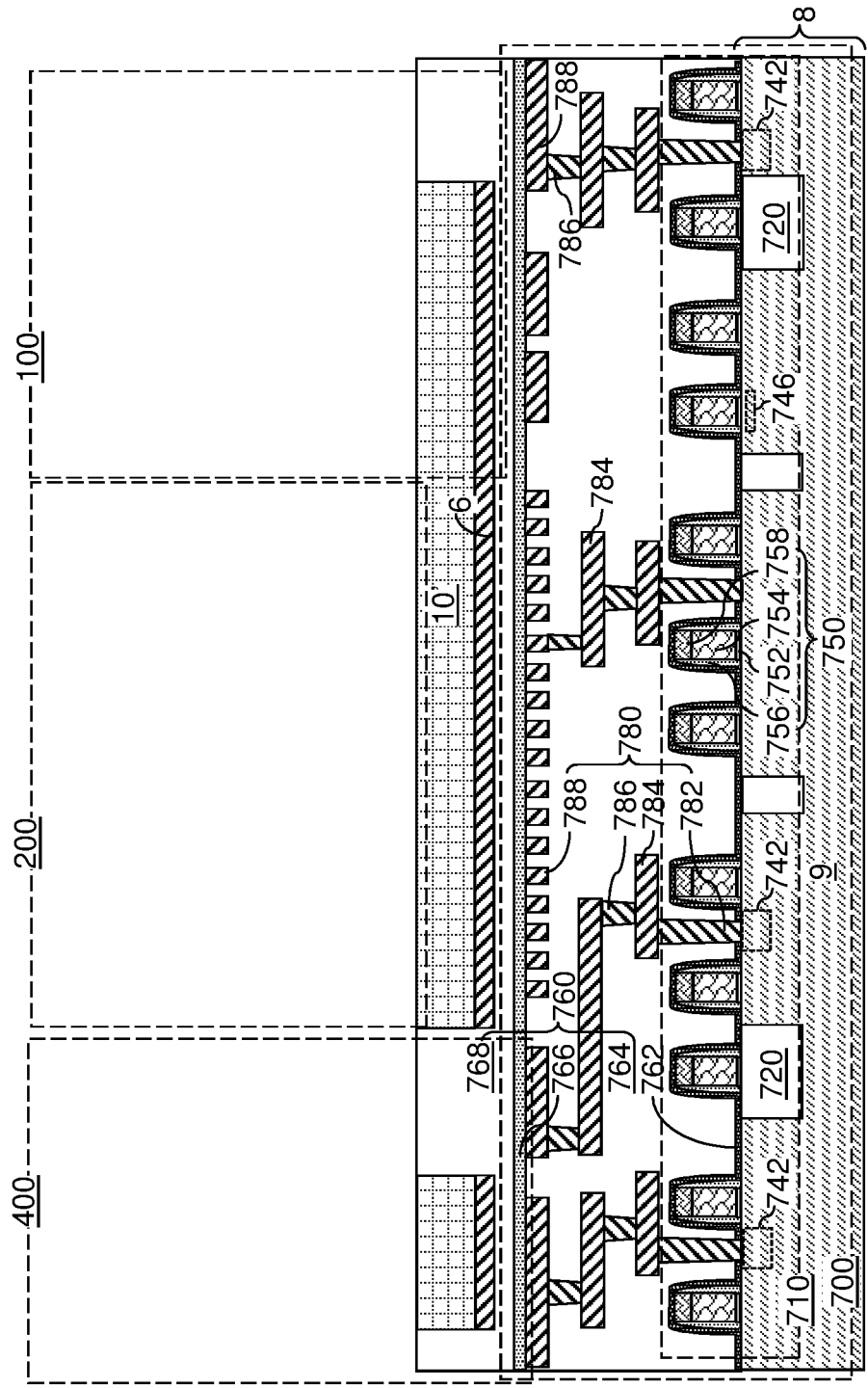
FIG. 1A is a vertical cross-sectional view of an exemplary structure after formation of semiconductor devices, lower level dielectric layers, lower metal interconnect structures, and in-process source level material layers on a semiconductor substrate according to a first embodiment of the present disclosure.

As the number of word line levels increases in a 3D NAND memory device increases, the length of a vertical semiconductor channel of each memory stack structure increases, thereby reducing the on-current for the vertical field effect transistor including the vertical semiconductor channel. Reduction of the on-current for vertical field effect transistors poses a significant challenge to scaling of the 3D NAND stacked memory device for future generations. As discussed above, the embodiments of the present disclosure are directed to a three-dimensional memory device including replacement crystalline channels and methods of making the same, the various aspects of which are discussed in detail hereinbelow. The embodiments provide a memory stack structure capable of providing a higher on-current for memory stack structures of a 3D NAND memory device.

The drawings are not drawn to scale. Multiple instances of an element may be duplicated where a single instance of the element is illustrated, unless absence of duplication of elements is expressly described or clearly indicated otherwise. Same reference numerals refer to the same element or to a similar element. Elements having the same reference numerals are presumed to have the same material composition unless expressly stated otherwise. Ordinals such as "first," "second," and "third" are used merely to identify similar elements, and different ordinals may be used across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between or at a top surface and a bottom surface of the continuous structure. A layer may extend horizontally, vertically, and/or along a tapered surface. A substrate may be a layer, may include one or more layers therein, and/or may have one or more layer thereupon, thereabove, and/or therein below.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device.

The various three-dimensional memory devices of the present disclosure include a monolithic three-dimensional NAND string memory device, and can be fabricated using the various embodiment methods described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Figure 1B:
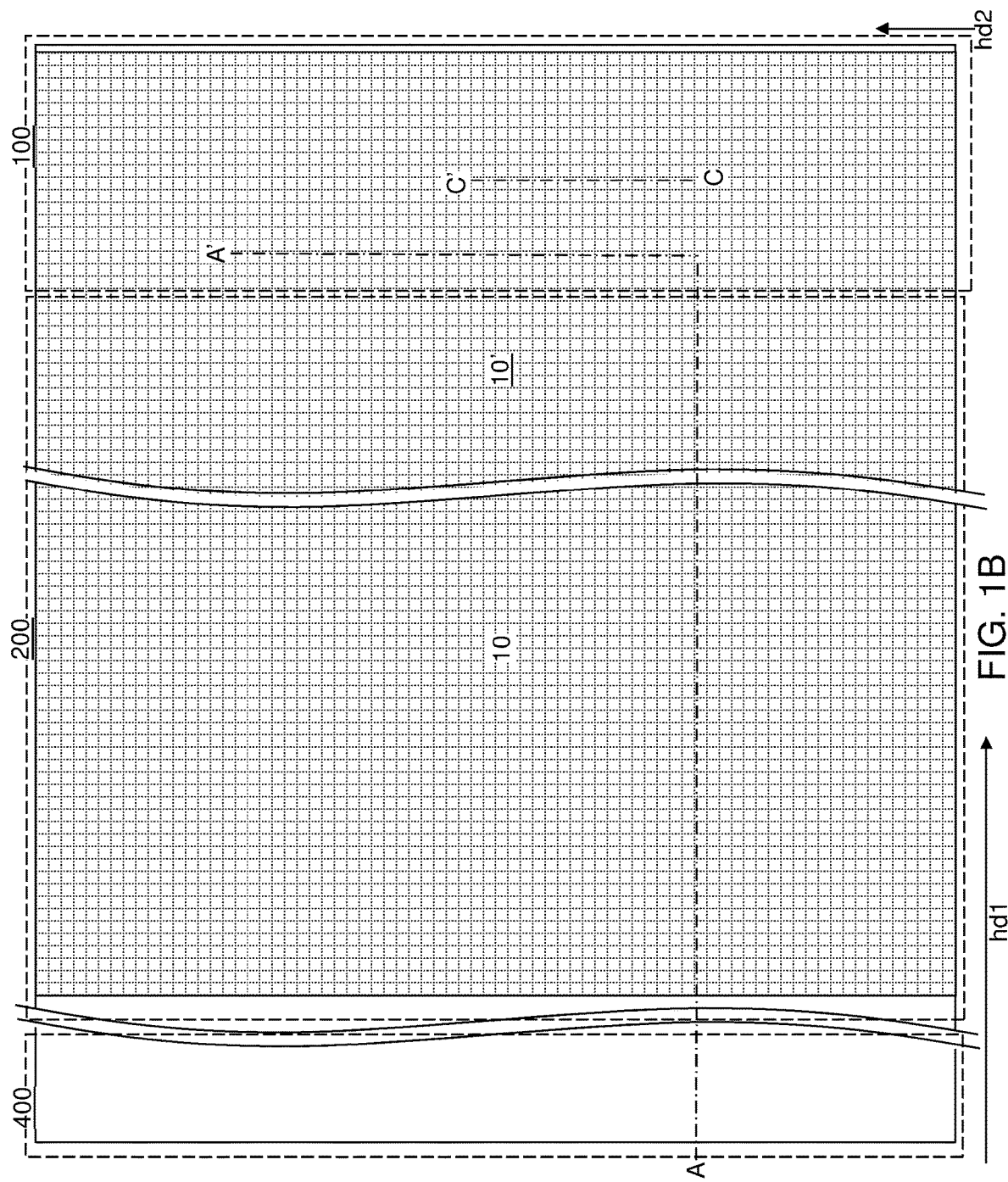
FIG. 1B is a top-down view of the exemplary structure of FIG. 1A. The hinged vertical plane A-A' is the plane of the vertical cross-sectional view of FIG. 1A.
Figure 1C:
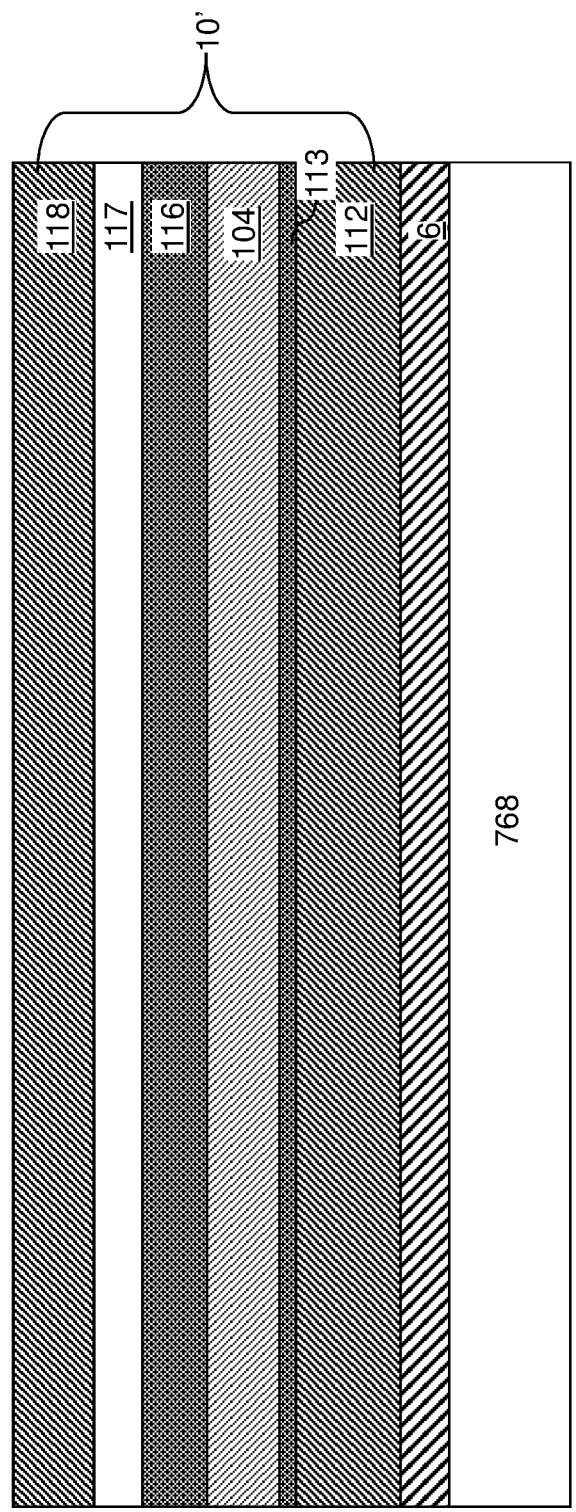
FIG. 1C is a magnified view of the in-process source level material layers along the vertical plane C-C' of FIG. 1B.

Referring to FIGS. 1A-1C, a first exemplary structure according to a first embodiment of the present disclosure is illustrated. FIG. 1C is a magnified view of an in-process source-level material layers 10' illustrated in FIGS. 1A and 1B. The first exemplary structure includes a semiconductor substrate 8 and semiconductor devices 710 formed thereupon. The semiconductor substrate 8 includes a substrate semiconductor layer 9 at least at an upper portion thereof. Shallow trench isolation structures 720 can be formed in an upper portion of the substrate semiconductor layer 9 to provide electrical isolation among the semiconductor devices. The semiconductor devices 710 can include, for example, field effect transistors including respective transistor active regions 742 (i.e., source regions and drain regions), channel regions 746, and gate structures 750. The field effect transistors may be arranged in a CMOS configuration. Each gate structure 750 can include, for example, a gate dielectric 752, a gate electrode 754, a dielectric gate spacer 756 and a gate cap dielectric 758. The semiconductor devices can include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 can include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring among the various nodes of the semiconductor devices and landing pads for through-memory-level contact via structures to be subsequently formed. The lower-level metal interconnect structures 780 are located within the dielectric layer stack of the lower-level dielectric material layers 760, and comprise a lower-level metal line structure located under and optionally contacting a bottom surface of the silicon nitride layer 766.

For example, the lower-level metal interconnect structures 780 can be located within the first dielectric material layers 764. The first dielectric material layers 764 may be a plurality of dielectric material layers in which various elements of the lower-level metal interconnect structures 780 are sequentially applied. Each of the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 can comprise, or consist essentially of, dielectric material layers having dielectric constants that do not exceed the dielectric constant of undoped silicate glass (silicon oxide) of 3.9. The lower-level metal interconnect structures 780 can include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 can be formed within a topmost dielectric material layer of the first dielectric material layers 764 (which can be a plurality of dielectric material layers). Each of the lower-level metal interconnect structures 780 can include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 can be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each of the at least one second dielectric material layer 768 may include any of doped silicate glass, undoped silicate glass, and organosilicate glass. In one embodiment, the at least one first second material layer 768 can comprise, or consist essentially of, dielectric material layers having dielectric constants that do not exceed the dielectric constant of undoped silicate glass (silicon oxide) of 3.9.

An optional layer of a metallic material and a layer of a semiconductor material can be deposited over, or within patterned recesses of, the at least one second dielectric material layer 768, and is lithographically patterned to provide an optional conductive plate layer 6 and in-process source-level material layers 10'. The optional conductive plate layer 6, if present, provides a high conductivity conduction path for electrical current that flows into, or out of, the in-process source-level material layers 10'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses can also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 can include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses can also be used.

The in-process source-level material layers 10' can include various layers that are subsequently modified to form source-level material layers. The source-level material layers, upon formation, include a source contact layer that functions as a common source region for vertical field effect transistors of a three-dimensional memory device. In one embodiment, the in-process source-level material layer 10' can include, from bottom to top, a buried source semiconductor layer 112, a source-level lower dielectric layer 113, a source-level sacrificial layer 104, at least one source-level upper dielectric layer (116, 117), and an optional source-select-level conductive layer 118. In one embodiment, the at least one source-level upper dielectric layer (116, 117) can include a layer stack of a first source-level upper dielectric layer 116 and a second source-level upper dielectric layer 117.

The buried source semiconductor layer 112 can include a doped semiconductor material such as doped polysilicon or doped amorphous silicon. The conductivity type of the buried source semiconductor layer 112 can be the opposite of the conductivity of vertical semiconductor channels to be subsequently formed. For example, if the vertical semiconductor channels to be subsequently formed have a doping of a first conductivity type, the buried source semiconductor layer 112 has a doping of a second conductivity type that is the opposite of the first conductivity type. The thickness of each of the buried source semiconductor layer 112 can be in a range from 10 nm to 300 nm, such as from 20 nm to 150 nm, although lesser and greater thicknesses can also be used.

The source-level sacrificial layer 104 includes a sacrificial material that can be removed selective to the source-level lower dielectric layer 113 and the first source-level upper dielectric layer 116. In one embodiment, the source-level sacrificial layer 104 can include a semiconductor material such as undoped amorphous silicon or a silicon-germanium alloy with an atomic concentration of germanium greater than 20%. The thickness of the source-level sacrificial layer 104 can be in a range from 30 nm to 400 nm, such as from 60 nm to 200 nm, although lesser and greater thicknesses can also be used.

The source-level lower dielectric layer 113 and the first source-level upper dielectric layer 116 include materials that can function as an etch stop material during removal of the source-level sacrificial layer 104. For example, the source-level lower dielectric layer 113 and the first source-level upper dielectric layer 116 can include silicon nitride, silicon oxide, and/or a dielectric metal oxide. In one embodiment, each of the source-level lower dielectric layer 113 and the first source-level upper dielectric layer 116 can include a respective silicon nitride layer having a thickness in a range from 3 nm to 60 nm, such as from 6 nm to 30 nm, although lesser and greater thicknesses can also be used.

The second source-level upper dielectric layer 117 includes a dielectric material such as silicon oxide. The thickness of the second source-level upper dielectric layer 117 can be in a range from 20 nm to 400 nm, such as from 40 nm to 200 nm, although lesser and greater thicknesses can also be used.

The optional source-select-level conductive layer 118 can include a conductive material that can be used as a source-select-level gate electrode. For example, the optional source-select-level conductive layer 118 can include a doped semiconductor material such as doped polysilicon or doped amorphous silicon that can be subsequently converted into doped polysilicon by an anneal process. The thickness of the optional source-level conductive layer 118 can be in a range from 30 nm to 200 nm, such as from 60 nm to 100 nm, although lesser and greater thicknesses can also be used.

The in-process source-level material layers 10' can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional conductive plate layer 6 and the in-process source-level material layers 10' may be patterned to provide openings in areas in which through-memory-level contact via structures and through-dielectric contact via structures are to be subsequently formed. Patterned portions of the stack of the conductive plate layer 6 and the in-process source-level material layers 10' are present in each memory array region 100 in which three-dimensional memory stack structures are to be subsequently formed. The at least one second dielectric material layer 768 can include a blanket layer portion underlying the conductive plate layer 6 and the in-process source-level material layers 10' and a patterned portion that fills gaps among the patterned portions of the conductive plate layer 6 and the in-process source-level material layers 10'.

The optional conductive plate layer 6 and the in-process source-level material layers 10' can be patterned. A staircase region 200 is provided, which is a region in contact via structures contacting word line electrically conductive layers are to be subsequently formed. In one embodiment, the staircase region 200 can be laterally spaced from the memory array region 100 along a first horizontal direction hd1. A horizontal direction that is perpendicular to the first horizontal direction hd1 is herein referred to as a second horizontal direction hd2. In one embodiment, additional openings in the optional conductive plate layer 6 and the in-process source-level material layers 10' can be formed within the area of a memory array region 100, in which a three-dimensional memory array including memory stack structures is to be subsequently formed. A peripheral device region 400 can be provided adjacent to the staircase region 200.

The region of the semiconductor devices 710 and the combination of the lower-level dielectric layers 760 and the lower-level metal interconnect structures 780 is herein referred to as an underlying peripheral device region 700, which is located underneath a memory-level assembly to be subsequently formed and includes peripheral devices for the memory-level assembly. The lower-level metal interconnect structures 780 are positioned within the lower-level dielectric layers 760.

The lower-level metal interconnect structures 780 can be electrically connected to active nodes (e.g., transistor active regions 742 or gate electrodes 754) of the semiconductor devices (e.g., CMOS devices), and are located at the level of the lower-level dielectric layers 760. Through-memory-level contact via structures can be subsequently formed directly on the lower-level metal interconnect structures 780 to provide electrical connection to memory devices to be subsequently formed. In one embodiment, the pattern of the lower-level metal interconnect structures 780 can be selected such that the landing-pad-level metal line structures 788 (which are a subset of the lower-level metal interconnect structures 780 located at the topmost portion of the lower-level metal interconnect structures 780) can provide landing pad structures for the through-memory-level contact via structures to be subsequently formed.

Figure 2:
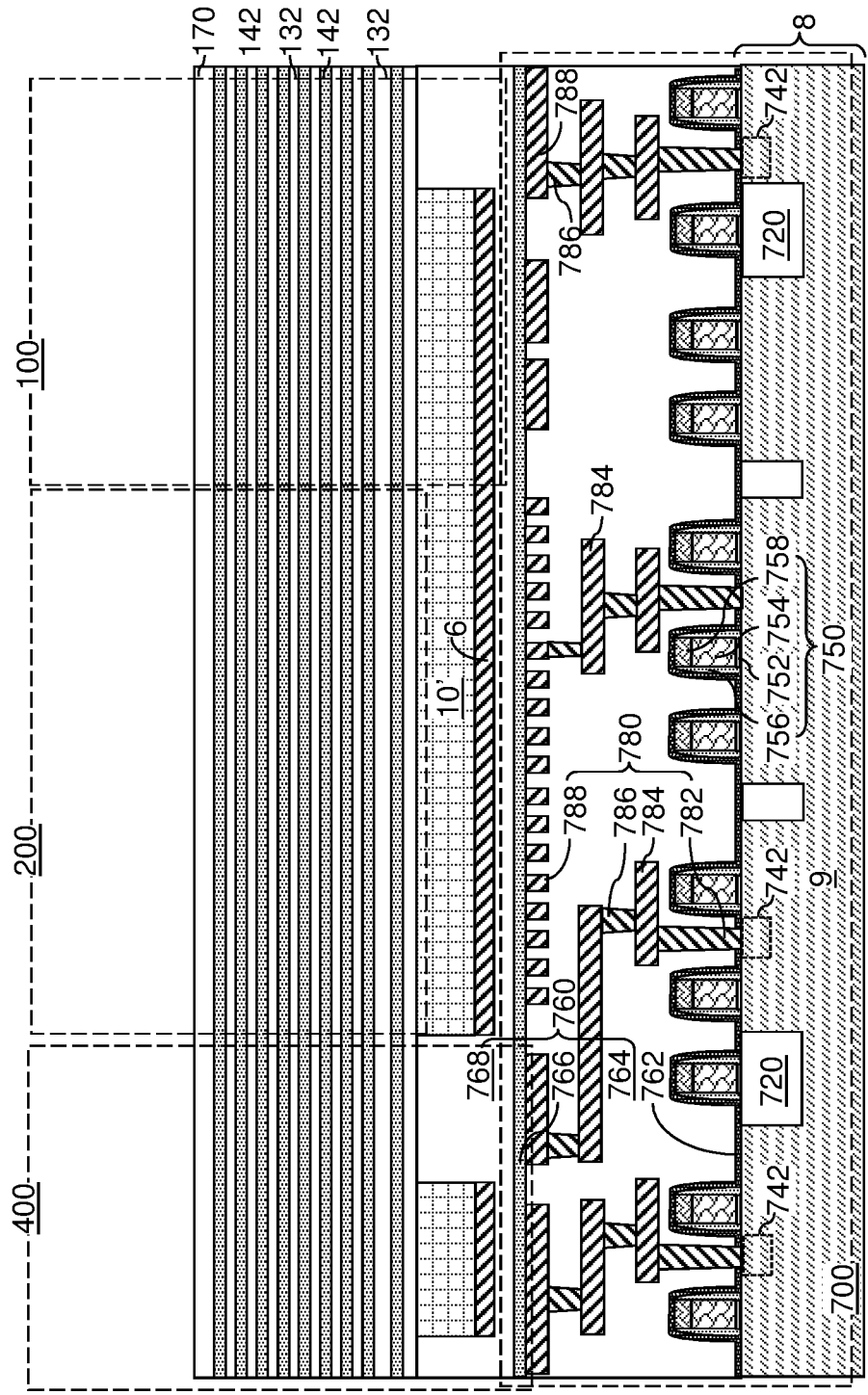
FIG. 2 is a vertical cross-sectional view of the exemplary structure after formation of a first-tier alternating stack of first insulating layers and first spacer material layers according to an embodiment of the present disclosure.

Referring to FIG. 2, an alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack can include first insulating layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the planar semiconductor material layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is used for the first insulating layers 132, tetraethylorthosilicate (TEOS) can be used as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be used for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be used. In one embodiment, each first sacrificial material layer 142 in the first-tier alternating stack (132, 142) can have a uniform thickness that is substantially invariant within each respective first sacrificial material layer 142.

A first insulating cap layer 170 is subsequently formed over the stack (132, 142). The first insulating cap layer 170 includes a dielectric material, which can be any dielectric material that can be used for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be used.

Figure 3:
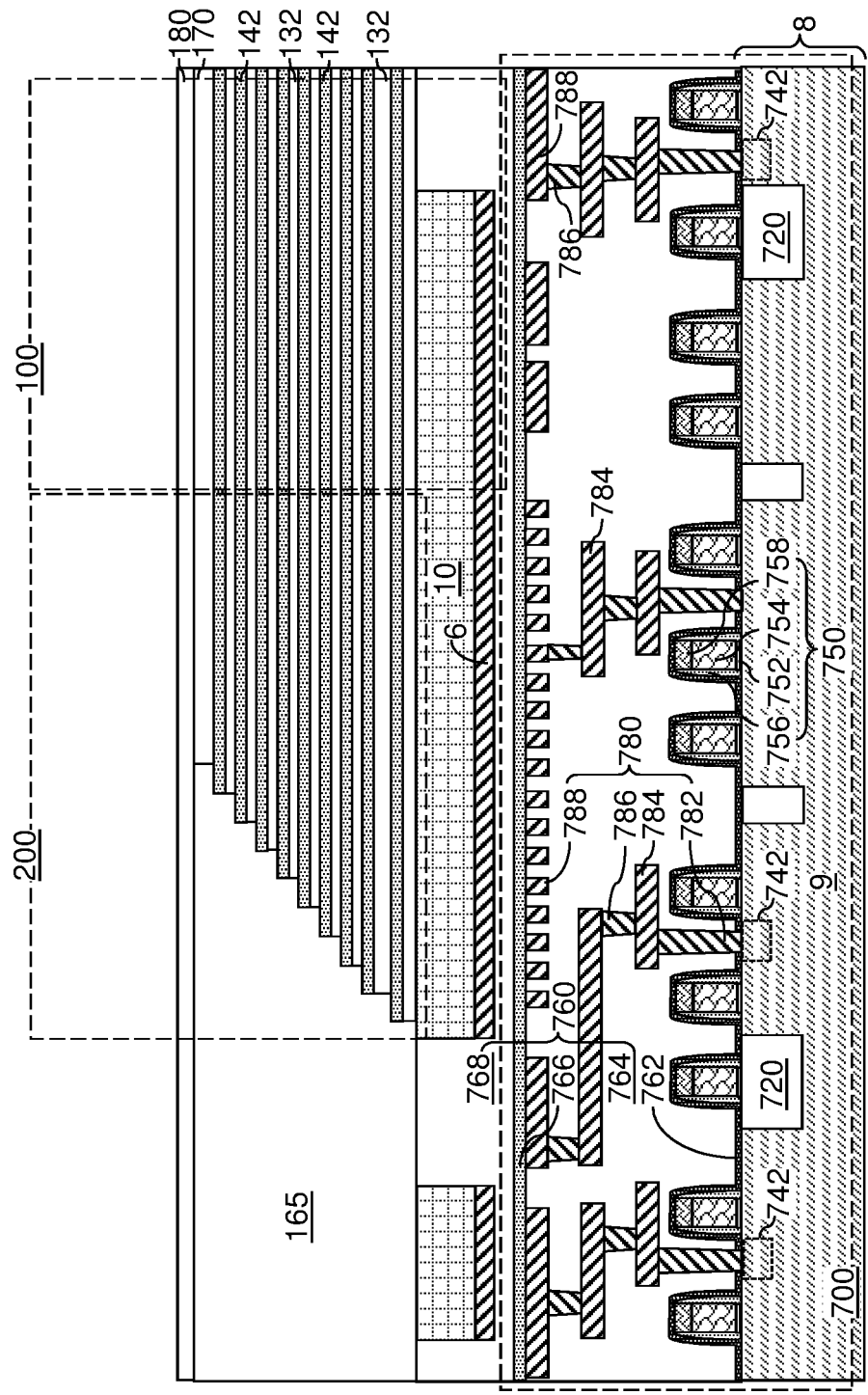
FIG. 3 is a vertical cross-sectional view of the exemplary structure after patterning a first-tier staircase region, a first retro-stepped dielectric material portion, and an inter-tier dielectric layer according to an embodiment of the present disclosure.

Referring to FIG. 3, the first insulating cap layer 170 and the first-tier alternating stack (132, 142) can be patterned to form first stepped surfaces in the staircase region 200. The staircase region 200 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 can be physically exposed at the first stepped surfaces. The cavity overlying the first stepped surfaces is herein referred to as a first stepped cavity.

A dielectric fill material (such as undoped silicate glass or doped silicate glass) can be deposited to fill the first stepped cavity. Excess portions of the dielectric fill material can be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 can include a doped silicate glass having a greater etch rate than the material of the first insulating layers 132 (which can include an undoped silicate glass). For example, the inter-tier dielectric layer 180 can include phosphosilicate glass. The thickness of the inter-tier dielectric layer 180 can be in a range from 30 nm to 300 nm, although lesser and greater thicknesses can also be used.

Figure 4A:
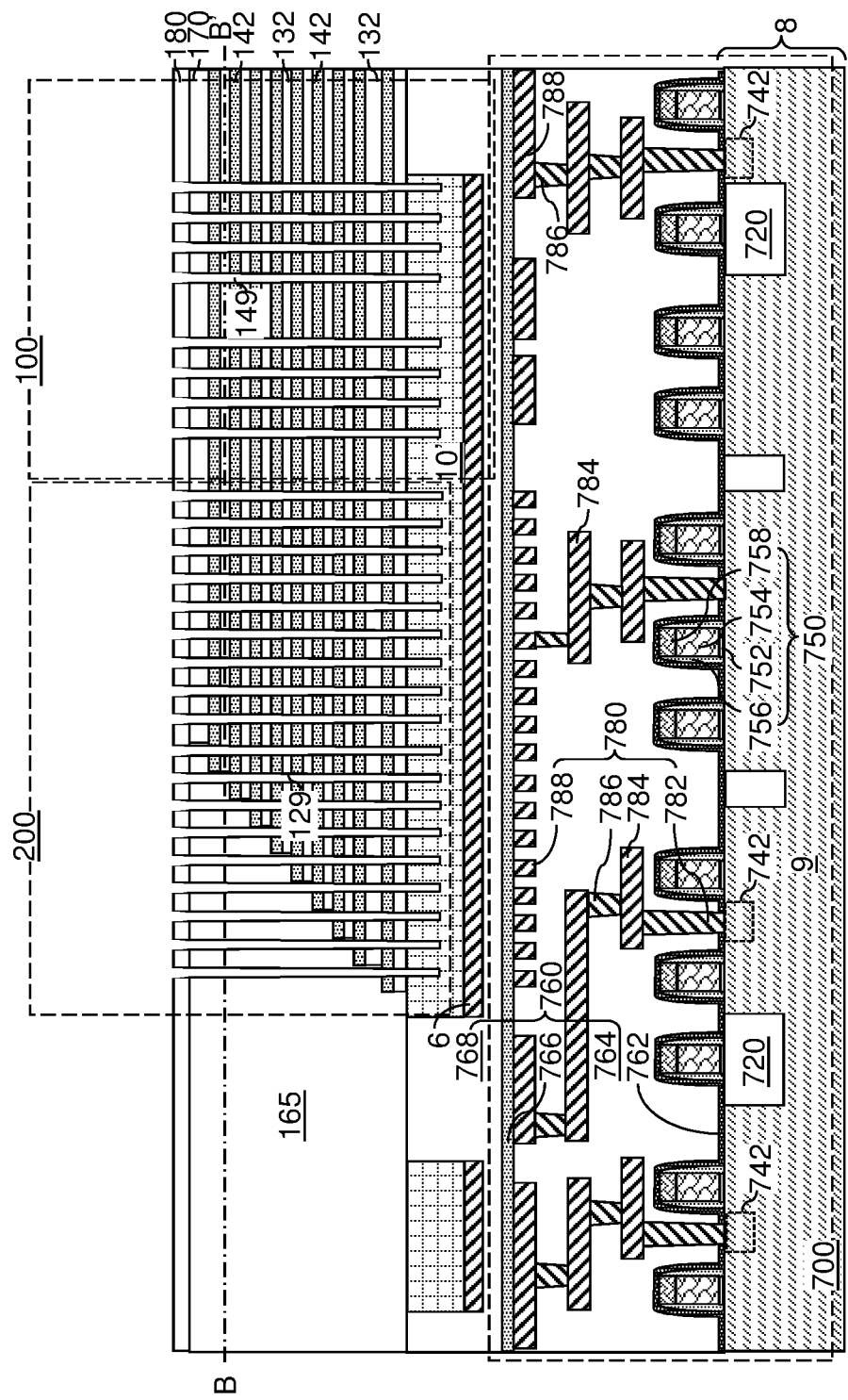
FIG. 4A is a vertical cross-sectional view of the exemplary structure after formation of first-tier memory openings and first-tier support openings according to an embodiment of the present disclosure.
Figure 4B:
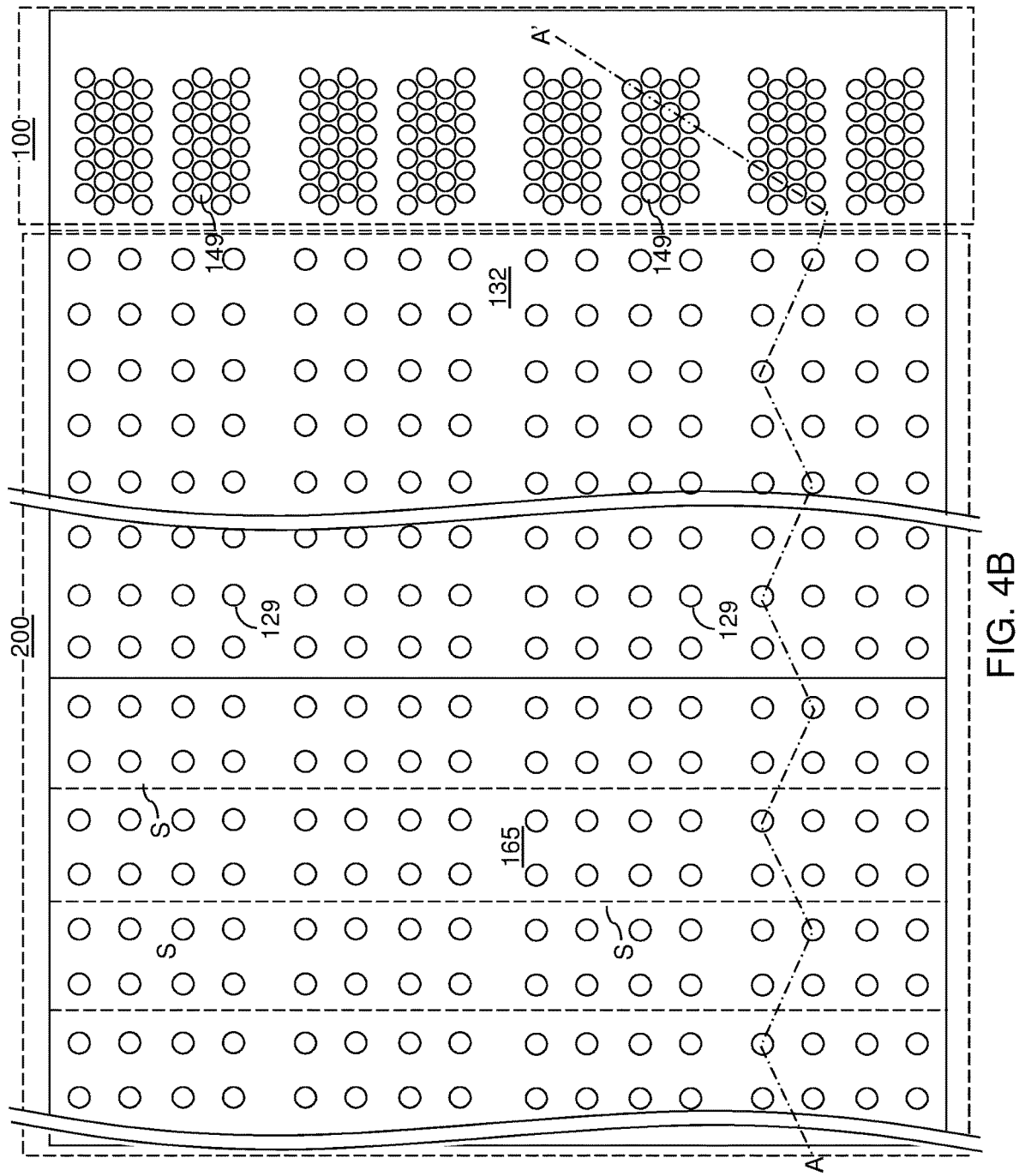
FIG. 4B is a top-down view of the exemplary structure of FIG. 4A. The hinged vertical plane A-A' corresponds to the plane of the vertical cross-sectional view of FIG. 4A.

Referring to FIGS. 4A and 4B, various first-tier openings (149, 129) can be formed through the inter-tier dielectric layer 180 and the first-tier structure (132, 142, 170, 165) and into the in-process source-level material layers 10'. A photoresist layer (not shown) can be applied over the inter-tier dielectric layer 180, and can be lithographically patterned to form various openings therethrough. The pattern of openings in the photoresist layer can be transferred through the inter-tier dielectric layer 180 and the first-tier structure (132, 142, 170, 165) and into the in-process source-level material layers 10' by a first anisotropic etch process to form the various first-tier openings (149, 129) concurrently, i.e., during the first anisotropic etch process. The various first-tier openings (149, 129) can include first-tier memory openings 149 and first-tier support openings 129. Locations of steps S in the first alternating stack (132, 142) are illustrated as dotted lines in FIG. 4B.

The first-tier memory openings 149 are openings that are formed in the memory array region 100 through each layer within the first alternating stack (132, 142) and are subsequently used to form memory stack structures therein. The first-tier memory openings 149 can be formed in clusters of first-tier memory openings 149 that are laterally spaced apart along the second horizontal direction hd2. Each cluster of first-tier memory openings 149 can be formed as a two-dimensional array of first-tier memory openings 149.

The first-tier support openings 129 are openings that are formed in the staircase region 200 and are subsequently used to form staircase-region contact via structures that interconnect a respective pair of an underlying lower-level metal interconnect structure 780 (such as a landing-pad-level metal line structure 788) and an electrically conductive layer (which can be formed as one of the spacer material layers or can be formed by replacement of a sacrificial material layer within the electrically conductive layer). A subset of the first-tier support openings 129 that is formed through the first retro-stepped dielectric material portion 165 can be formed through a respective horizontal surface of the first stepped surfaces. Further, each of the first-tier support openings 129 can be formed directly above (i.e., above, and with an areal overlap with) a respective one of the lower-level metal interconnect structure 780.

In one embodiment, the first anisotropic etch process can include an initial step in which the materials of the first-tier alternating stack (132, 142) are etched concurrently with the material of the first retro-stepped dielectric material portion 165. The chemistry of the initial etch step can alternate to optimize etching of the first and second materials in the first-tier alternating stack (132, 142) while providing a comparable average etch rate to the material of the first retro-stepped dielectric material portion 165. The first anisotropic etch process can use, for example, a series of reactive ion etch processes or a single reaction etch process (e.g., $CF_4/O_2/Ar$ etch). The sidewalls of the various first-tier openings (149, 129) can be substantially vertical, or can be tapered.

After etching through the alternating stack (132, 142) and the first retro-stepped dielectric material portion 165, the chemistry of a terminal portion of the first anisotropic etch process can be selected to etch through the dielectric material(s) of the at least one second dielectric layer 768 with a higher etch rate than an average etch rate for the in-process source-level material layers 10'. For example, the terminal portion of the anisotropic etch process may include a step that etches the dielectric material(s) of the at least one second dielectric layer 768 selective to a semiconductor material within a component layer in the in-process source-level material layers 10'. In one embodiment, the terminal portion of the first anisotropic etch process can etch through the source-select-level conductive layer 118, the at least one source-level upper dielectric layer (116, 117), the source-level sacrificial layer 104, and the source-level lower dielectric layer 113, and at least partly into the lower source-level semiconductor layer 112. The terminal portion of the first anisotropic etch process can include at least one etch chemistry for etching the various semiconductor materials of the in-process source-level material layers 10'. The photoresist layer can be subsequently removed, for example, by ashing.

Optionally, the portions of the first-tier memory openings 149 and the first-tier support openings 129 at the level of the inter-tier dielectric layer 180 can be laterally expanded by an isotropic etch. In this case, the inter-tier dielectric layer 180 can comprise a dielectric material (such as borosilicate glass) having a greater etch rate than the first insulating layers 132 (that can include undoped silicate glass) in dilute hydrofluoric acid. An isotropic etch (such as a wet etch using HF) can be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 5:
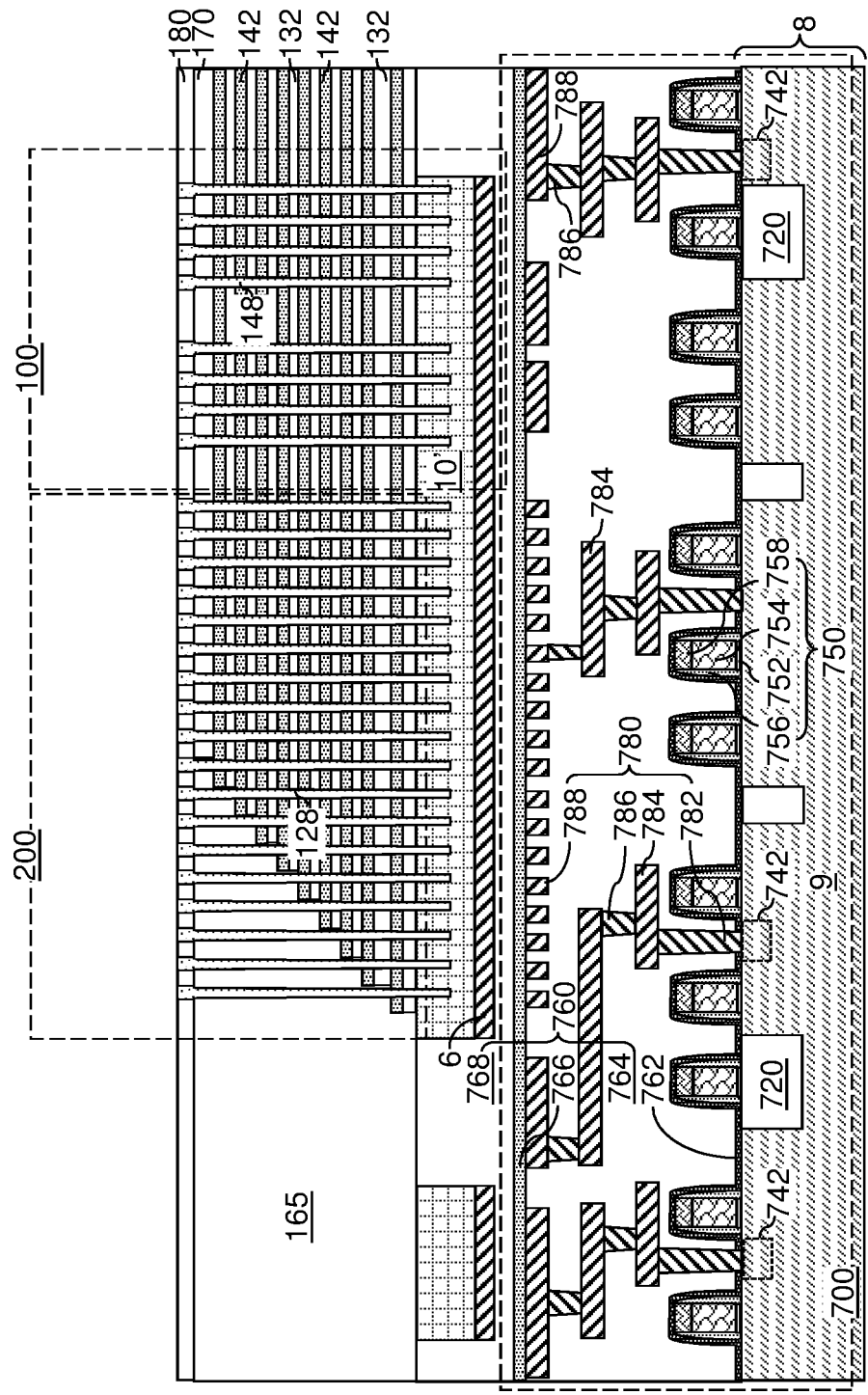
FIG. 5 is a vertical cross-sectional view of the exemplary structure after formation of various sacrificial fill structures according to an embodiment of the present disclosure.

Referring to FIG. 5, sacrificial first-tier opening fill portions (148, 128) can be formed in the various first-tier openings (149, 129). For example, a sacrificial first-tier fill material is deposited concurrently deposited in each of the first-tier openings (149, 129). The sacrificial first-tier fill material includes a material that can be subsequently removed selective to the materials of the first insulating layers 132 and the first sacrificial material layers 142.

In one embodiment, the sacrificial first-tier fill material can include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material can include a silicon oxide material having a higher etch rate than the materials of the first insulating layers 132, the first insulating cap layer 170, and the inter-tier insulating layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material can include amorphous silicon or a carbon-containing material (such as amorphous carbon or diamond-like carbon) that can be subsequently removed by ashing, or a silicon-based polymer that can be subsequently removed selective to the materials of the first alternating stack (132, 142).

Portions of the deposited sacrificial material can be removed from above the topmost layer of the first-tier alternating stack (132, 142), such as from above the inter-tier dielectric layer 180. For example, the sacrificial first-tier fill material can be recessed to a top surface of the inter-tier dielectric layer 180 using a planarization process. The planarization process can include a recess etch, chemical mechanical planarization (CMP), or a combination thereof. The top surface of the inter-tier dielectric layer 180 can be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) can be coplanar with the top surface of the inter-tier dielectric layer 180. Each of the sacrificial first-tier opening fill portions (148, 128) may, or may not, include cavities therein.

Figure 6:
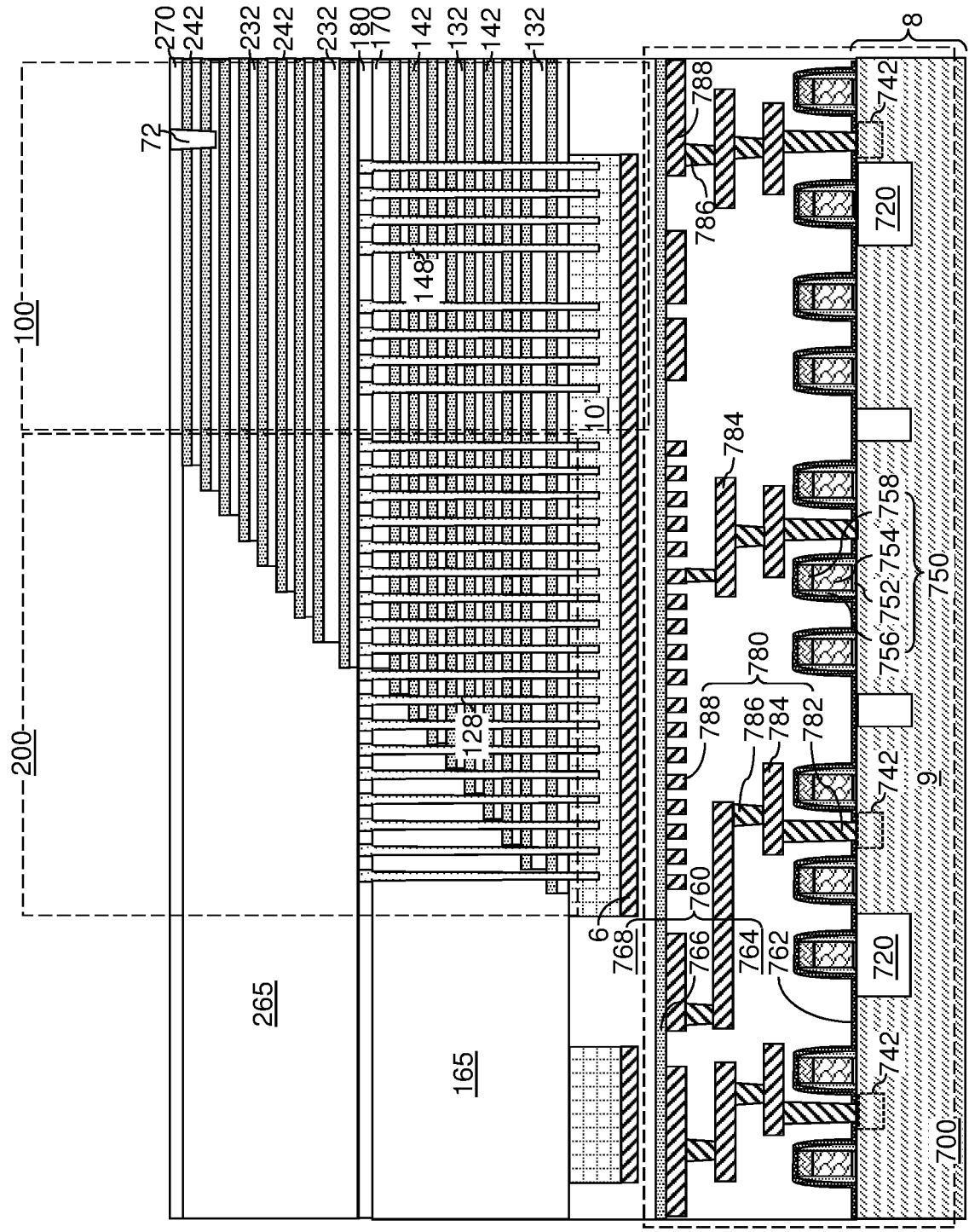
FIG. 6 is a vertical cross-sectional view of the exemplary structure after formation of a second-tier alternating stack of second insulating layers and second spacer material layers, second stepped surfaces, and a second retro-stepped dielectric material portion according to an embodiment of the present disclosure.

Referring to FIG. 6, a second-tier structure can be formed over the first-tier structure (132, 142, 170, 148). The second-tier structure can include an additional alternating stack of insulating layers and spacer material layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be used for the second insulating layers 232 can be any material that can be used for the first insulating layers 132. The fourth material of the second sacrificial material layers 242 is a sacrificial material that can be removed selective to the third material of the second insulating layers 232. Sacrificial materials that can be used for the second sacrificial material layers 242 can be any material that can be used for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be used for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be used. In one embodiment, each second sacrificial material layer 242 in the second stack (232, 242) can have a uniform thickness that is substantially invariant within each respective second sacrificial material layer 242.

Second stepped surfaces in the second stepped area can be formed in the staircase region 200 using a same set of processing steps as the processing steps used to form the first stepped surfaces in the first stepped area with suitable adjustment to the pattern of at least one masking layer. A second retro-stepped dielectric material portion 265 can be formed over the second stepped surfaces in the staircase region 200.

A second insulating cap layer 270 can be subsequently formed over the second alternating stack (232, 242). The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Generally speaking, at least one alternating stack of insulating layers (132, 232) and spacer material layers (such as sacrificial material layers (142, 242)) can be formed over the in-process source-level material layers 10', and at least one retro-stepped dielectric material portion (165, 265) can be formed over the staircase regions on the at least one alternating stack (132, 142, 232, 242).

Optionally, drain-select-level isolation structures 72 can be formed through a subset of layers in an upper portion of the second-tier alternating stack (232, 242). The second sacrificial material layers 242 that are cut by the select-drain-level shallow trench isolation structures 72 correspond to the levels in which drain-select-level electrically conductive layers are subsequently formed. The drain-select-level isolation structures 72 include a dielectric material such as silicon oxide. The drain-select-level isolation structures 72 can laterally extend along a first horizontal direction hd1, and can be laterally spaced apart along a second horizontal direction hd2 that is perpendicular to the first horizontal direction hd1. The combination of the second alternating stack (232, 242), the second retro-stepped dielectric material portion 265, the second insulating cap layer 270, and the optional drain-select-level isolation structures 72 collectively constitute a second-tier structure (232, 242, 265, 270, 72).

Figure 7A:
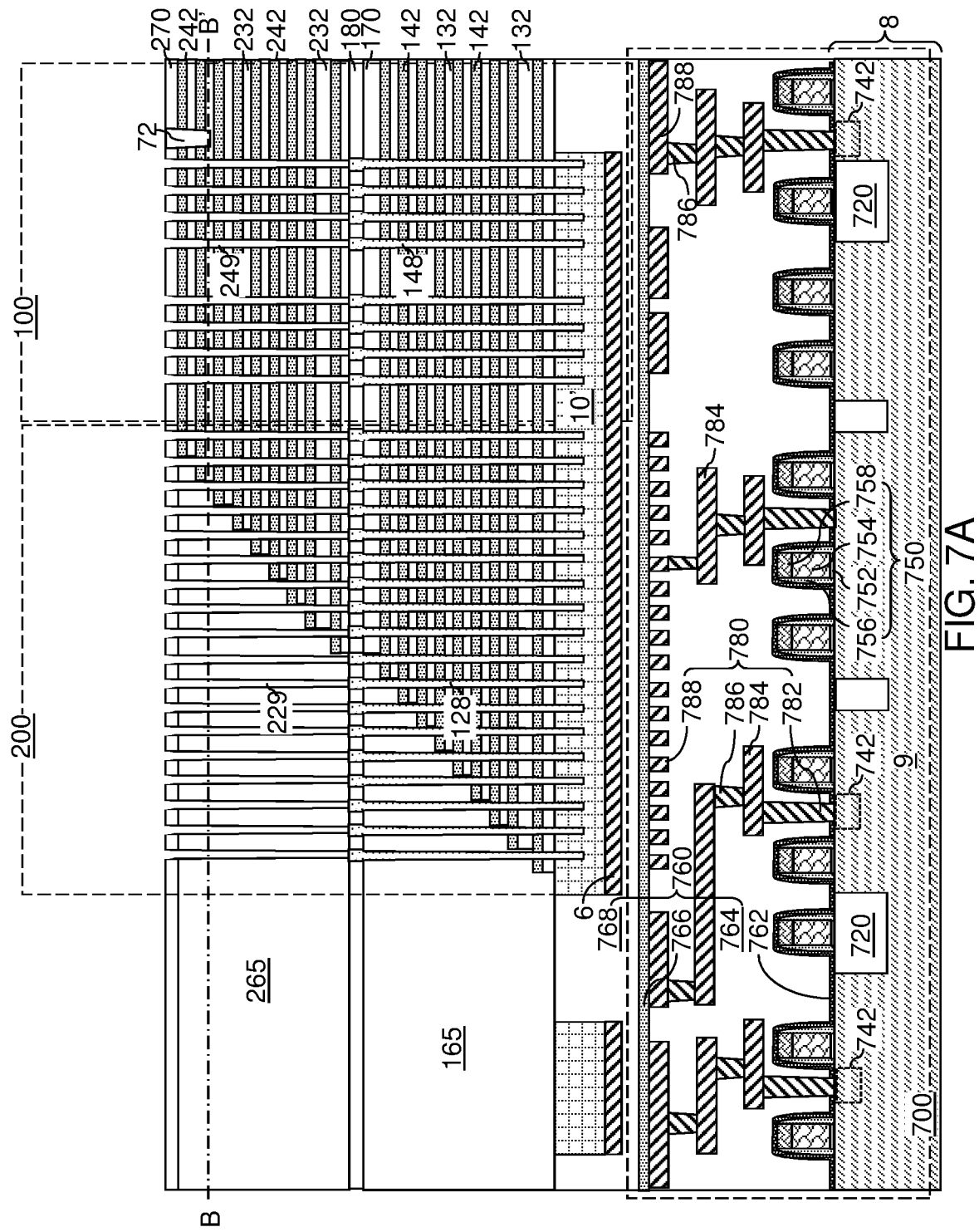
FIG. 7A is a vertical cross-sectional view of the exemplary structure after formation of second-tier memory openings and second-tier support openings according to an embodiment of the present disclosure.
Figure 7B:
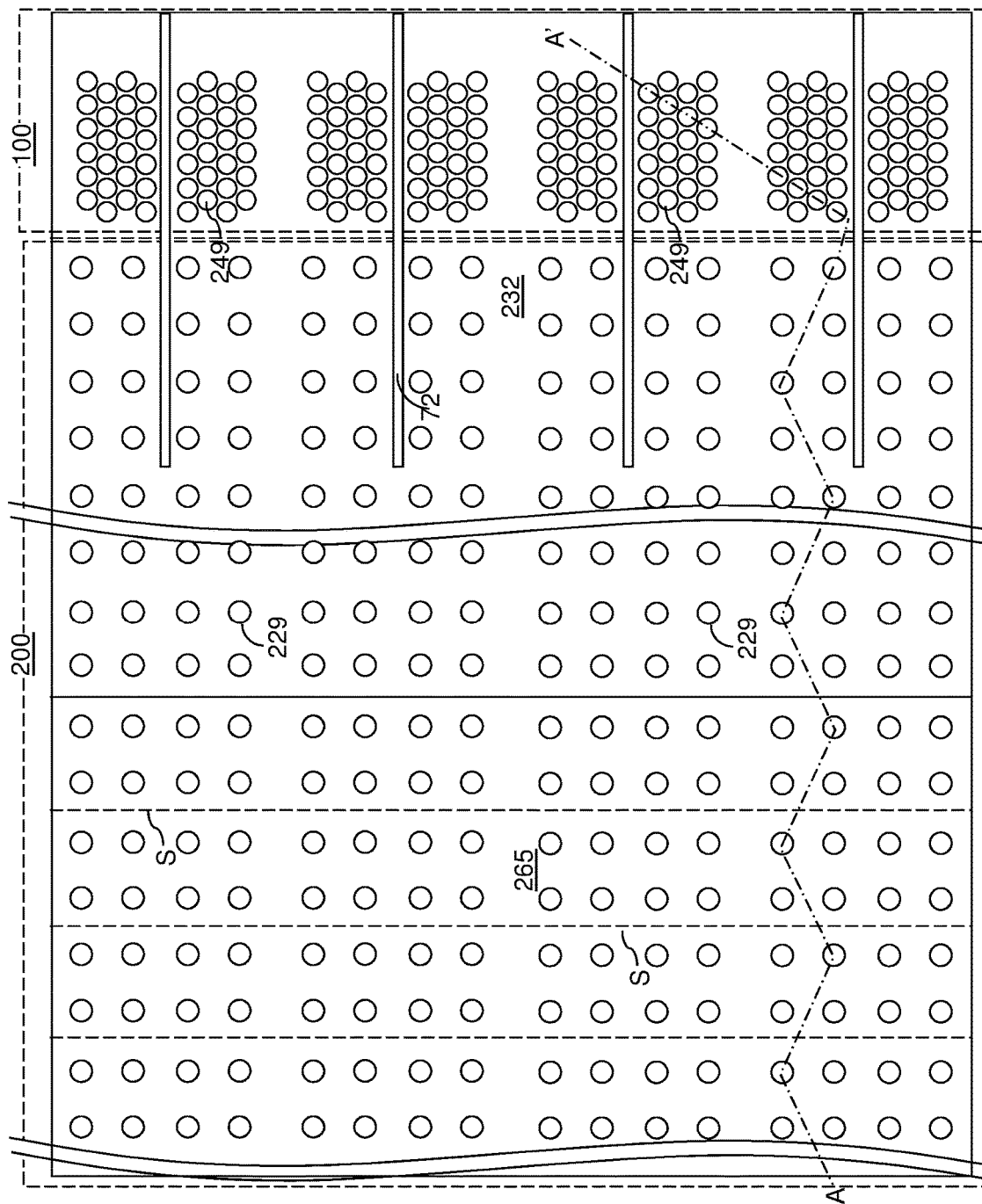
FIG. 7B is a horizontal cross-sectional of the exemplary structure along the horizontal plane B-B' of FIG. 7A. The hinged vertical plane A-A' corresponds to the plane of the vertical cross-sectional view of FIG. 7A.

Referring to FIGS. 7A and 7B, various second-tier openings (249, 229) can be formed through the second-tier structure (232, 242, 265, 270, 72). A photoresist layer (not shown) can be applied over the second insulating cap layer 270, and can be lithographically patterned to form various openings therethrough. The pattern of the openings can be the same as the pattern of the various first-tier openings (149, 129), which is the same as the sacrificial first-tier opening fill portions (148, 128). Thus, the lithographic mask used to pattern the first-tier openings (149, 129) can be used to pattern the photoresist layer.

The pattern of openings in the photoresist layer can be transferred through the second-tier structure (232, 242, 265, 270, 72) by a second anisotropic etch process to form various second-tier openings (249, 229) concurrently, i.e., during the second anisotropic etch process. The various second-tier openings (249, 229) can include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each of the second-tier support openings 229 can be formed through a horizontal surface within the second stepped surfaces, which include the interfacial surfaces between the second alternating stack (232, 242) and the second retro-stepped dielectric material portion 265. Locations of steps S in the first-tier alternating stack (132, 142) and the second-tier alternating stack (232, 242) are illustrated as dotted lines in FIG. 7B.

The second anisotropic etch process can include an etch step in which the materials of the second-tier alternating stack (232, 242) are etched concurrently with the material of the second retro-stepped dielectric material portion 265. The chemistry of the etch step can alternate to optimize etching of the materials in the second-tier alternating stack (232, 242) while providing a comparable average etch rate to the material of the second retro-stepped dielectric material portion 265. The second anisotropic etch process can use, for example, a series of reactive ion etch processes or a single reaction etch process (e.g., $CF_4/O_2$/Ar etch). The sidewalls of the various second-tier openings (249, 229) can be substantially vertical, or can be tapered. A bottom periphery of each second-tier opening (249, 229) may be laterally offset, and/or may be located entirely within, a periphery of a top surface of an underlying sacrificial first-tier opening fill portion (148, 128). The photoresist layer can be subsequently removed, for example, by ashing.

Figure 8:
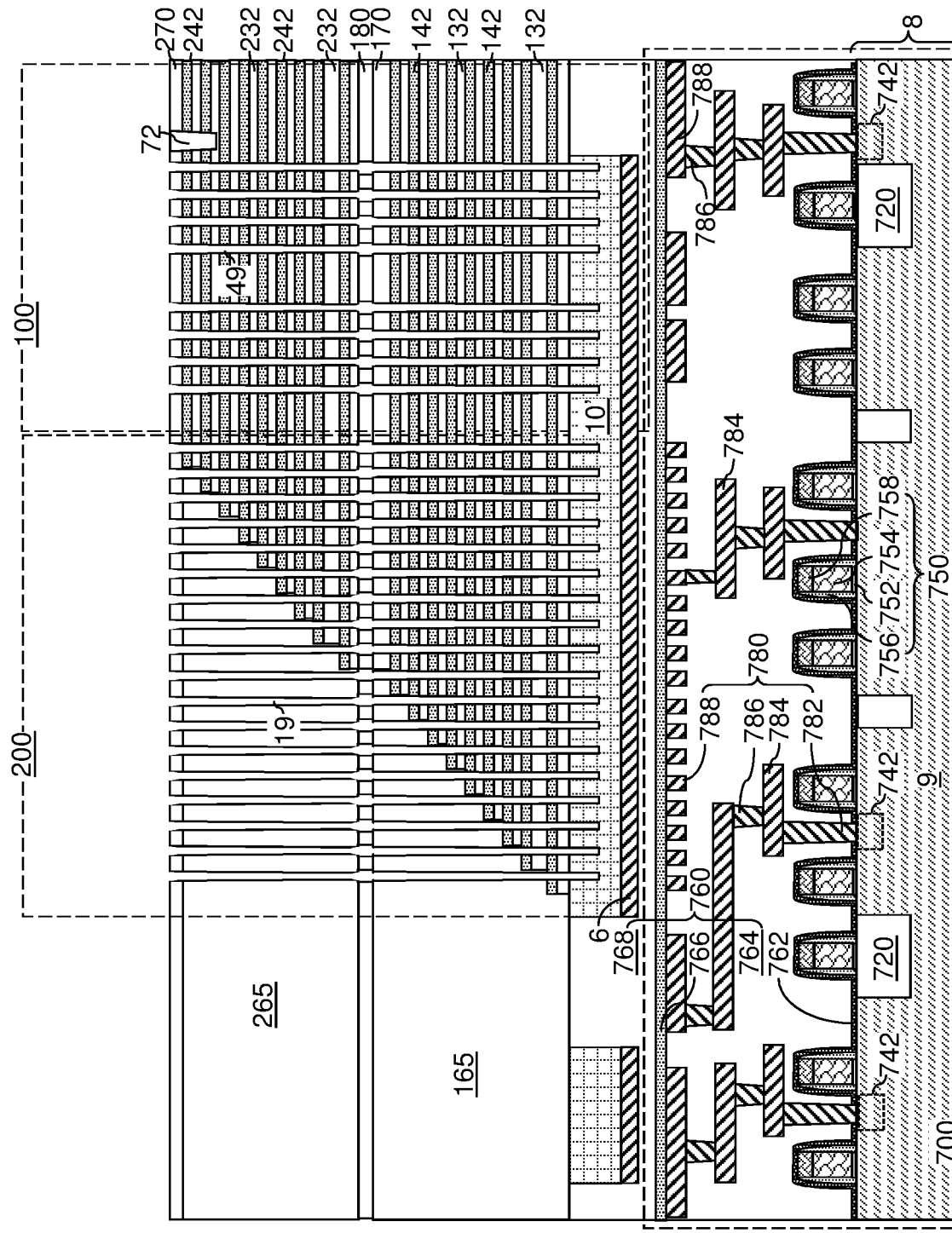
FIG. 8 is a vertical cross-sectional view of the exemplary structure after formation of inter-tier memory openings and inter-tier support openings according to an embodiment of the present disclosure.

Referring to FIG. 8, the sacrificial first-tier fill material of the sacrificial first-tier opening fill portions (148, 128) can be removed using an etch process that etches the sacrificial first-tier fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 9A-9D provide sequential cross-sectional views of a memory opening 49 during formation of a memory opening fill structure. The same structural change occurs in each of the memory openings 49 and the support openings 19.

Referring to FIG. 9A, a memory opening 49 in the first exemplary device structure of FIG. 8 is illustrated. The memory opening 49 extends through the first-tier structure and the second-tier structure.

Referring to FIG. 9B, a stack of layers including a blocking dielectric layer 52L, a continuous charge storage layer 54L, a tunneling dielectric layer 56L, and a continuous cap semiconductor material layer 162L can be sequentially deposited in the memory openings 49. The blocking dielectric layer 52L can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52L can include a dielectric metal oxide having a dielectric constant greater than 7.9, i.e., having a dielectric constant greater than the dielectric constant of silicon nitride. The thickness of the dielectric metal oxide layer can be in a range from 1 nm to 20 nm, although lesser and greater thicknesses can also be used. The dielectric metal oxide layer can subsequently function as a dielectric material portion that blocks leakage of stored electrical charges to control gate electrodes. In one embodiment, the blocking dielectric layer 52L includes aluminum oxide. Alternatively or additionally, the blocking dielectric layer 52L can include a dielectric semiconductor compound such as silicon oxide, silicon oxynitride, silicon nitride, or a combination thereof.

Subsequently, the continuous charge storage layer 54L can be formed. In one embodiment, the continuous charge storage layer 54L can be a continuous layer or patterned discrete portions of a charge trapping material including a dielectric charge trapping material, which can be, for example, silicon nitride. Alternatively, the continuous charge storage layer 54L can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the continuous charge storage layer 54L includes a silicon nitride layer. In one embodiment, the sacrificial material layers (142, 242) and the insulating layers (132, 232) can have vertically coincident sidewalls, and the continuous charge storage layer 54L can be formed as a single continuous layer. Alternatively, the sacrificial material layers (142, 242) can be laterally recessed with respect to the sidewalls of the insulating layers (132, 232), and a combination of a deposition process and an anisotropic etch process can be used to form the continuous charge storage layer 54L as a plurality of memory material portions that are vertically spaced apart. The thickness of the continuous charge storage layer 54L can be in a range from 2 nm to 20 nm, although lesser and greater thicknesses can also be used.

The tunneling dielectric layer 56L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56L can include a stack of a first silicon oxide layer, a silicon oxynitride layer, and a second silicon oxide layer, which is commonly known as an ONO stack. In one embodiment, the tunneling dielectric layer 56L can include a silicon oxide layer that is substantially free of carbon or a silicon oxynitride layer that is substantially free of carbon. The thickness of the tunneling dielectric layer 56L can be in a range from 2 nm to 20 nm, although lesser and greater thicknesses can also be used. The stack of the blocking dielectric layer 52L, the continuous charge storage layer 54L, and the tunneling dielectric layer 56L constitutes a continuous memory film 50L.

The continuous cap semiconductor material layer 162L includes a sacrificial semiconductor material such as amorphous silicon or polysilicon. The continuous cap semiconductor material layer 162L may be doped with electrical dopants, or may be substantially intrinsic. The thickness of the continuous cap semiconductor material layer 162L can be in a range from 2 nm to 20 nm, such as from 5 nm to 10 nm, although lesser and greater thicknesses can also be used. A cavity 49' is formed in the volume of each memory opening 49 that is not filled with the deposited material layers (52L, 54L, 56L, 162L).

Referring to FIG. 9C, a continuous cap silicon oxide layer 164L can be conformally deposited on the continuous cap semiconductor material layer 162L. The continuous cap silicon oxide layer 164L can be deposited by a conformal deposition process such as low pressure chemical vapor deposition (LPCVD). The thickness of the continuous cap silicon oxide layer 164L can be in a range from 2 nm to 20 nm, such as from 5 nm to 10 nm, although lesser and greater thicknesses can also be used.

A sacrificial semiconductor material layer 166L is formed in remaining volumes of the cavities 49' over the continuous cap silicon oxide layer 164L. The sacrificial semiconductor material layer 166L includes another sacrificial semiconductor material such as amorphous silicon or polysilicon. The material of the sacrificial semiconductor material layer 166L may be the same as, or different from, the material of the cap semiconductor material layer 162. For example, the sacrificial semiconductor material layer 166L can include undoped amorphous silicon.

Figure 10A:
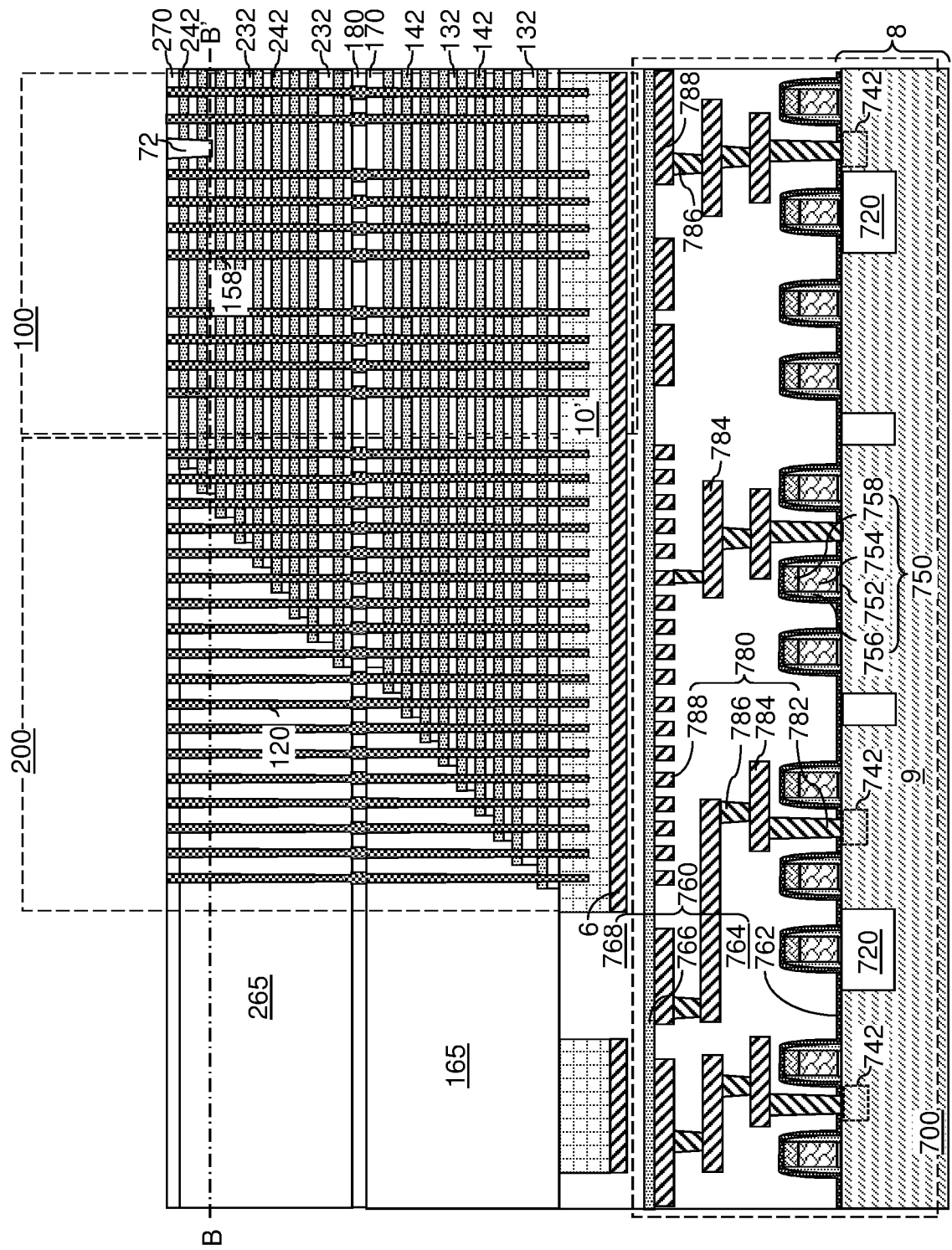
FIG. 10A is a vertical cross-sectional view of the exemplary structure after formation of in-process memory opening fill structures according to an embodiment of the present disclosure.
Figure 10B:
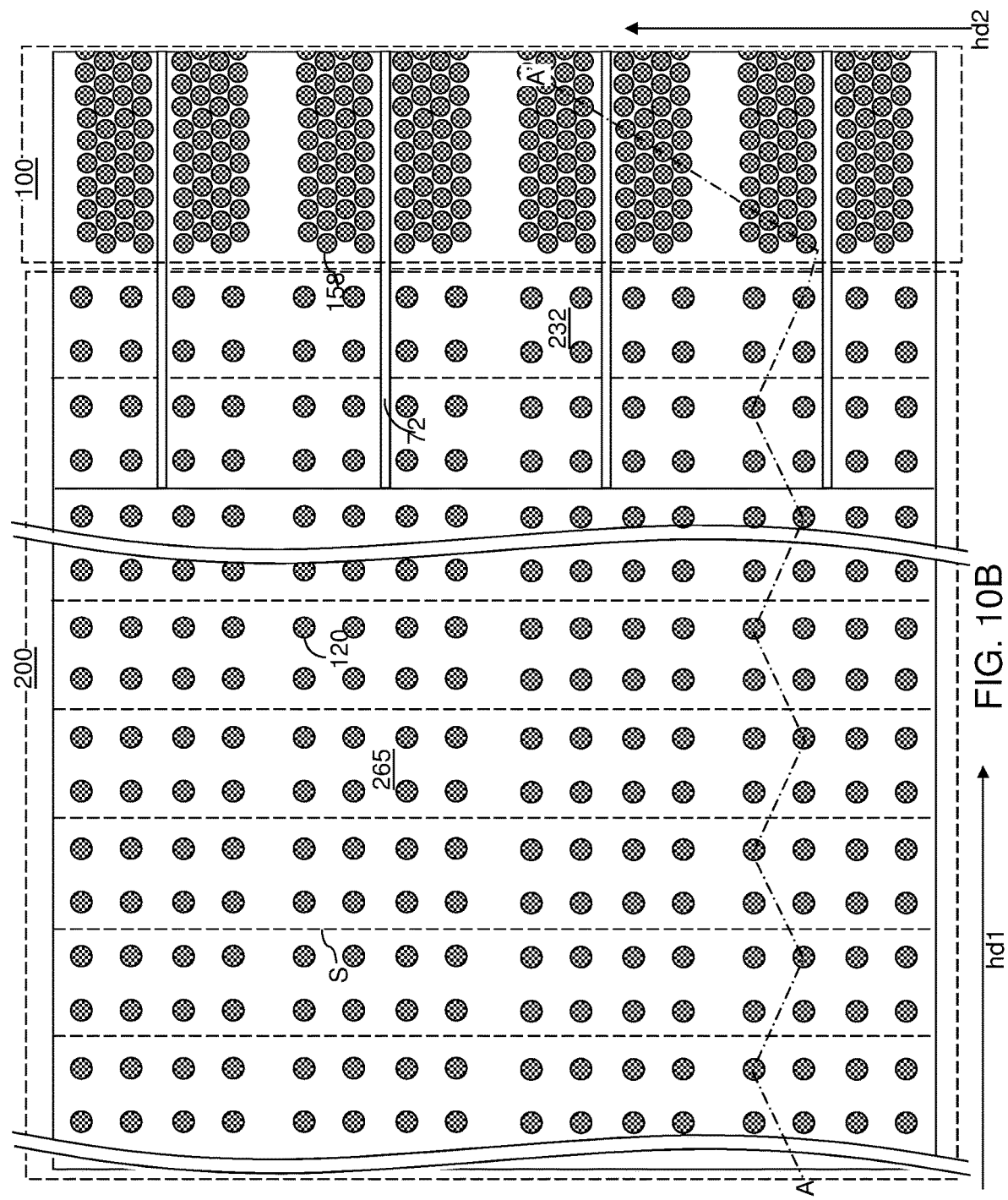
FIG. 10B is a horizontal cross-sectional view of the exemplary structure along the horizontal plane B-B' of FIG. 10A. The hinged vertical plane A-A' corresponds to the plane of the vertical cross-sectional view of FIG. 10A.

Referring to FIGS. 9D, 10A and 10B, portions of the sacrificial semiconductor material layer 166L, the continuous cap silicon oxide layer 164L, the continuous cap semiconductor material layer 162L, the tunneling dielectric layer 56L, the continuous charge storage layer 54L, and the blocking dielectric layer 52L located above the horizontal plane including the top surface of the second insulating cap layer 270 can be removed by a planarization process. The planarization process can use chemical mechanical planarization and/or at least one recess etch. Each of the sacrificial semiconductor material layer 166L, the continuous cap silicon oxide layer 164L, the continuous cap semiconductor material layer 162L, the tunneling dielectric layer 56L, the continuous charge storage layer 54L, and the blocking dielectric layer 52L is divided into discrete material portions located within the respective one of the memory openings 49 or located within a respective one of the support openings 19.

Each discrete remaining portion of the sacrificial semiconductor material layer 166L is herein referred to as a sacrificial semiconductor material portion 166. Each discrete remaining portion of the continuous cap silicon oxide layer 164L is herein referred to as a cap silicon oxide layer 164. Each discrete remaining portion of the continuous cap semiconductor material layer 162L is herein referred to as a cap semiconductor material layer 162. Each discrete remaining portion of the tunneling dielectric layer 56L is herein referred to as a tunneling dielectric 56. Each discrete remaining portion of the continuous charge storage layer 54L is herein referred to as a charge storage layer 54. Each discrete remaining portion of the blocking dielectric layer 52L is herein referred to as a blocking dielectric 52. Each contiguous set of a blocking dielectric 52, a charge storage layer 54, and a tunneling dielectric constitutes a memory film 50.

Each contiguous combination of a sacrificial semiconductor material portion 166, a cap silicon oxide layer 164, and a cap semiconductor material layer 162 constitutes a sacrificial opening fill structure (162, 164, 166). Each combination of a memory film 50 and a sacrificial opening fill structure (162, 164, 166) located within a respective memory opening 49 is herein referred to as an in-process memory opening fill structure 158. Each combination of a memory film 50 and a sacrificial opening fill structure (162, 164, 166) located within a respective support opening 19 is herein referred to as an in-process support opening fill structure 120. Each in-process support opening fill structure 120 can have a same set of components as an in-process memory opening fill structure 158.

Figure 11A:
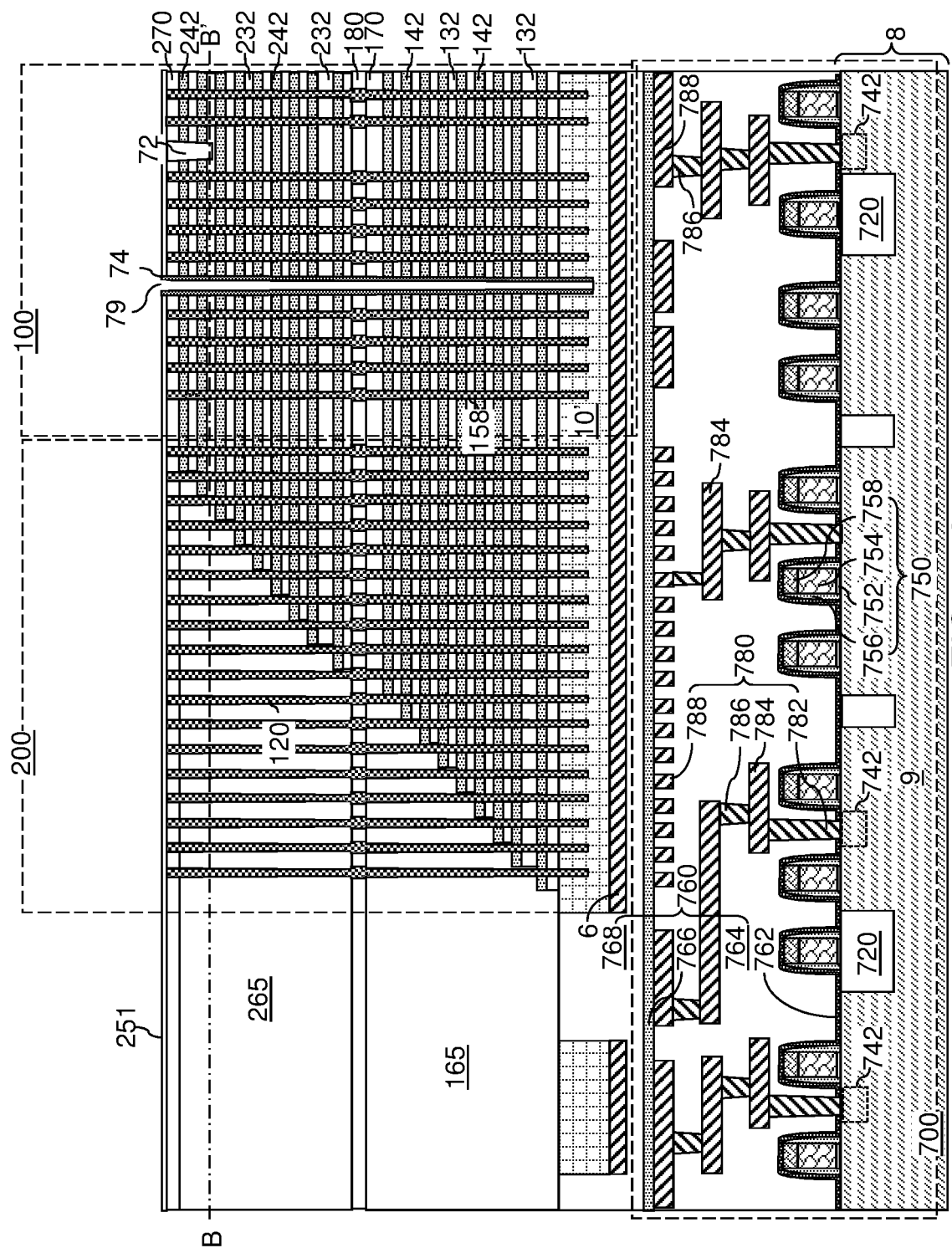
FIG. 11A is a vertical cross-sectional view of the exemplary structure after formation of a sacrificial insulating cap material layer and backside trenches according to an embodiment of the present disclosure.
Figure 11B:
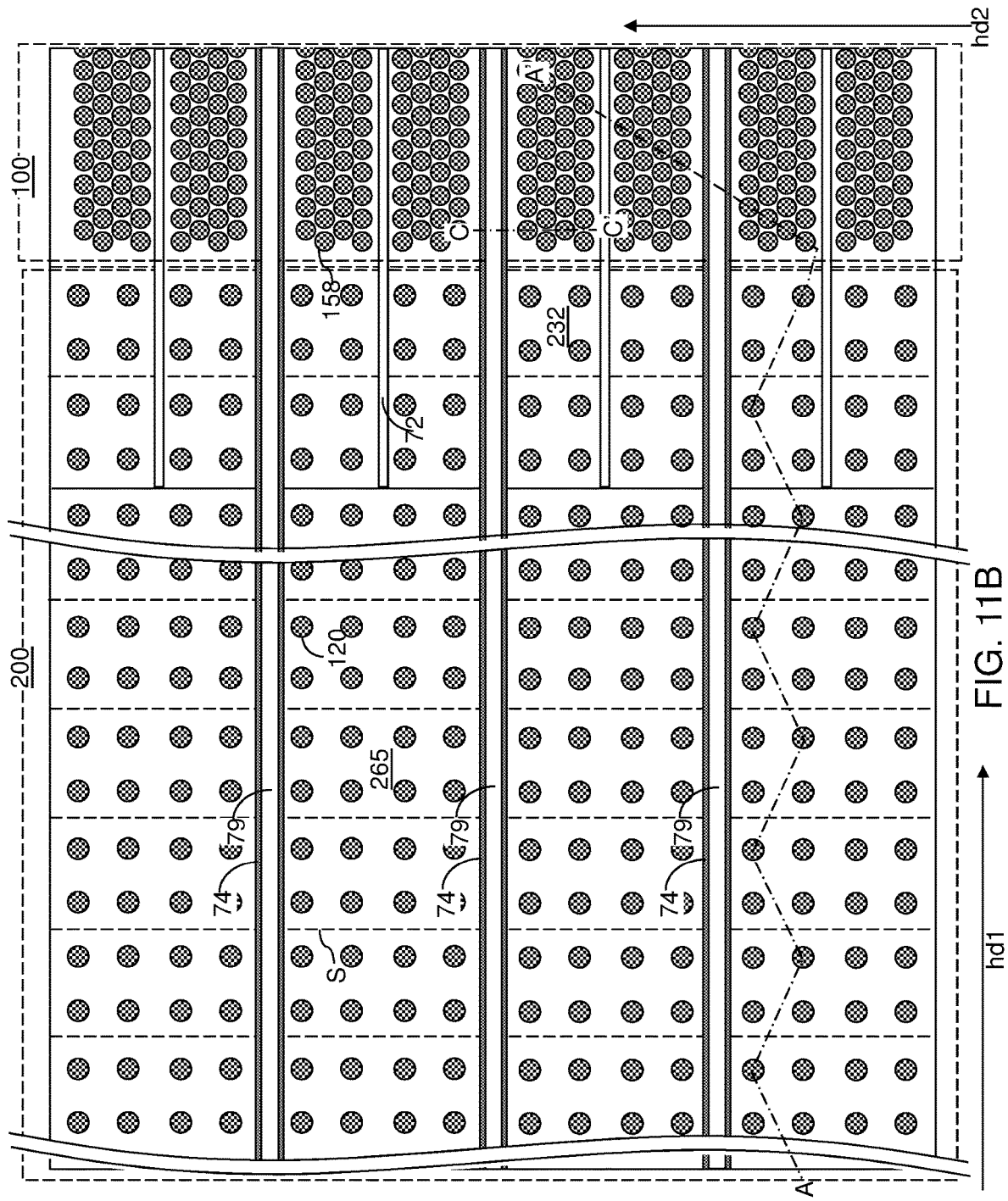
FIG. 11B is a horizontal cross-sectional view of the exemplary structure along the horizontal plane B-B' of FIG. 11A. The hinged vertical plane A-A' corresponds to the plane of the vertical cross-sectional view of FIG. 11A.
Figure 11C:
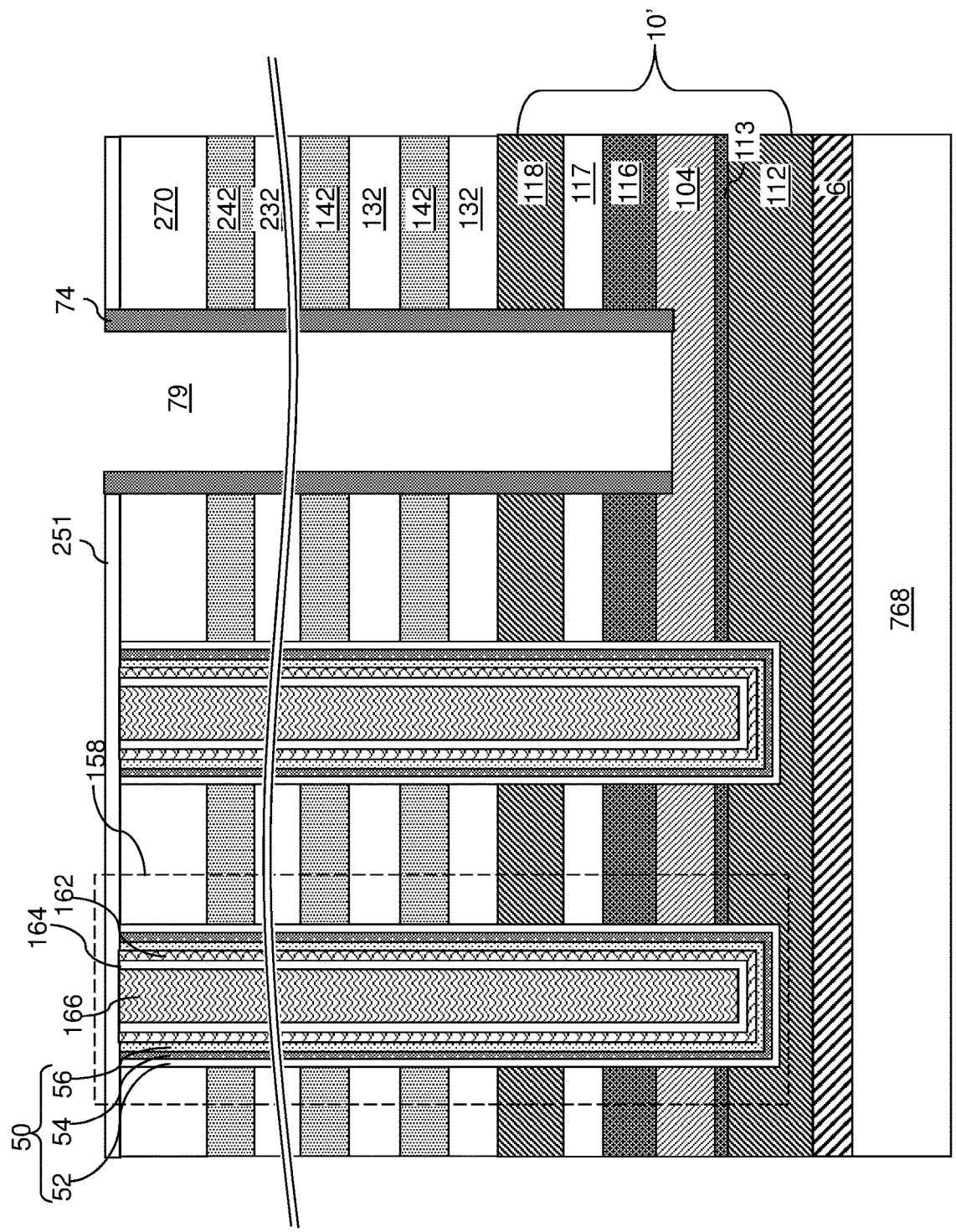
FIG. 11C is a vertical cross-sectional view of a region of the exemplary structure along the vertical plane C-C' of FIG. 11B.

Referring to FIGS. 11A-11C, a sacrificial insulating cap material layer 251 can be formed over the second-tier structure (232, 242, 270, 265, 72). The sacrificial insulating cap material layer 251 includes a dielectric material such as borosilicate glass, and can be formed by a conformal or non-conformal deposition process. The sacrificial insulating cap material layer 251 protects the in-process memory opening fill structures 158 and the in-process support opening fill structure 120 during subsequent processing steps. For example, the sacrificial insulating cap material layer 251 can have a thickness in a range from 100 nm to 600 nm, although lesser and greater thicknesses can also be used.

A photoresist layer can be applied over the sacrificial insulating cap material layer 251 and can be lithographically patterned to form elongated openings that extend along the first horizontal direction hd1 between clusters of in-process memory opening fill structures 158. Backside trenches 79 can be formed by transferring the pattern in the photoresist layer through the sacrificial insulating cap material layer 251, the second alternating stack (232, 242, 270, 265, 72), and the first alternating stack (132, 142, 170, 165), and into the in-process source-level material layers 10'. Portions of the sacrificial insulating cap material layer 251, the second alternating stack (232, 242, 270, 265, 72), the first alternating stack (132, 142, 170, 165), and the in-process source-level material layers 10' that underlie the openings in the photoresist layer can be removed to form the backside trenches 79. In one embodiment, the backside trenches 79 can be formed between clusters of in-process memory opening fill structures 158. The clusters of the in-process memory opening fill structures 158 can be laterally spaced apart along the second horizontal direction hd2 by the backside trenches 79. In one embodiment, a surface of the source-level sacrificial layer 104 can be physically exposed at the bottom of each backside trench 79.

A backside trench spacer 74 can be formed on sidewalls of each backside trench 79. For example, a conformal spacer material layer can be deposited in the backside trenches 79 and over the first contact level dielectric layer 280, and can be anisotropically etched to form the backside trench spacers 74. The backside trench spacers 74 include a material that is different from the material of the source-level sacrificial layer 104. For example, the backside trench spacers 74 can include silicon nitride.

Figure 12A:
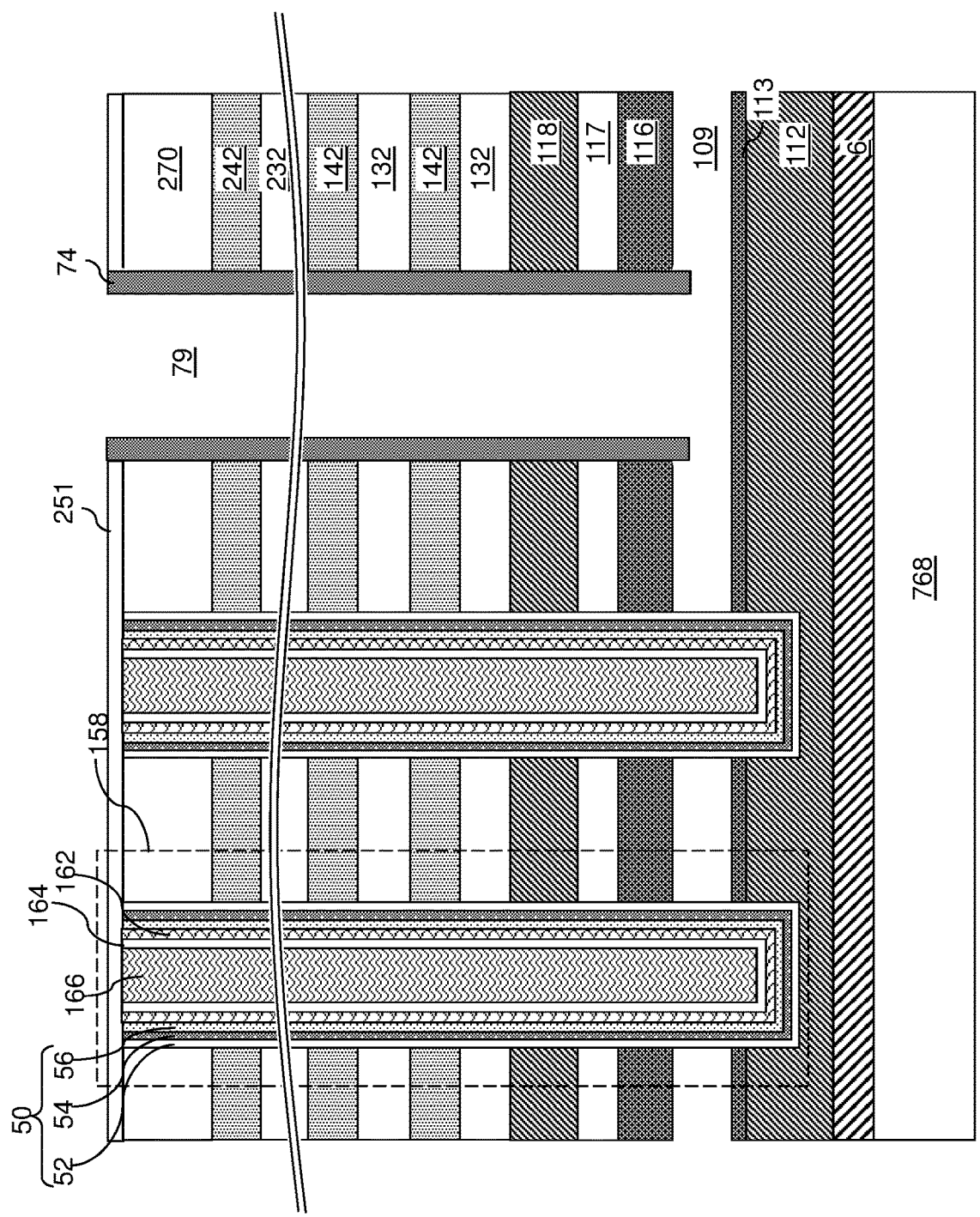
FIGS. 12A-12C illustrate sequential vertical cross-sectional views of memory openings and a backside trench during replacement of the in-process source-level material layers with source-level material layers according to an embodiment of the present disclosure.

Referring to FIG. 12A, an etchant that etches the material of the source-level sacrificial layer 104 selective to the materials of the first alternating stack (132, 142), the second alternating stack (232, 242), the first and second insulating cap layers (170, 270), the optional source-select-level conductive layer 118, the at least one source-level upper dielectric layer (116, 117), and the source-level lower dielectric layer 113 can be introduced into the backside trenches in an isotropic etch process. For example, if the source-level sacrificial layer 104 includes undoped amorphous silicon or an undoped amorphous silicon-germanium alloy, the backside trench spacers 74 include silicon nitride, and the upper and source-level lower dielectric layers (105, 113) include silicon oxide, a wet etch process using hot trimethyl-2 hydroxyethyl ammonium hydroxide ("hot TMY") or tetramethyl ammonium hydroxide (TMAH) can be used to remove the source-level sacrificial layer 104 selective to the backside trench spacers 74, the first source-level upper dielectric layer 116, and the source-level lower dielectric layer 113. A source cavity 109 is formed in the volume from which the source-level sacrificial layer 104 is removed.

Figure 12B:
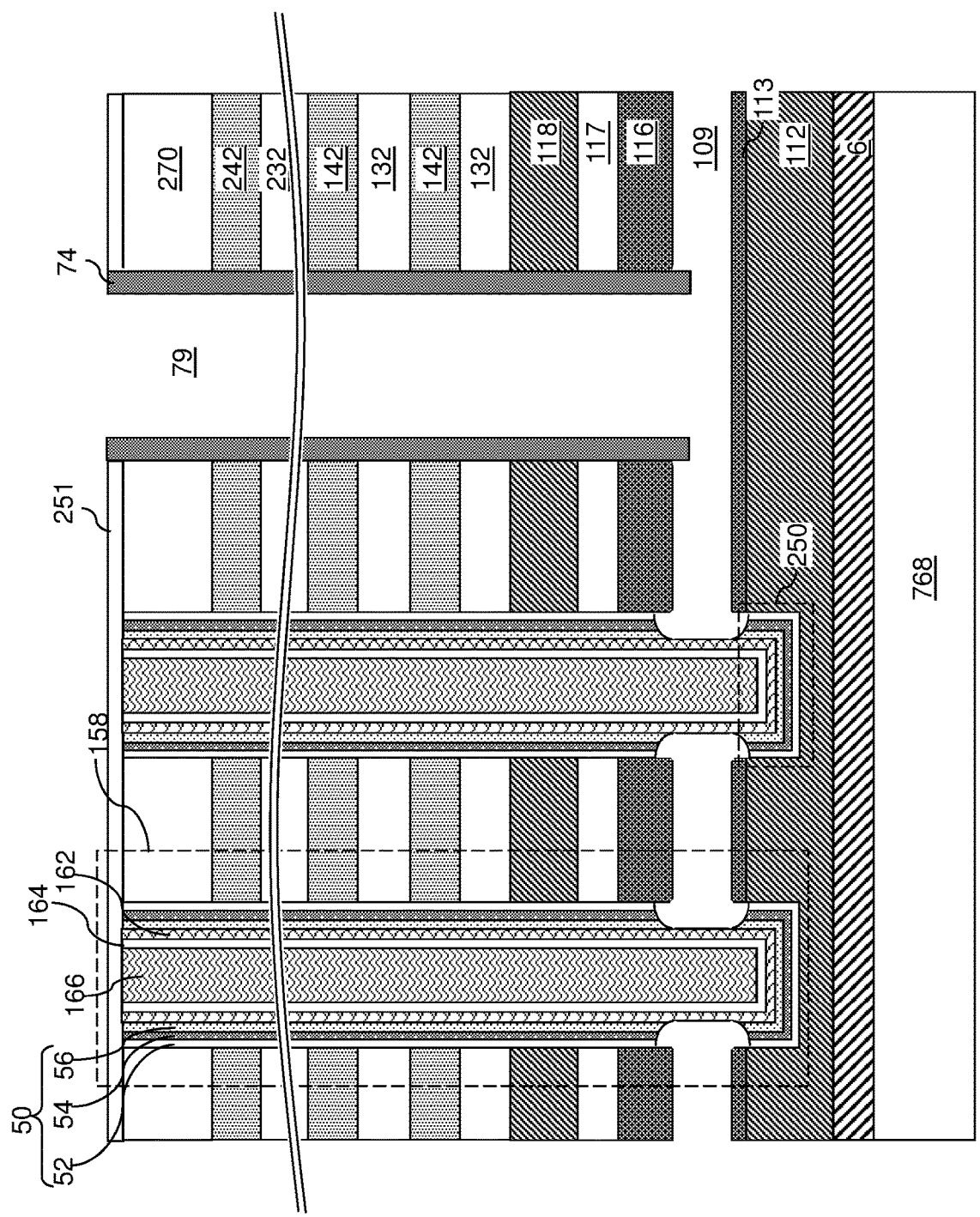

Referring to FIG. 12B, a sequence of isotropic etchants, such as wet etchants, can be applied to the physically exposed portions of the memory films 50 to sequentially etch the various component layers of the memory films 50 from outside to inside, and to physically expose cylindrical surfaces of the cap semiconductor material layers 162 at the level of the source cavity 109. The first source-level upper dielectric layer 116 and the source-level lower dielectric layer 113 may be thinned due to collateral etching during removal of the portions of the memory films 50 located at the level of the source cavity 109. The source cavity 109 can be expanded in volume by removal of the portions of the memory films 50 at the level of the source cavity 109 and the upper and source-level lower dielectric layers (105, 113). A bottom surface of the first source-level upper dielectric layer 116 and a top surface of the source-level lower dielectric layer 113 can be physically exposed to the source cavity 109.

Discrete remaining portions of the memory films 50 that are within the buried source semiconductor layer 112 constitute bottom dielectric caps 250. Each of the bottom dielectric caps comprises: a first dielectric layer having a same composition and a same thickness as the blocking dielectric 52; a second dielectric layer having a same composition and a same thickness as the charge storage layer 54; and a third dielectric layer having a same composition and a same thickness as the tunneling dielectric 56 and contacting a bottommost surface of a cap semiconductor material layer 162.

The isotropic etch process used to etch physically exposed portions of the memory films 50 can form concave surfaces in remaining portions of the memory films 50 due to the isotropic nature of the etch process. In one embodiment, the bottom surface of each memory film 50 can be a tapered annular concave surface that vertically protrudes further downward at a bottom periphery of an inner sidewall of the memory film 50 than at a bottom periphery of an outer sidewall of the memory film 50.

Figure 12C:
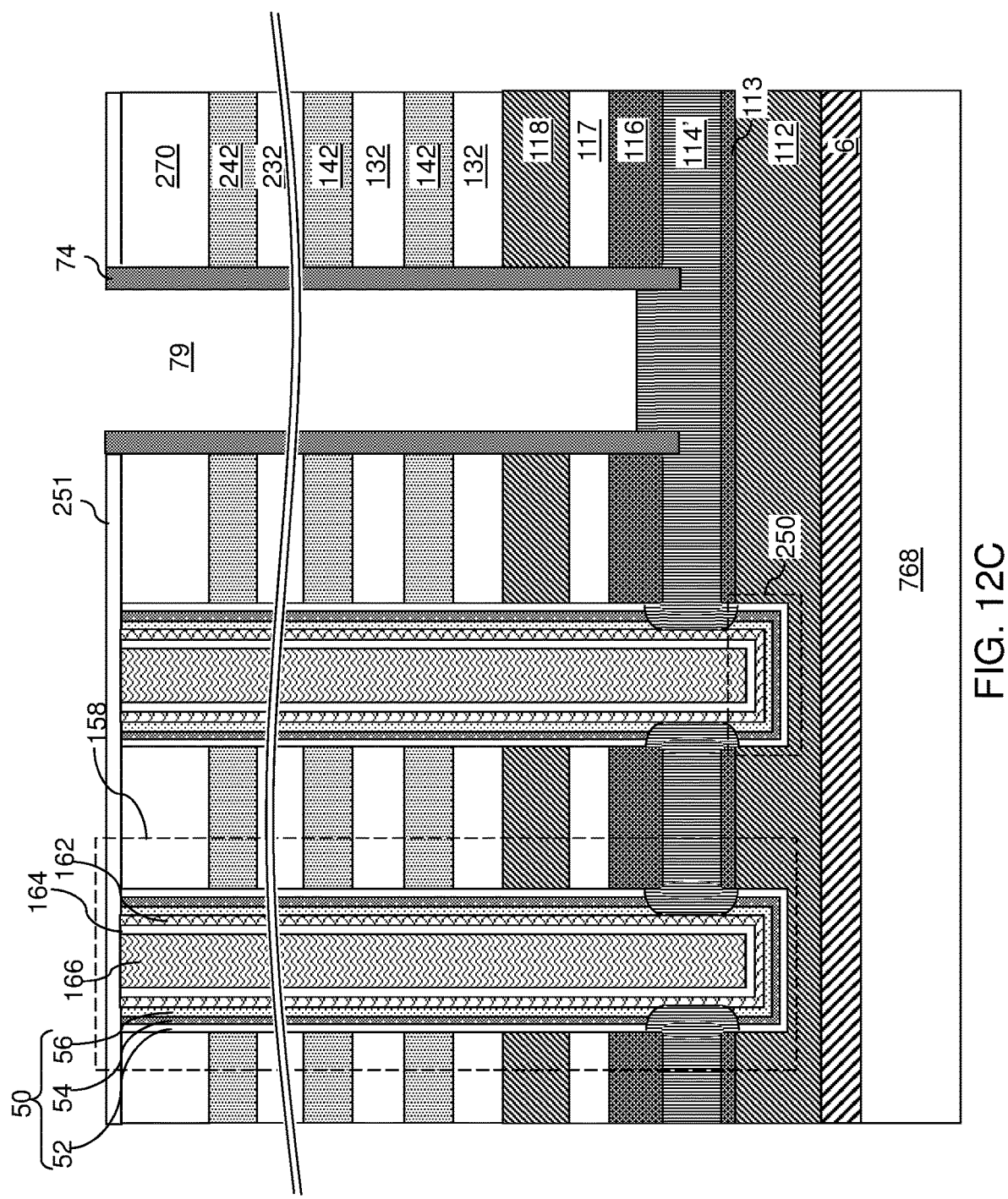

Referring to FIG. 12C, a doped semiconductor material having a doping of the second conductivity type can be grown from the physically exposed semiconductor surfaces around the source cavity 109. The physically exposed semiconductor surfaces around the source cavity 109 include the physically exposed portions of the outer sidewalls of the cap semiconductor material layer 162. The doped semiconductor material can include an amorphous material such as amorphous silicon or an amorphous silicon-germanium alloy. The second conductivity type is the same conductivity type as the doping type of the buried source semiconductor layer 112, and can be the opposite of the doping type of vertical semiconductor channels to be subsequently formed by replacement of the sacrificial opening fill structures (162, 164, 166).

In one embodiment, the doped semiconductor material can be deposited on the physically exposed semiconductor surfaces around the source cavity 109 by a selective semiconductor deposition process. A semiconductor precursor gas, an etchant, and an n-type dopant precursor gas can be flowed concurrently into a process chamber including the exemplary structure during the selective semiconductor deposition process. For example, the semiconductor precursor gas can include silane, disilane, or dichlorosilane, the etchant gas can include gaseous hydrogen chloride, and the n-type dopant precursor gas such as phosphine, arsine, or stibine. In this case, the selective semiconductor deposition process grows a doped semiconductor material from physically exposed semiconductor surfaces around the source cavity 109. The deposited doped semiconductor material forms a semiconductor fill material layer 114', which can contact sidewalls of the cap semiconductor material layers 162. The atomic concentration of electrical dopants in the deposited semiconductor material can be in a range from $1.0 \times 10^{20}/cm^3$ to $2.0 \times 10^{21}/cm^3$, such as from $2.0 \times 10^{20}/cm^3$ to $8.0 \times 10^{20}/cm^3$. The semiconductor fill material layer 114' as initially formed can consist essentially of semiconductor atoms and electrical dopant atoms, and can be amorphous. Alternatively, at least one non-selective in-situ doped semiconductor material deposition process can be used to form the semiconductor fill material layer 114'. In this case, one or more etch back processes may be used in combination with a plurality of selective or non-selective deposition processes to provide a seamless and/or voidless semiconductor fill material layer 114'.

The duration of the selective semiconductor deposition process can be selected such that the source cavity 109 is filled with the semiconductor fill material layer 114', and the semiconductor fill material layer 114' contacts bottom end portions of inner sidewalls of the backside trench spacers 74. Thus, the source-level sacrificial layer 104 can be replaced with the semiconductor fill material layer 114'. In one embodiment, a periphery of a top surface of the semiconductor fill material layer 114' can be located on a sidewall of the first source-level upper dielectric layer 116.

Figure 13A:
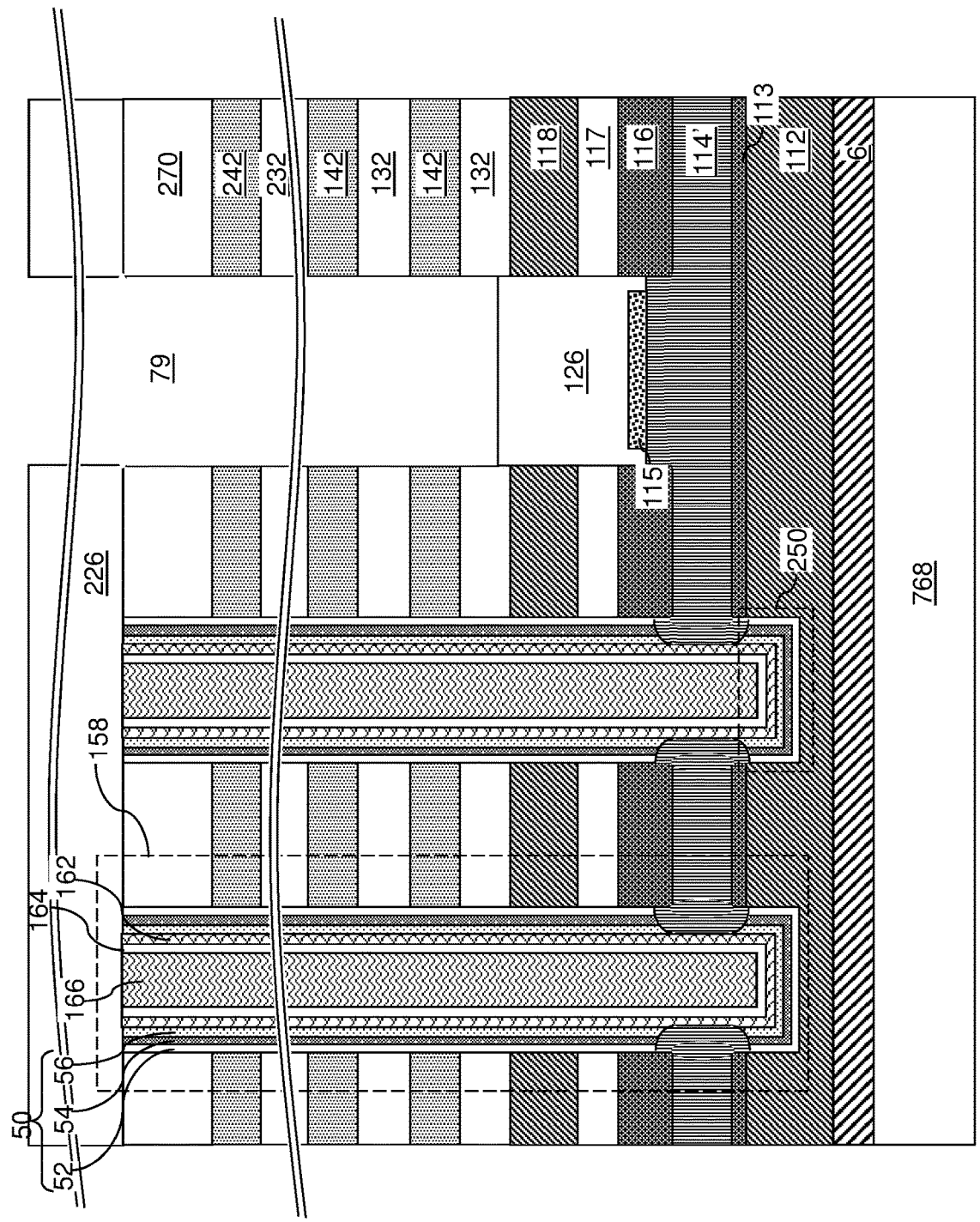
FIGS. 13A-13F illustrate sequential vertical cross-sectional views of memory openings and a backside trench during formation of a crystallized source contact layer and replacement of sacrificial opening fill structures with vertical semiconductor channels according to an embodiment of the present disclosure.

Referring to FIG. 13A, a metallic catalyst material is deposited on the physically exposed top surfaces of the semiconductor fill material layer 114'. The metallic catalyst material can be any material that can diffuse through the material of the semiconductor fill material layer 114' and induce catalytic grain growth within the semiconductor fill material layer 114'. For example, the metallic catalyst material can comprise, and/or consist essentially of, nickel, tin, lead, tungsten, or other transition metals known to induce whisker growth of silicon. When the metallic catalyst material is present on the surface of the semiconductor fill material layer 114', the metallic catalyst material can diffuse through the semiconductor fill material layer 114' at an elevated temperature. In one embodiment, the metallic catalyst material can include nickel.

The metallic catalyst material can be deposited by physical vapor deposition. Portions of the metallic catalyst material that are deposited directly on the semiconductor fill material layer 114' form metallic catalyst material portions 115. The metal catalyst material portion 115 may be formed as metal portions consisting essentially of at least one elemental metal (i.e., a single elemental metal or an intermetallic alloy), or may be formed as metal-semiconductor alloy portions (such as metal silicide portions). The metal catalyst material portions 115 can be formed on the physically exposed surfaces of the semiconductor fill material layer 114', which are laterally offset from the memory openings 49 (and the in-process memory opening fill structures 158 located therein).

Excess portions of the metallic catalyst material deposited on the top surface of the sacrificial insulating cap material layer 251 can be removed by an etch back process. For example, the backside trenches 79 can be temporarily filled with a photoresist material without covering areas outside the backside trenches 79, and a recess etch process can be performed to remove the excess portions of the metallic catalyst material. The photoresist material can be subsequently removed, for example, by ashing. The sacrificial insulating cap material layer 251 may be partially or completely removed. If the sacrificial insulating cap material layer 251 is only partially removed, remaining portions of the sacrificial insulating cap material layer 251 can be incorporated into a temporary dielectric capping layer to be subsequently formed.

The backside trench spacers 74 can be removed selective to the metallic catalyst material portions 115 and the insulating layers (132, 232). An isotropic etch process such as a wet etch process can be used to remove the backside trench spacers 74.

A dielectric material, such as silicon oxide, can be non-conformally deposited. For example, plasma-enhanced chemical vapor deposition can be used to deposit the dielectric material. Optionally, an isotropic etch back process may be used to remove vertical portions of the deposited dielectric material from sidewalls of the backside trenches 79. Alternatively, the isotropic etch back process can be performed at a subsequent step, for example, after formation of vertical semiconductor channels.

Portions of the deposited dielectric material in the backside trenches 79 form dielectric source capping structures 126, which can laterally extend along the first horizontal direction hd1. Portions of the deposited dielectric material over the second insulating cap layer 270 constitutes a temporary dielectric capping layer 226. In case a source-select-level conductive layer 118 is used, a top surface of a dielectric source capping structure 126 can be formed above a horizontal plane including a top surface of the source-select-level conductive layer 118 such that the source-select-level conductive layer 118 is protected from subsequent etch processes by the dielectric source capping structure 126. In one embodiment, the thickness of the dielectric source capping structure 126 can be in a range from 20 nm to 500 nm, although lesser and greater thicknesses can also be used.

Figure 13B:
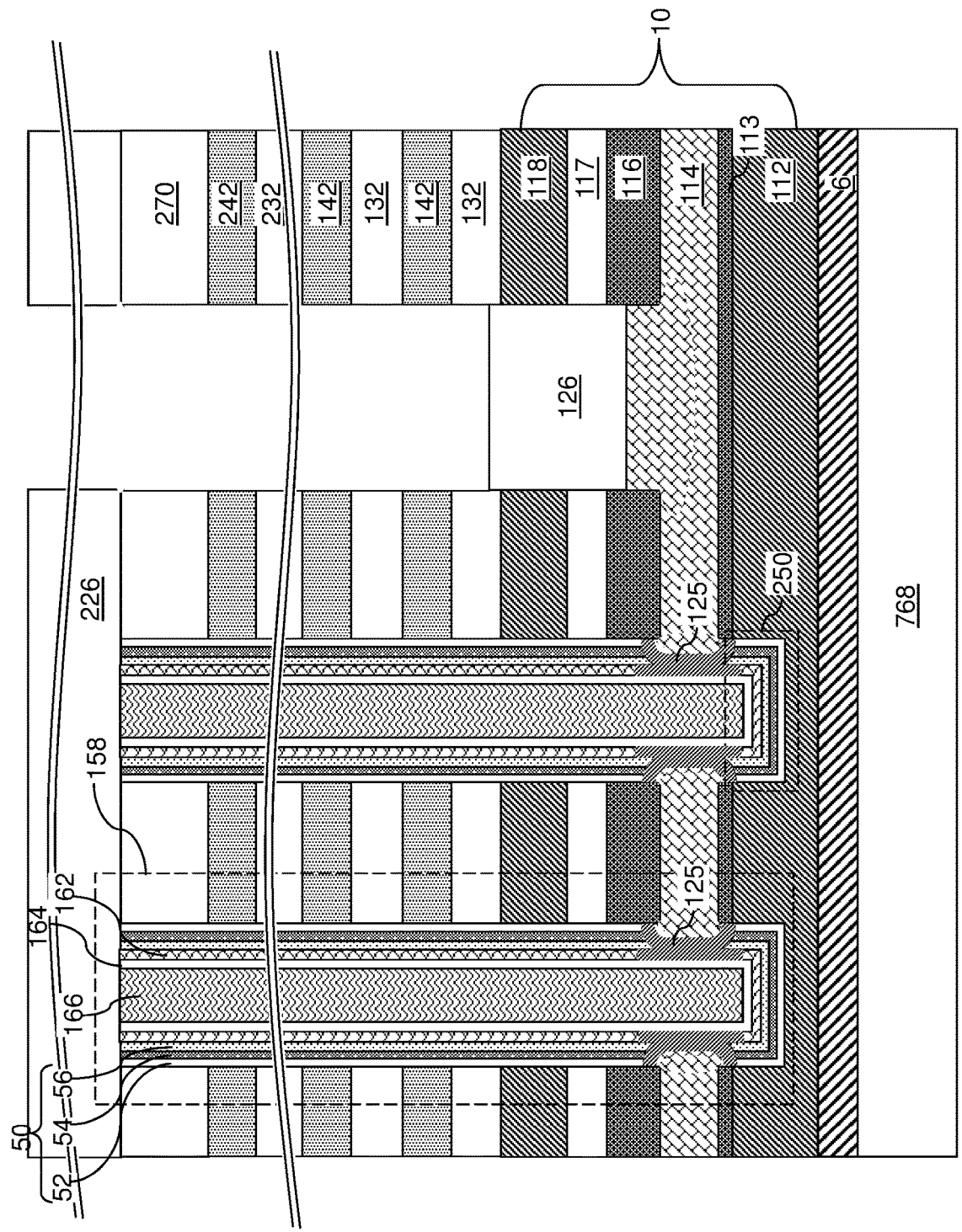

Referring to FIG. 13B, the exemplary semiconductor structure can be annealed at an elevated temperature that induces diffusion of the elemental metal(s) within the metallic catalyst material portions 115. The elevated temperature may be in a range from 200 degrees Celsius to 800 degrees Celsius, such as from 400 degrees Celsius to 600 degrees Celsius. The elemental metal(s) in the metallic catalyst material laterally diffuse through the amorphous doped semiconductor material of the semiconductor fill material layer 114' to interfaces with the sacrificial semiconductor material portions (162, 164, 166). Thus, the elemental metal(s) within the metal-semiconductor alloy portions 115 laterally diffuse through the semiconductor fill material layer 114' toward the sacrificial semiconductor material portions 166, and can reach the cap semiconductor material layers 162. The elemental metal induces catalytic conversion of the amorphous semiconductor material of the semiconductor fill material layer 114' into a highly crystalline semiconductor material, which forms a source contact layer 114.

The lateral diffusion of the elemental metal through the semiconductor fill material layer 114' forms grain boundaries that extend predominantly along lateral directions within the source contact layer 114. In one embodiment, a predominant portion (i.e., more than 50%) of grain boundaries of the source contact layer 114 extend along lateral directions. In one embodiment, the average lateral dimension of the grain boundaries of the source contact layer 114 can be at least the thickness of the source contact layer 114, which is the vertical distance between a top surface of the source contact layer 114 and a bottom surface of the source contact layer 114. In one embodiment, the average lateral dimension of the grain boundaries of the source contact layer 114 can be greater than twice the thickness of the source contact layer 114 and/or greater than three times the thickness of the source contact layer 114. Thus, the source-level sacrificial layer 104 is replaced with the source contact layer 114 that includes a heavily doped (i.e., conductive) polycrystalline semiconductor material.

In one embodiment, the cap semiconductor material layers 162 have a significantly lesser thickness than the thickness of the source contact layer 114. For example, the thickness of the cap semiconductor material layers 162 can be less than 20%, and/or less than 10%, of the thickness of the source contact layer 114. In this case, the metallic element that diffuses through the amorphous semiconductor material of the semiconductor fill material layer 114' and converts the semiconductor fill material layer 114' into the source contact layer 114 can pile up at interfaces between the source contact layer 114 and the cap semiconductor material layers 162. The duration of the anneal process can be selected such that the metallic catalyst material portions 115 disappear at the end of the anneal process and most of the metallic elements from the metallic catalyst material portions 115 pile up at the interfaces between the source contact layer 114 and the cap semiconductor material layers 162 to form metal-containing regions 125. The metal-containing regions 125 may be located in regions of the source contact layer 114 that contacts the cap semiconductor material layers 162 and/or may be located in regions of the cap semiconductor material layers 162 that contact the source contact layer 114. The metal-containing regions 125 include the elemental metal and the semiconductor material(s) of the source contact layer 114 and/or the cap semiconductor material layers 162. In one embodiment, the metal-containing regions 125 can include a metal-semiconductor alloy in which the atomic ratio of the semiconductor material to the elemental metal is greater than 5, and/or greater than 10.

The set of material layers including the buried source semiconductor layer 112, the source-level lower dielectric layer 113, the source contact layer 114, the at least one source-level upper dielectric layer (116, 117), and the optional source-select-level conductive layer 118 constitutes source-level material layers 10. The source-level material layers 10 are derived from the in-process source-level material layer 10' by replacing the source-level sacrificial layer 104 with the source contact layer 114.

Figure 13C:
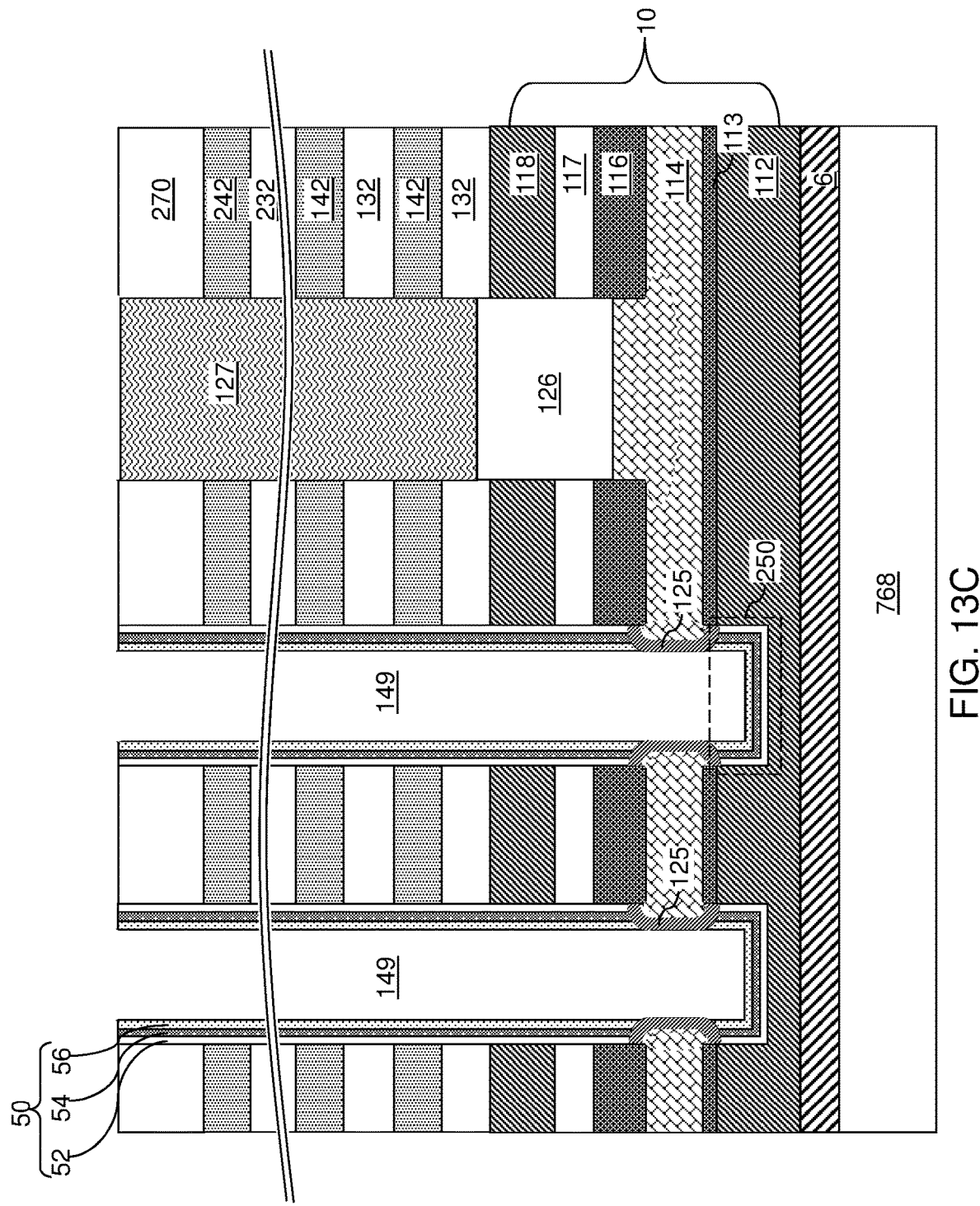

Referring to FIG. 13C, a sacrificial protective material, such as a photoresist material, can be deposited in the backside trenches 79 over the dielectric source capping structures 126 to form sacrificial protective material portions 127. The temporary dielectric capping layer 226 can be removed, for example, by an isotropic etch process. For example, if the temporary dielectric capping layer 226 include borosilicate glass, the temporary dielectric capping layer 226 can be removed by a wet etch using hydrofluoric acid.

Subsequently, the sacrificial semiconductor material portions (162, 164, 166) can be removed selective to the memory films 50. For example, if the sacrificial semiconductor material portions 166 include amorphous silicon, a wet etch process using hot trimethyl-2 hydroxyethyl ammonium hydroxide ("hot TMY") or tetramethyl ammonium hydroxide (TMAH) can be used to remove the sacrificial semiconductor material portions 166 selective to the cap silicon oxide layers 164 and the second insulating cap layer 270. Subsequently, the cap silicon oxide layers 164 can be removed by another isotropic etch process, which can include a wet etch process using dilute hydrofluoric acid. An isotropic etch process, such as a wet etch process using hot TMY or TMAH, can be performed to remove the cap semiconductor material layers 162. Alternatively, an anisotropic etch process can be performed to remove the cap semiconductor material layers 162. Metal-containing regions of the cap semiconductor material layers 162 can be removed by the isotropic or anisotropic etch process. A memory cavity 149 is formed in each volume from which a sacrificial semiconductor material portion (162, 164, 166) is removed.

Figure 13D:
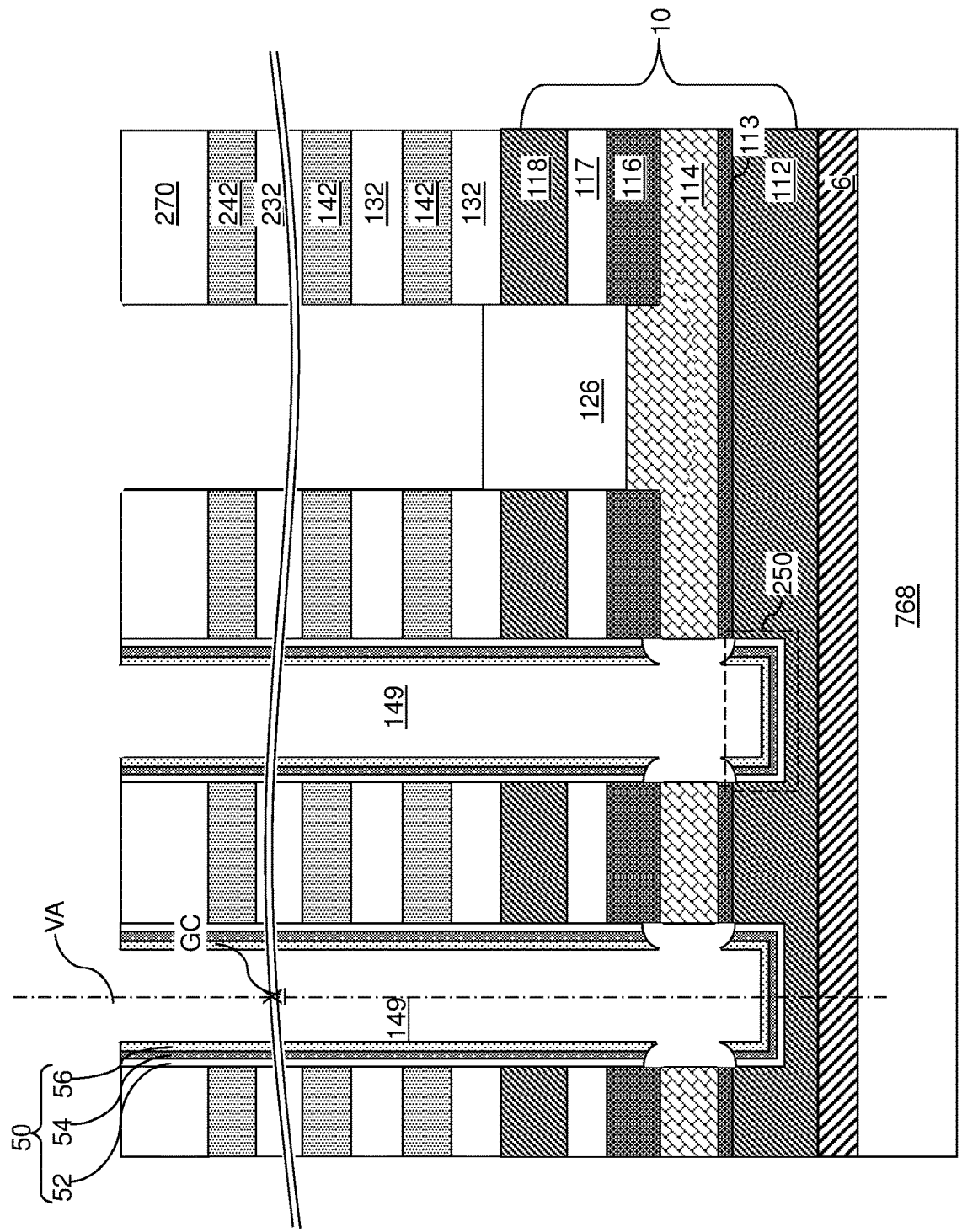

Referring to FIG. 13D, metal-containing regions of the source contact layer 114 can be removed by an isotropic etch process or by extending the isotropic etch process used to remove the cap semiconductor material layers 162. For example, the isotropic etch process can include a wet etch process using hot TMY or TMAH. A sidewall of the source contact layer 114 is laterally recessed relative to an inner sidewall of each memory film 50 during removal of the metal-containing regions of the source contact layer 114. An annular cavity is formed between each memory film 50 and an underlying bottom dielectric cap 250. Upon removal of the metal-containing regions from the source contact layer 114, remaining portions of the source contact layer 114 can be substantially free of metal, i.e., include metal elements at a concentration less than 0.1 part per million, and/or less than 1 part per billion.

The lateral etch distance of the isotropic etch process that etches the source contact layer 114 may be the same as, less than, or greater than, the thickness of a memory film 50. In one embodiment, a vertical sidewall of the source contact layer 114 that is proximal to a memory opening 49 may be located within a vertical plane containing an outer sidewall of the memory film 50 within the memory opening 49. In another embodiment, a vertical sidewall of the source contact layer 114 that is proximal to a memory opening 49 may be more proximal to a vertical axis VA passing through a geometrical center GC of the memory openings 49 than a vertical plane containing an outer sidewall of the memory film 50 within the memory opening 49 is to the vertical axis VA. In yet another embodiment, a vertical sidewall of the source contact layer 114 that is proximal to a memory opening 49 may be more distal from a vertical axis VA passing through a geometrical center GC of the memory openings 49 than a vertical plane containing an outer sidewall of the memory film 50 within the memory opening 49 is from the vertical axis VA. As used herein, a geometrical center of an element is the center of mass of a hypothetical object that has an identical volume as the element and having a uniform density throughout. As used herein, a vertical axis refers to an axis that is perpendicular to a top horizontal surface of a substrate. The sacrificial protective material portions 127 can be subsequently removed, for example, by ashing.

Figure 13E:
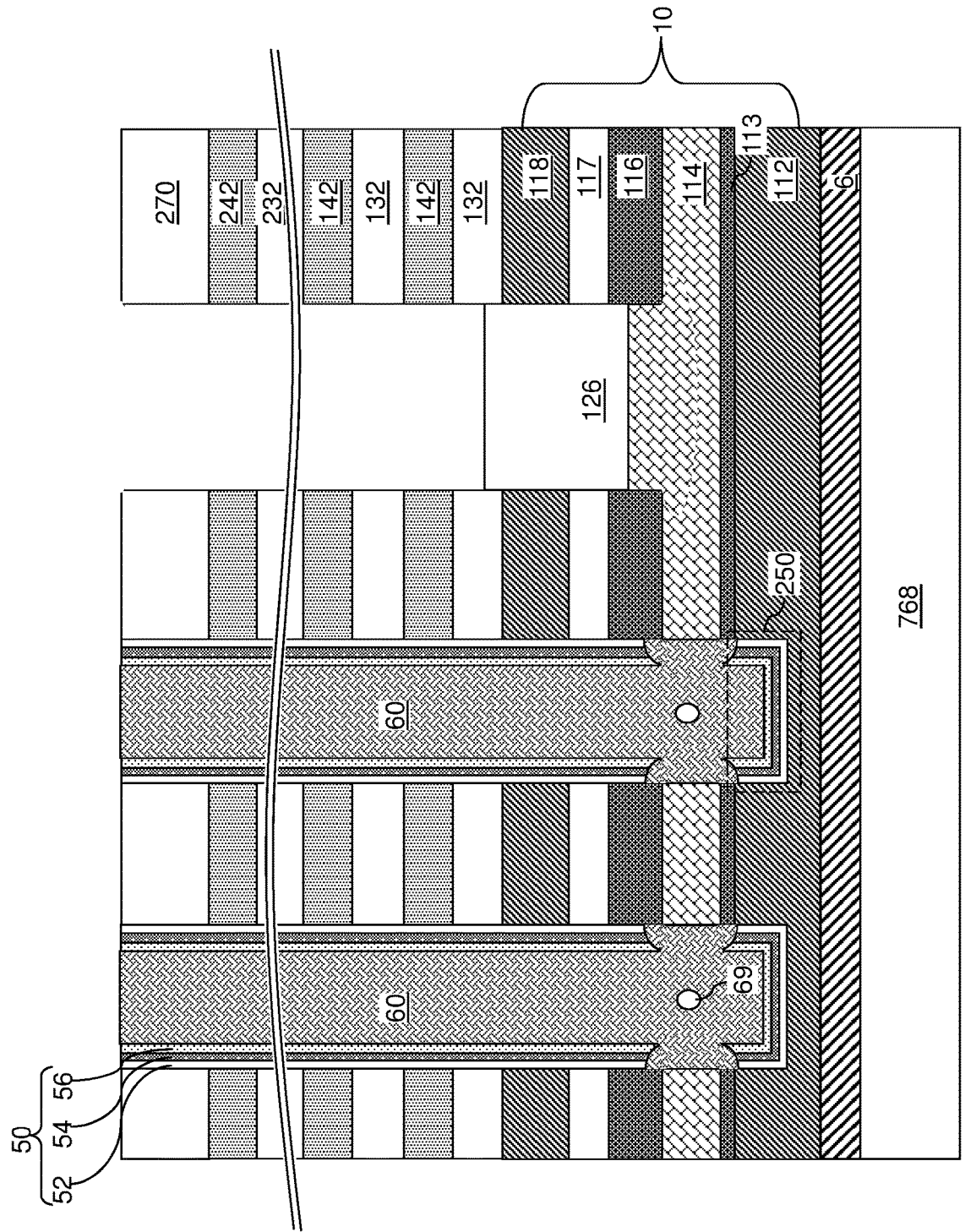

Referring to FIG. 13E, a semiconductor material can be deposited by a selective semiconductor deposition process on each physically exposed cylindrical sidewall of the source contact layer 114. The semiconductor material can be intrinsic, or can have a doping of the first conductivity type. A semiconductor precursor gas, an etchant, and a dopant precursor gas can be flowed concurrently into a process chamber including the exemplary structure during the selective semiconductor deposition process. For example, if the second conductivity type is p-type, a semiconductor precursor gas such as silane, disilane, or dichlorosilane, an etchant gas such as hydrogen chloride, and a dopant precursor gas such as phosphine, arsine, or stibine can be flowed into the process chamber. The average dopant concentration in the deposited semiconductor material can be in a range from $1.0 \times 10^{12}/cm^3$ to $1.0 \times 10^{18}/cm^3$, although lesser and greater dopant concentrations can also be used. Excess portions of the deposited semiconductor material can be removed from above the horizontal plane including the top surface of the second insulating cap layer 270. Each discrete remaining portion of the deposited semiconductor material in a respective memory opening 49 constitutes a vertical semiconductor channel 60. The deposited doped semiconductor material forms a vertical semiconductor channel 60 within each volume formed by removal of a sacrificial opening fill structure (162, 164, 166). A void 69 may be present within each vertical semiconductor channel 60.

The deposition of the material of the vertical semiconductor channel 60 is performed at a temperature that induces crystalline growth of the deposited semiconductor material. For example, the deposition of the semiconductor material can be performed at an elevated temperature in a range from 550 degrees Celsius to 900 degrees Celsius, such as from 580 degrees Celsius to 700 degrees Celsius. The crystallographic orientations of grains of the vertical semiconductor channel 60 can be aligned to crystallographic orientations of the grains of the source contact layer at the semiconductor-to-semiconductor interface formed between the source contact layer 114 and each of the vertical semiconductor channels 60. The average grain size of the vertical semiconductor channels 60 can be significantly greater than the average grain size of prior art vertical semiconductor channels that are formed without a crystalline semiconductor matrix such as the source contact layer 114 of various embodiments of the present disclosure. In one embodiment, the average grain size of the vertical semiconductor channels 60 can be on the order of the lesser of the thickness of the source contact layer 114 and the average lateral dimension of a memory opening 49.

The vertical semiconductor channels 60 can be formed by a selective semiconductor deposition process from physically exposed surfaces of the source contact layer 114. Each vertical semiconductor channel 60 fills at least a volume that is laterally bounded by the memory film 50 and located between a first horizontal plane including a bottom surface of a bottommost one of the sacrificial material layers (142, 242) and a top surface of a topmost one of the sacrificial material layers (142, 242).

Figure 13F:
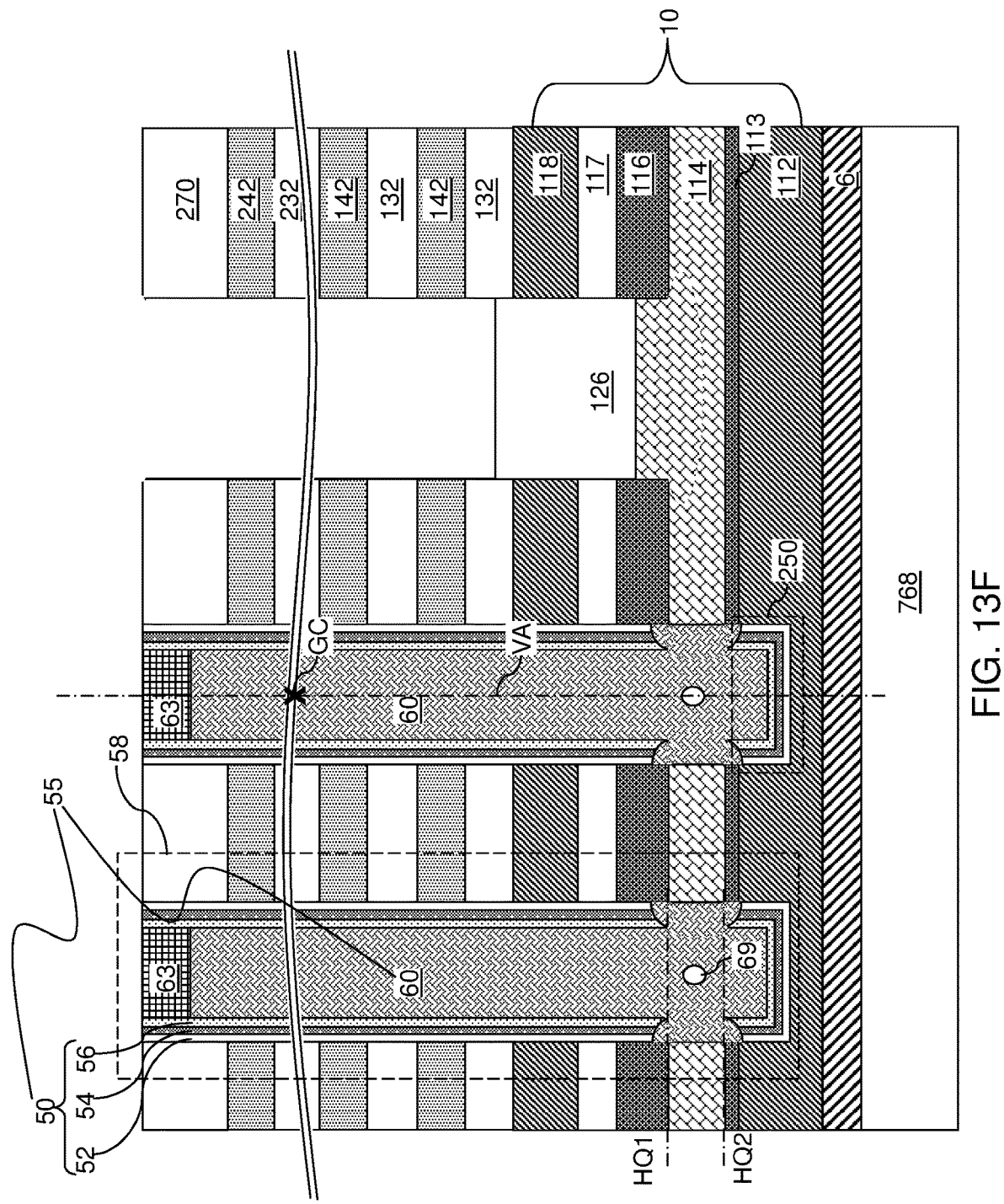
Figure 14:
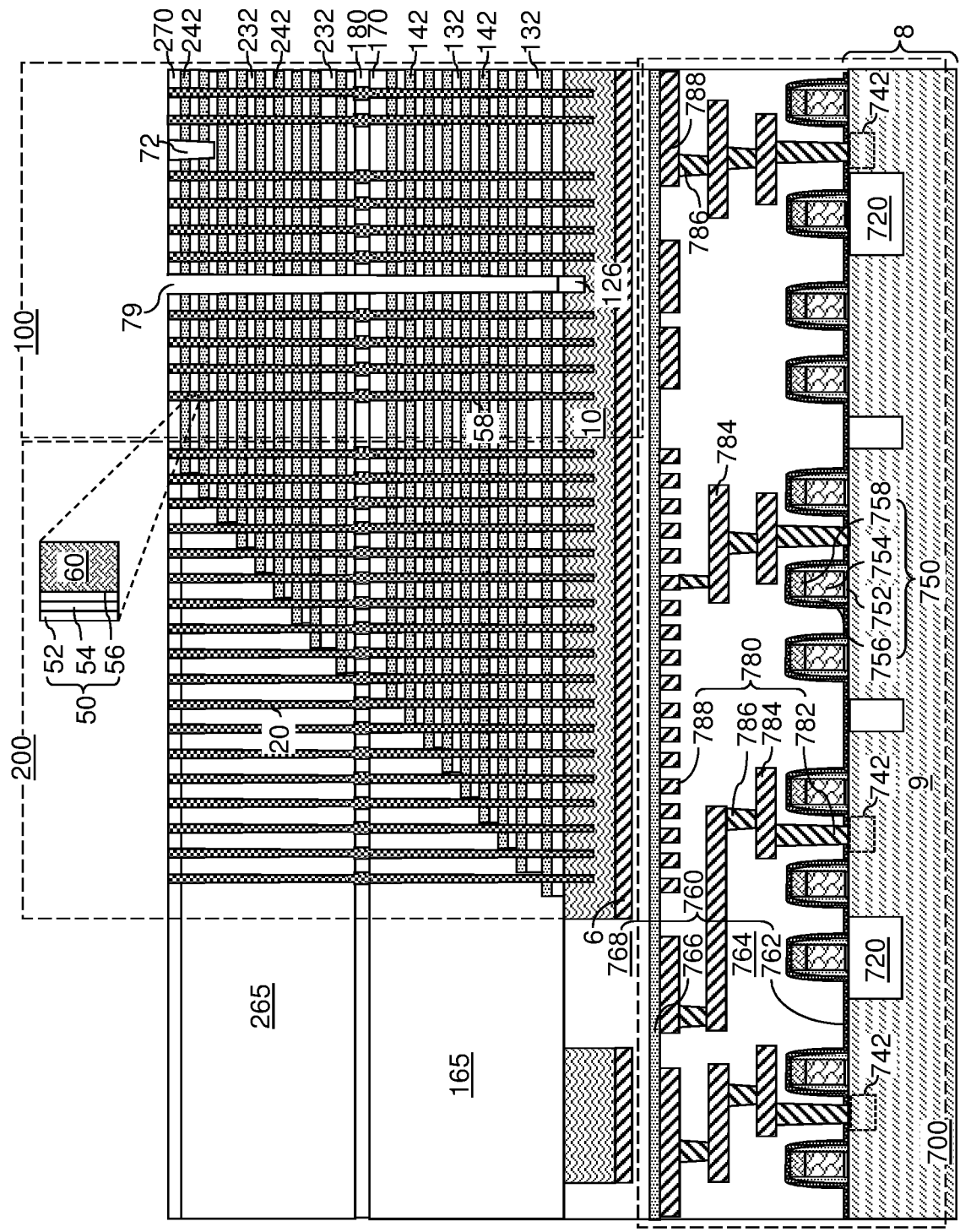
FIG. 14 is a vertical cross-sectional view of the exemplary structure after formation of memory opening fill structures according to an embodiment of the present disclosure.

Referring to FIGS. 13F and 14, a drain region 63 can be formed in an upper portion of each memory opening 49. For example, dopants of the second conductivity type can be implanted into upper portions of the vertical semiconductor channels 60 to convert the implanted regions into doped semiconductor material portions having a net doping of the second conductivity type. The net dopant concentration, i.e., the concentration of the dopants of the second conductivity type less the concentration of the dopants of the first conductivity type, in the drain regions 63 can be in a range from $1.0 \times 10^{19}/cm^3$ to $2.0 \times 10^{21}/cm^3$, although lesser and greater dopant concentrations can also be used. The bottom surface of each drain region 63 can be located above the horizontal plane including the bottom surface of the second insulating cap layer 270. The entire set of material portions filling a memory opening constitutes a memory opening fill structure 58, which includes, and can consist of, a bottom dielectric cap 250, a memory film 50, a vertical semiconductor channel 60, and a drain region 63. Likewise, each support opening can be filled with a support pillar structure 20 that includes a respective set of a bottom dielectric cap 250, a memory film 50, a vertical semiconductor channel 60, and a drain region 63. Each contiguous set of a memory film 50 and a vertical semiconductor channel 60 constitutes a memory stack structure 55, which includes a channel region of a vertical field effect transistor and a vertical stack of memory elements embodied as portions of a charge storage layer 54 located at the levels of the sacrificial material layers (142, 242).

In one embodiment, a semiconductor-to-semiconductor interface between a vertical semiconductor channel 60 and the source contact layer 114 may be laterally offset farther away from a vertical axis VA passing through a geometrical center GC of a memory opening fill structure 58 than a semiconductor-to-dielectric interface between the vertical semiconductor channel 60 and the memory film 50 is from the vertical axis VA. In one embodiment, the semiconductor-to-semiconductor interface comprises a cylindrical interface that vertically extends from a first plane HQ1 including a horizontal top surface of the source contact layer 114 to a second plane HQ2 including a horizontal bottom surface of the source contact layer 114.

In one embodiment, a vertical semiconductor channel 60 can include a void 69 through which the vertical axis VA passing through the geometrical center GC of the memory opening fill structure 58 extends. In one embodiment, the void 69 can be located between the second plane HQ2 (i.e., a horizontal plane including a bottom surface of the source contact layer 114) and the first plane HQ1 (i.e., a horizontal plane including a top surface of the source contact layer 114). Each sacrificial opening fill structure (162, 164, 166) can be replaced with a vertical semiconductor channel 60. In one embodiment, an annular convex surface of a vertical semiconductor channel 60 contacts a concave annular bottom surface of a memory film 50 within each memory opening fill structure 58.

Figure 15:
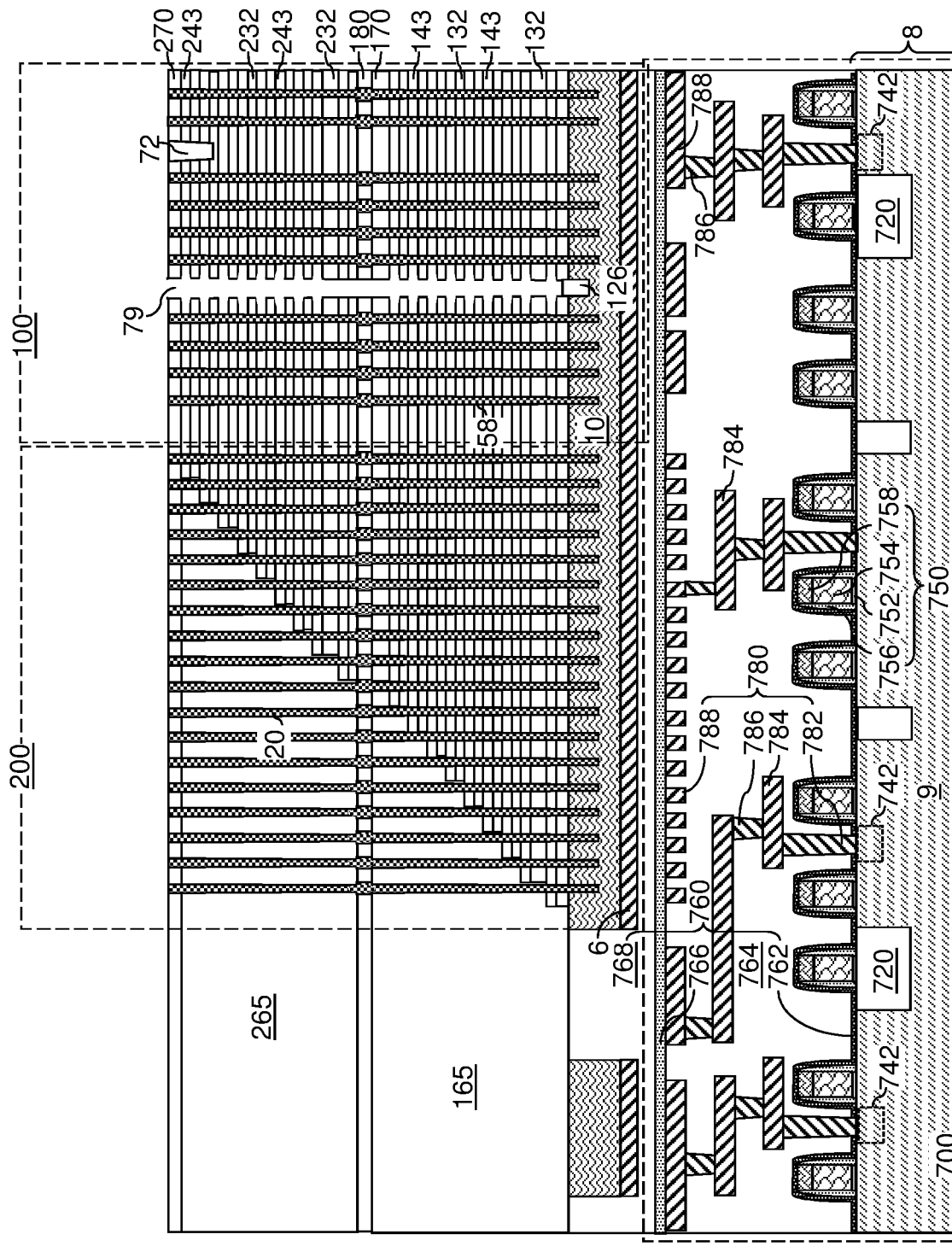
FIG. 15 is a vertical cross-sectional view of the exemplary structure after formation of backside recesses according to an embodiment of the present disclosure.

Referring to FIG. 15, the sacrificial material layers (142, 242) can be removed selective to the insulating layers (132, 232), the first and second insulating cap layers (170, 270), the retro-stepped dielectric material portions (165, 265), and the dielectric source capping structures 126. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 can be introduced into the backside openings 79, for example, using an isotropic etch process. For example, the sacrificial material layers (142, 242) can include silicon nitride, the materials of the insulating layers (132, 232), the first and second insulating cap layers (170, 270), the retro-stepped dielectric material portions (165, 265), and the outermost layer of the memory films 50 can include silicon oxide materials.

The isotropic etch process can be a wet etch process using a wet etch solution, or can be a gas phase (dry) etch process in which the etchant is introduced in a vapor phase into the backside opening 79. For example, if the sacrificial material layers (142, 242) include silicon nitride, the etch process can be a wet etch process in which the exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) can be a laterally extending cavity having a lateral dimension that is greater than the vertical extent of the cavity. In other words, the lateral dimension of each of the backside recesses (143, 243) can be greater than the height of the respective backside recess (143, 243). A plurality of backside recesses (143, 243) can be formed in the volumes from which the material of the sacrificial material layers (142, 242) is removed. Each of the backside recesses (143, 243) can extend substantially parallel to the top surface of the substrate semiconductor layer 9. A backside recess (143, 243) can be vertically bounded by a top surface of an underlying insulating layer (132, 232) and a bottom surface of an overlying insulating layer (132, 232). In one embodiment, each of the backside recesses (143, 243) can have a uniform height throughout.

Figure 16:
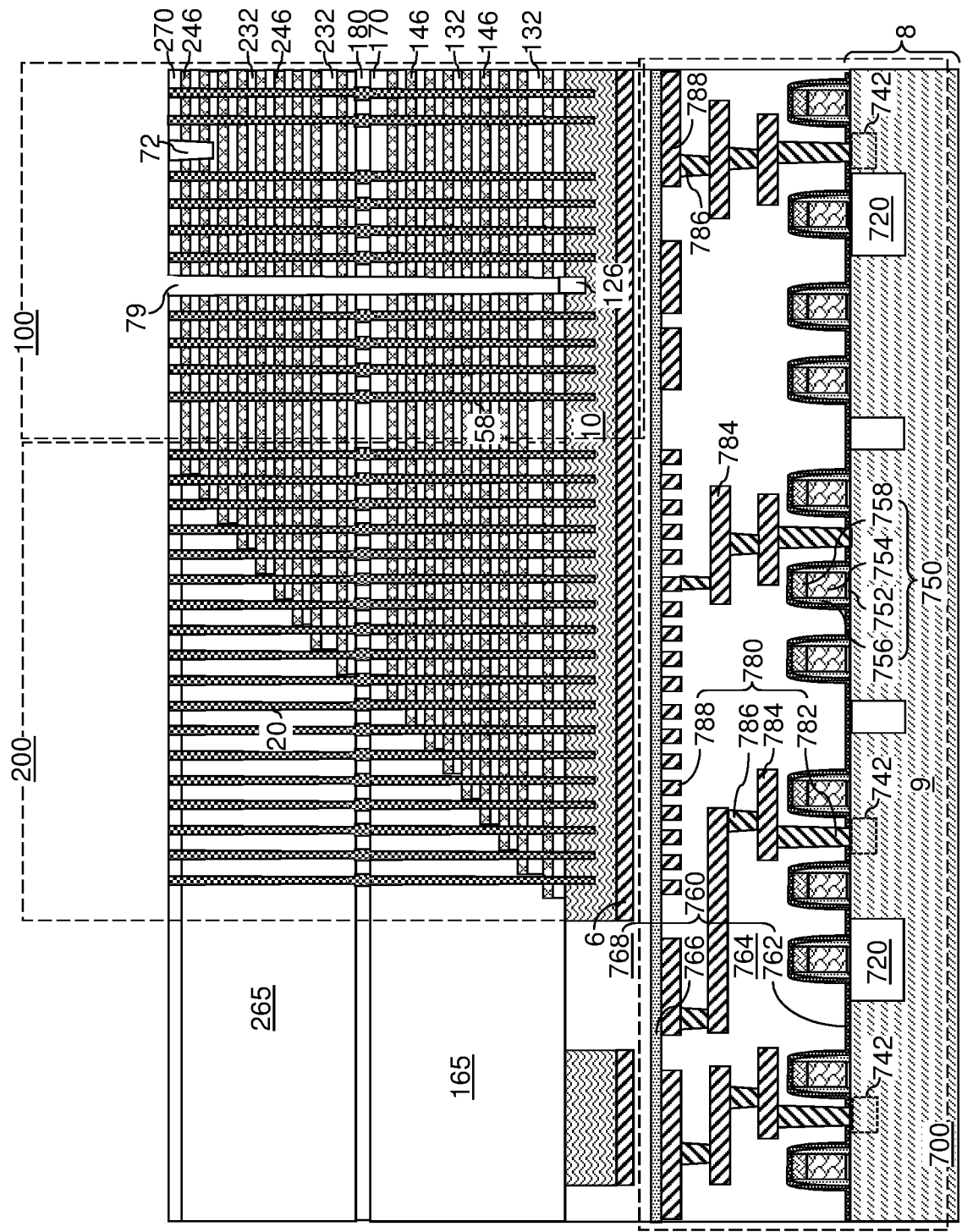
FIG. 16 is a vertical cross-sectional view of the exemplary structure after formation of electrically conductive layers according to an embodiment of the present disclosure.
Figure 17A:
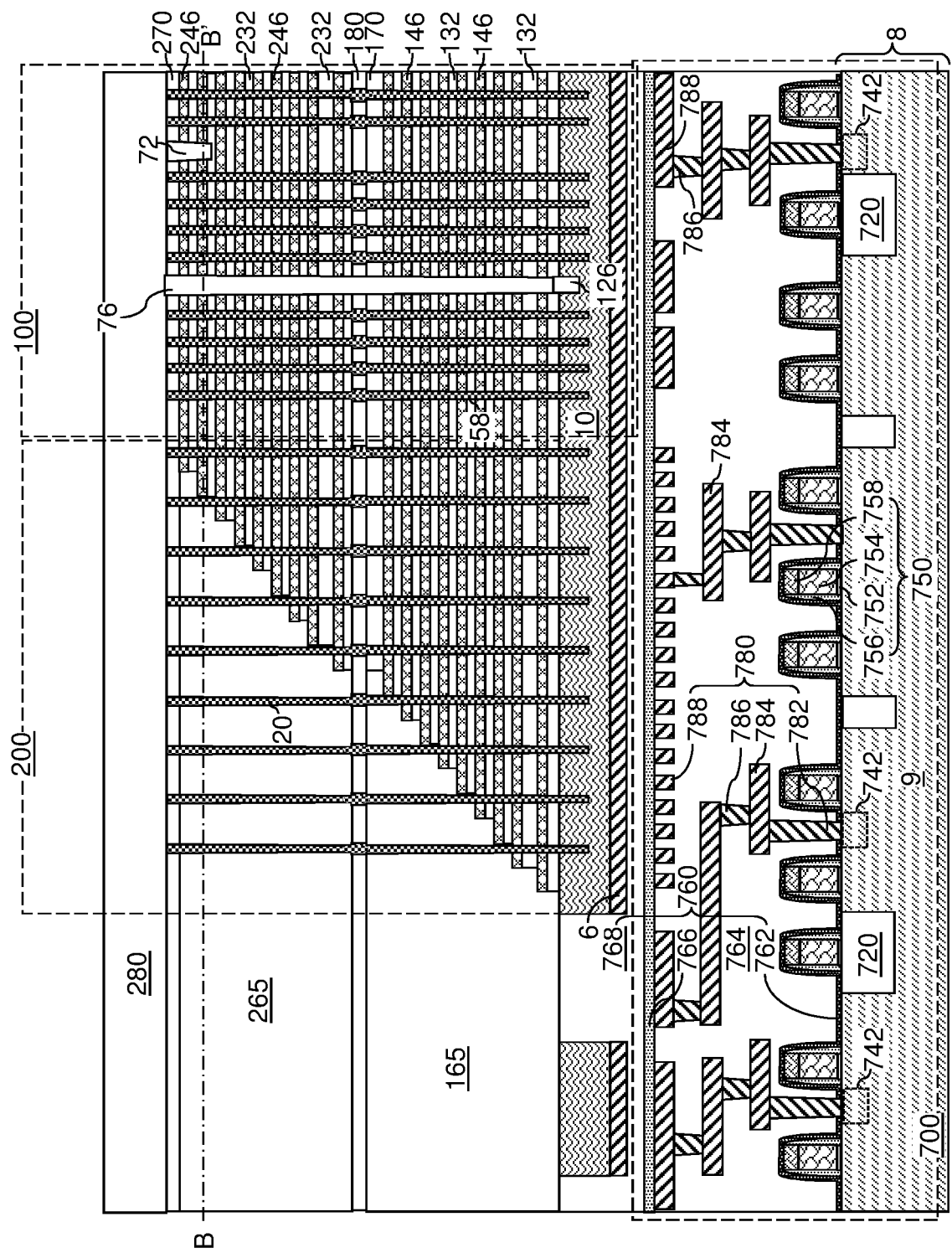
FIG. 17A is a vertical cross-sectional view of the exemplary structure after formation of dielectric wall structures and a contact level dielectric layer according to an embodiment of the present disclosure.
Figure 17B:
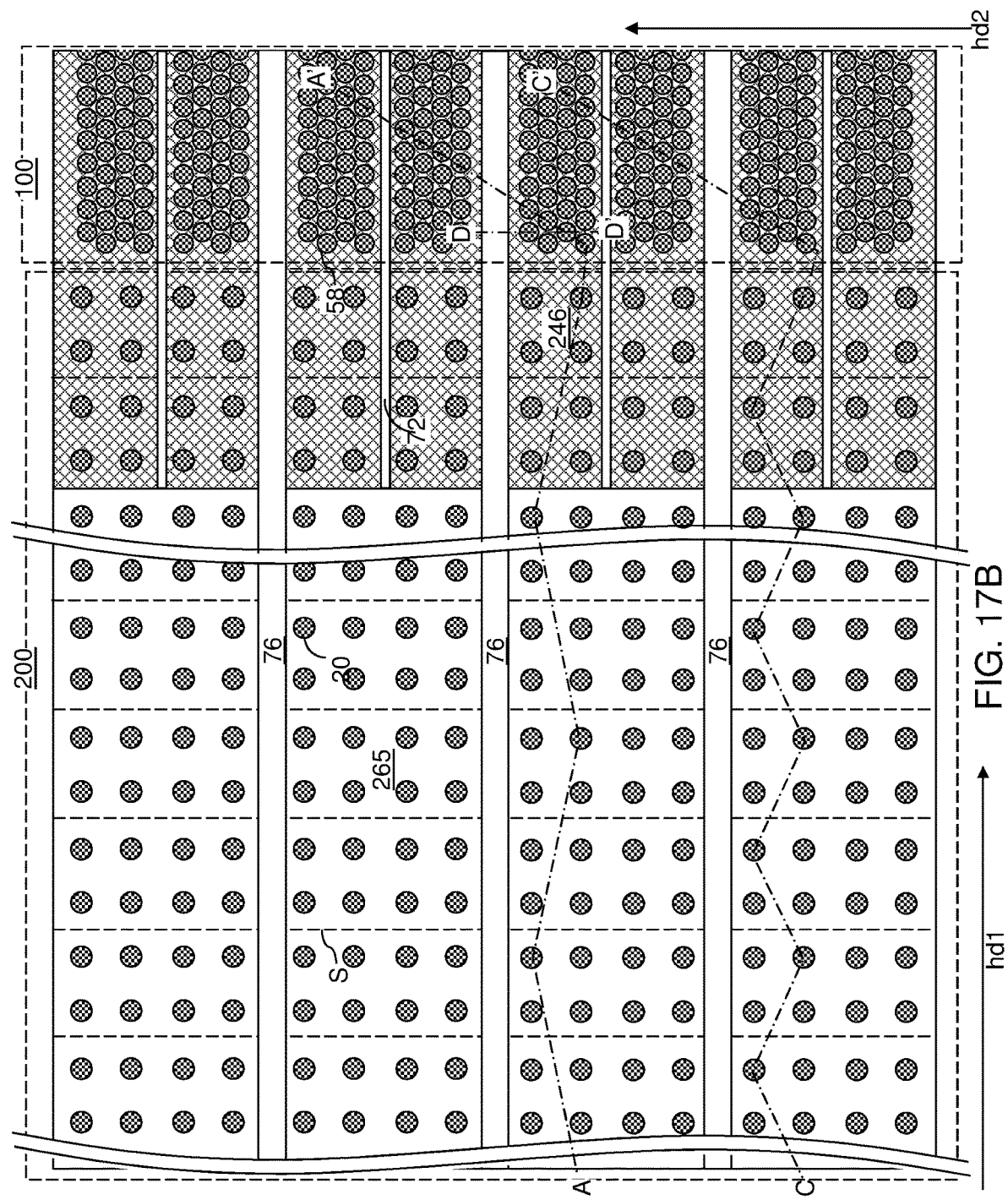
FIG. 17B is a horizontal cross-sectional of the exemplary structure along the horizontal plane B-B' of FIG. 17A. The hinged vertical plane A-A' corresponds to the plane of the vertical cross-sectional view of FIG. 17A.
Figure 17C:
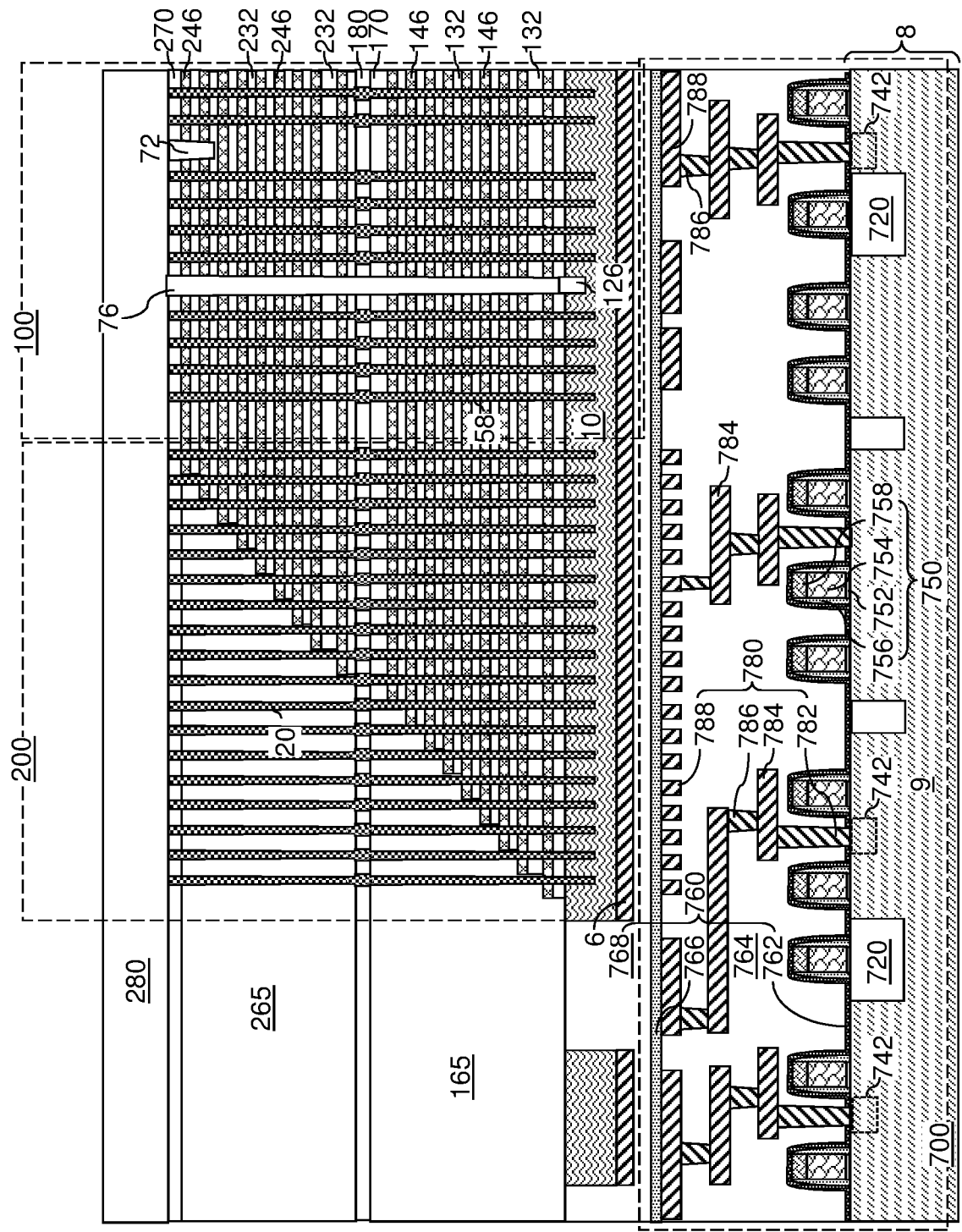
FIG. 17C is a vertical cross-sectional view of the exemplary structure along the vertical plane C-C' of FIG. 17B.
Figure 17D:
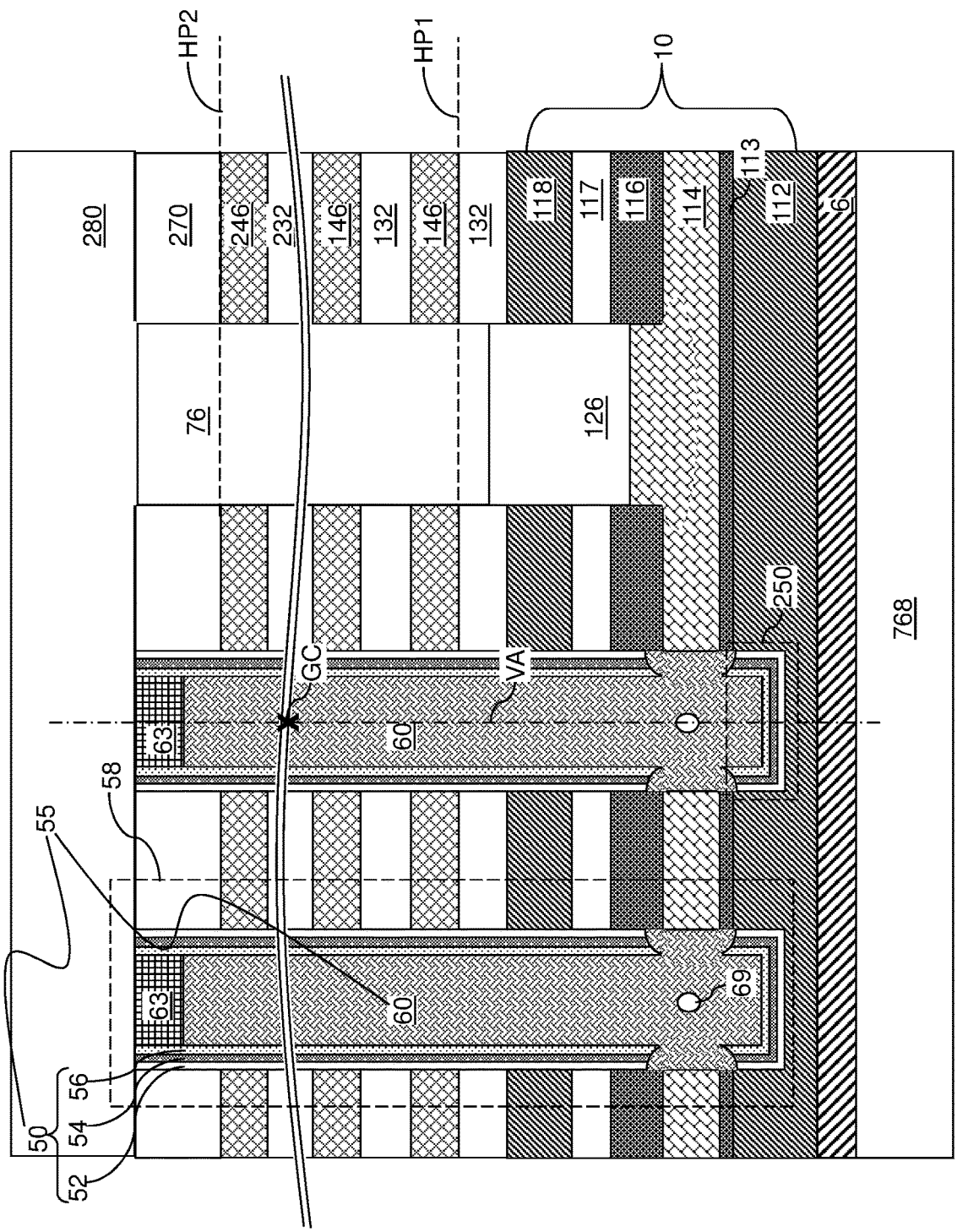
FIG. 17D is a vertical cross-sectional view of a region of the exemplary structure along the vertical plane D-D' of FIG. 17B.

Referring to FIG. 16, a backside blocking dielectric layer (not shown) can be optionally deposited in the backside recesses (143, 243) and the backside trenches 79 and over the second insulating cap layer 270. The backside blocking dielectric layer includes a dielectric material such as a dielectric metal oxide, silicon oxide, or a combination thereof. For example, the backside blocking dielectric layer can include aluminum oxide. The backside blocking dielectric layer can be formed by a conformal deposition process such as atomic layer deposition or chemical vapor deposition. The thickness of the backside blocking dielectric layer can be in a range from 1 nm to 20 nm, such as from 2 nm to 10 nm, although lesser and greater thicknesses can also be used.

At least one conductive material can be deposited in the plurality of backside recesses (243, 243), on the sidewalls of the backside trenches 79, and over the second insulating cap layer 270. The at least one conductive material can be deposited by a conformal deposition method, which can be, for example, chemical vapor deposition (CVD), atomic layer deposition (ALD), electroless plating, electroplating, or a combination thereof. The at least one conductive material can include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material can include at least one metallic material, i.e., an electrically conductive material that includes at least one metallic element. Non-limiting exemplary metallic materials that can be deposited in the backside recesses (143, 243) include tungsten, tungsten nitride, titanium, titanium nitride, tantalum, tantalum nitride, cobalt, and ruthenium. For example, the at least one conductive material can include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) can be a combination of titanium nitride layer and a tungsten fill material.

Electrically conductive layers (146, 246) can be formed in the backside recesses (143, 243) by deposition of the at least one conductive material. A plurality of first electrically conductive layers 146 can be formed in the plurality of first backside recesses 143, a plurality of second electrically conductive layers 246 can be formed in the plurality of second backside recesses 243, and a continuous metallic material layer (not shown) can be formed on the sidewalls of each backside trench 79 and over the second insulating cap layer 270. Each of the first electrically conductive layers 146 and the second electrically conductive layers 246 can include a respective conductive metallic nitride liner and a respective conductive fill material. Thus, the first and second sacrificial material layers (142, 242) can be replaced with the first and second electrically conductive layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside trench 79 that is not filled with the continuous metallic material layer.

Residual conductive material can be removed from inside the backside trenches 79. Specifically, the deposited metallic material of the continuous metallic material layer can be etched back from the sidewalls of each backside trench 79 and from above the second insulating cap layer 270, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246.

Each electrically conductive layer (146, 246) can be a conductive sheet including openings therein. A first subset of the openings through each electrically conductive layer (146, 246) can be filled with memory opening fill structures 58. A second subset of the openings through each electrically conductive layer (146, 246) can be filled with the support pillar structures 20. Each electrically conductive layer (146, 246) can have a lesser area than any underlying electrically conductive layer (146, 246) because of the first and second stepped surfaces. Each electrically conductive layer (146, 246) can have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The semiconductor devices in the underlying peripheral device region 700 can comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

Referring to FIGS. 17A-17D, a dielectric material is deposited in the backside trenches 79 to form dielectric wall structures 76. Each of the dielectric wall structures 76 can laterally extend along the first horizontal direction hd1 and can vertically extend through each layer of an alternating stack of the insulating layers (132, 232) and the word-line-level electrically conductive layers (146, 246). Each dielectric wall structure 76 can contact sidewalls of the first and second insulating cap layers (170, 270).

A contact level dielectric layer 280 may be formed over the second insulating cap layer 270. The contact level dielectric layer 280 includes a dielectric material such as silicon oxide, and can have a thickness in a range from 100 nm to 600 nm, although lesser and greater thicknesses can also be used.

The vertical semiconductor channel 60 within each memory opening fill structure 58 fills at least a volume that is laterally bounded by the memory film 50 and located between a first horizontal plane HP1 including a bottom surface of a bottommost one of the electrically conductive layers (146, 246) and a second horizontal plane HP2 including a top surface of a topmost one of the electrically conductive layers (146, 246). Each memory opening fill structure 58 and portions of the electrically conductive layers (146, 246) that are proximal to the memory opening fill structure comprise a vertical NAND string.

Figure 18A:
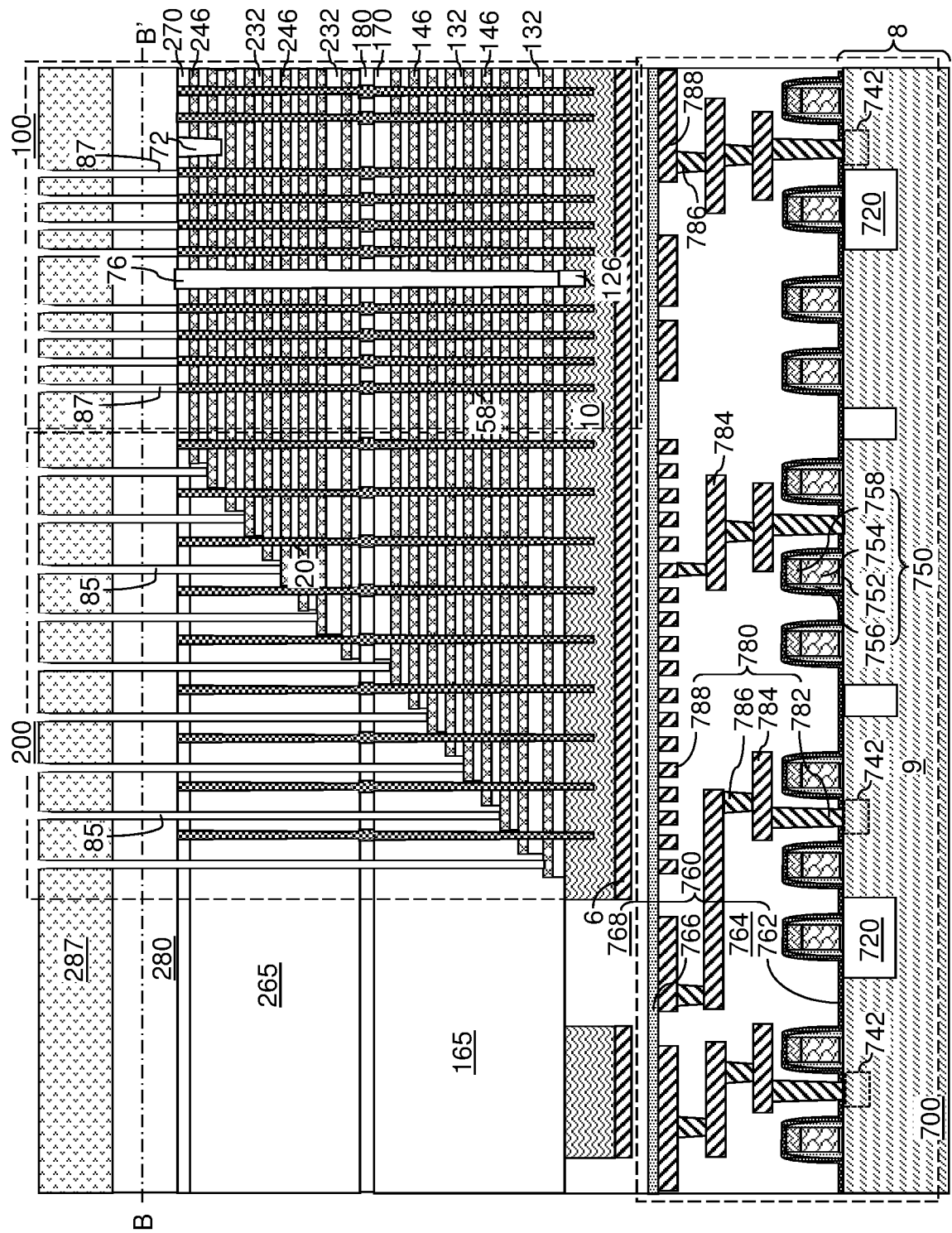
FIG. 18A is a vertical cross-sectional view of the exemplary structure after formation of various contact via cavities according to an embodiment of the present disclosure.
Figure 18B:
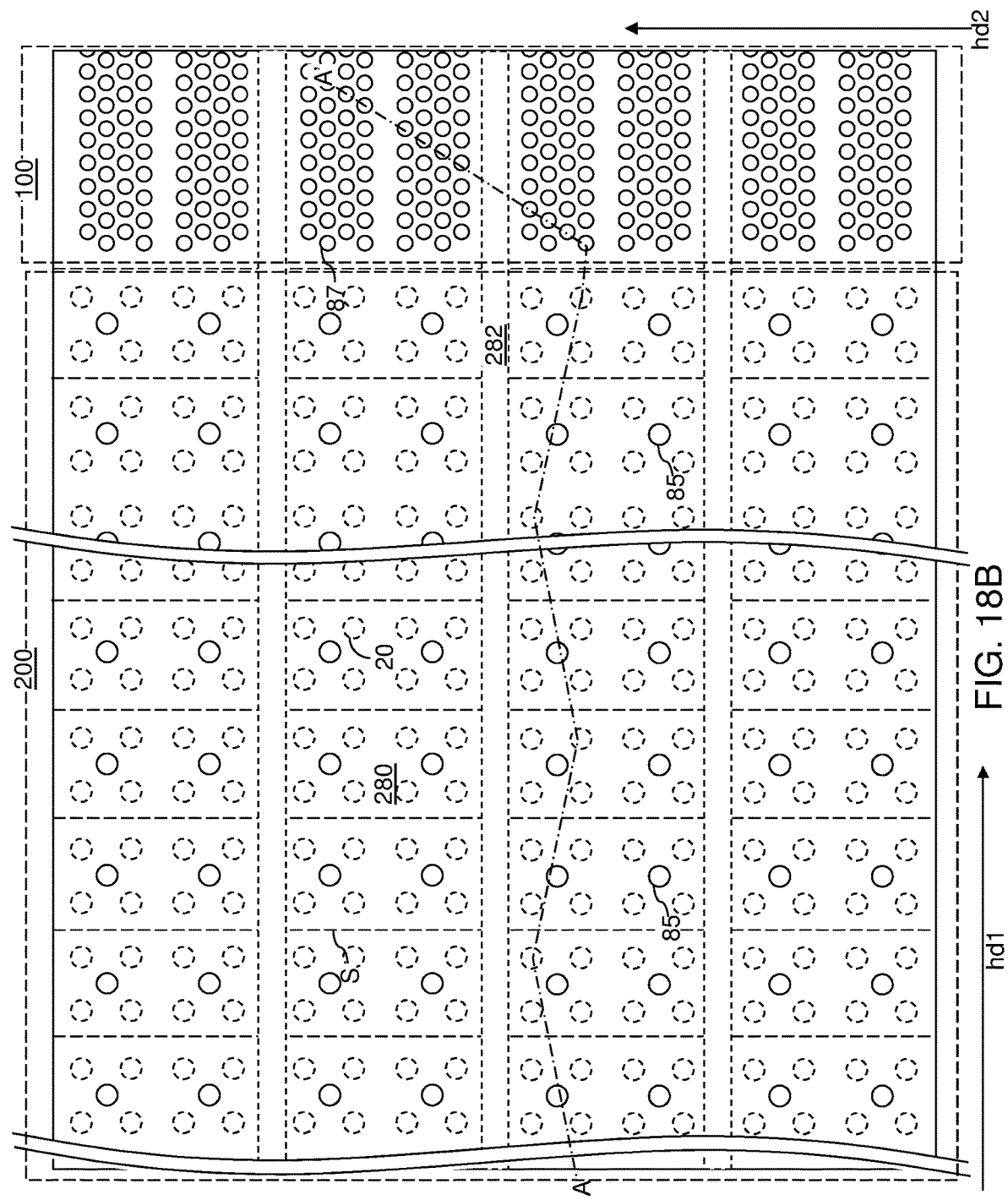
FIG. 18B is a horizontal cross-sectional view of the exemplary structure along the vertical plane B-B' of FIG. 18A. The hinged vertical plane A-A' corresponds to the plane of the vertical cross-sectional view of FIG. 18A.

Referring to FIGS. 18A and 18B, a photoresist layer 287 can be applied over the second contact level dielectric layer 282, and can be lithographically patterned to form various contact via openings (85, 87). For example, openings for forming drain contact via structures can be formed in the memory array region 100, and openings for forming staircase region contact via structures can be formed in the staircase region 200. An anisotropic etch process is performed to transfer the pattern in the photoresist layer through the second and first contact level dielectric layers (282, 280) and underlying dielectric material portions. The drain regions 63 and the electrically conductive layers (146, 246) can be used as etch stop structures. Drain contact via cavities 87 can be formed over each drain region 63, and staircase-region contact via cavities 85 can be formed over each electrically conductive layer (146, 246) at the stepped surfaces underlying the first and second retro-stepped dielectric material portions (165, 265). The photoresist layer 287 can be subsequently removed, for example, by ashing.

Figure 19A:
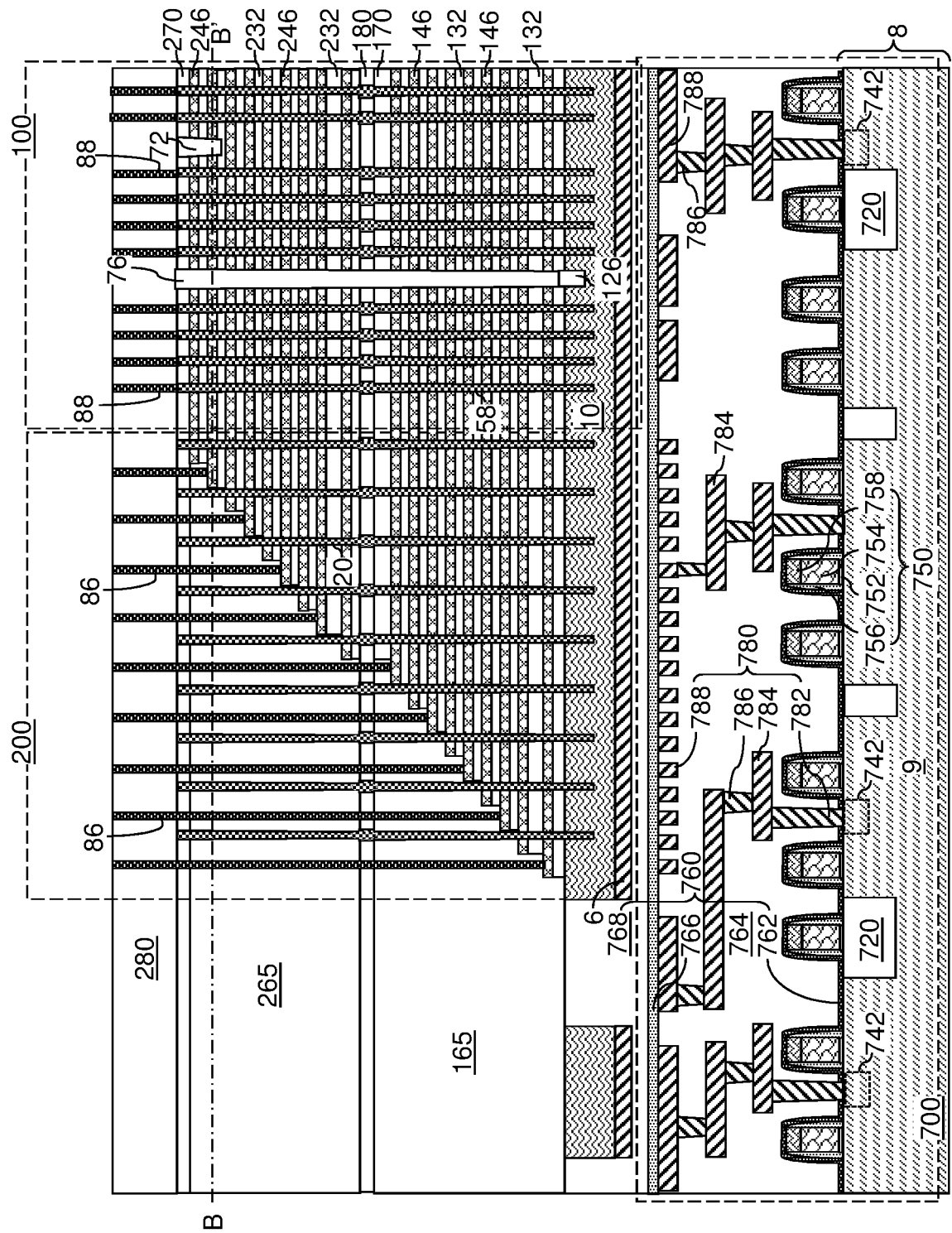
FIG. 19A is a vertical cross-sectional view of the exemplary structure after formation of various contact via structures according to an embodiment of the present disclosure.
Figure 19B:
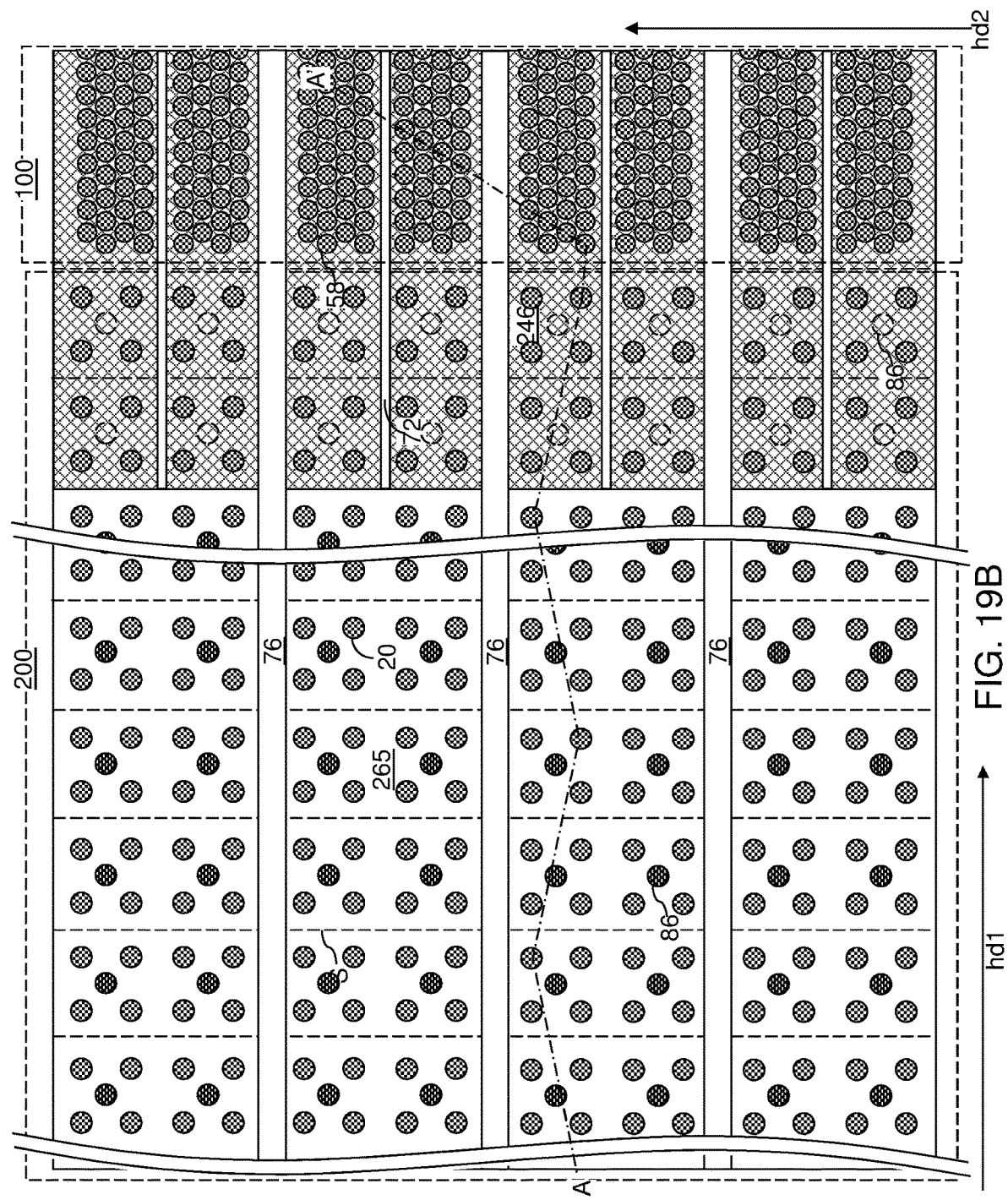
FIG. 19B is a horizontal cross-sectional view of the exemplary structure along the vertical plane B-B' of FIG. 19A. The hinged vertical plane A-A' corresponds to the plane of the vertical cross-sectional view of FIG. 19A.

Referring to FIGS. 19A and 19B, drain contact via structures 88 are formed in the drain contact via cavities 87 and on a top surface of a respective one of the drain regions 63. Staircase-region contact via structures 86 are formed in the staircase-region contact via cavities 85 and on a top surface of a respective one of the electrically conductive strips (146, 246). The staircase-region contact via structures 86 can include drain select level contact via structures that contact a subset of the second electrically conductive strips 246 that function as drain select level gate electrodes. Further, the staircase-region contact via structures 86 can include word line contact via structures that contact electrically conductive strips (146, 246) that underlie the drain select level gate electrodes and function as word lines for the memory stack structures 55.

Figure 20:
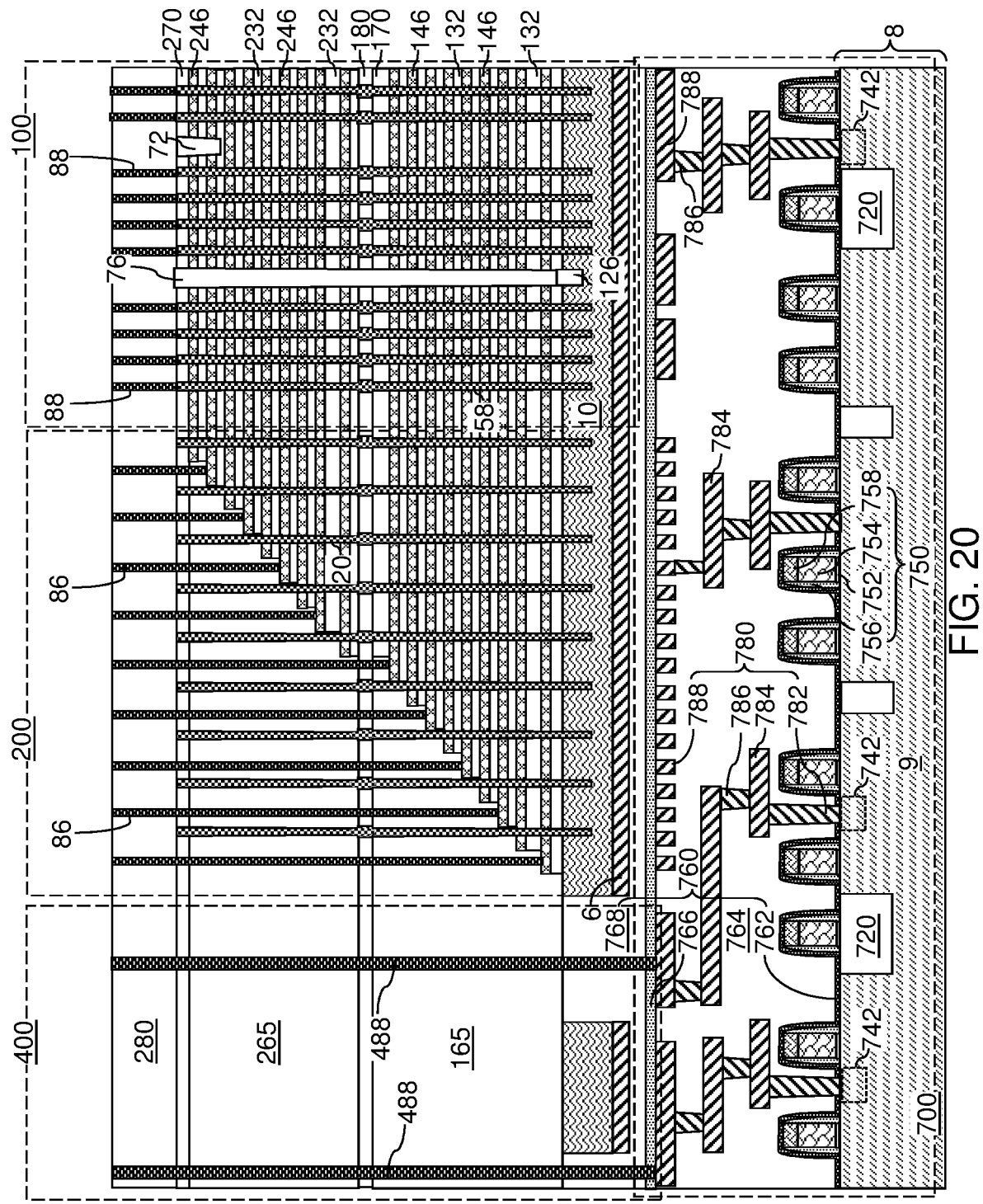
FIG. 20 is a vertical cross-sectional view of the exemplary structure after formation of through-memory-level contact via structures according to an embodiment of the present disclosure.

Referring to FIG. 20, peripheral-region via cavities can be formed through the second and first contact level dielectric layers (282, 280), the second and first retro-stepped dielectric material portions (265, 165), and the at least one second dielectric layer 768 to top surfaces of the lower metal interconnect structure 780 in the peripheral region 400. At least one conductive material can be deposited in the peripheral-region via cavities to form peripheral-region contact via structures 488.

Figure 21:
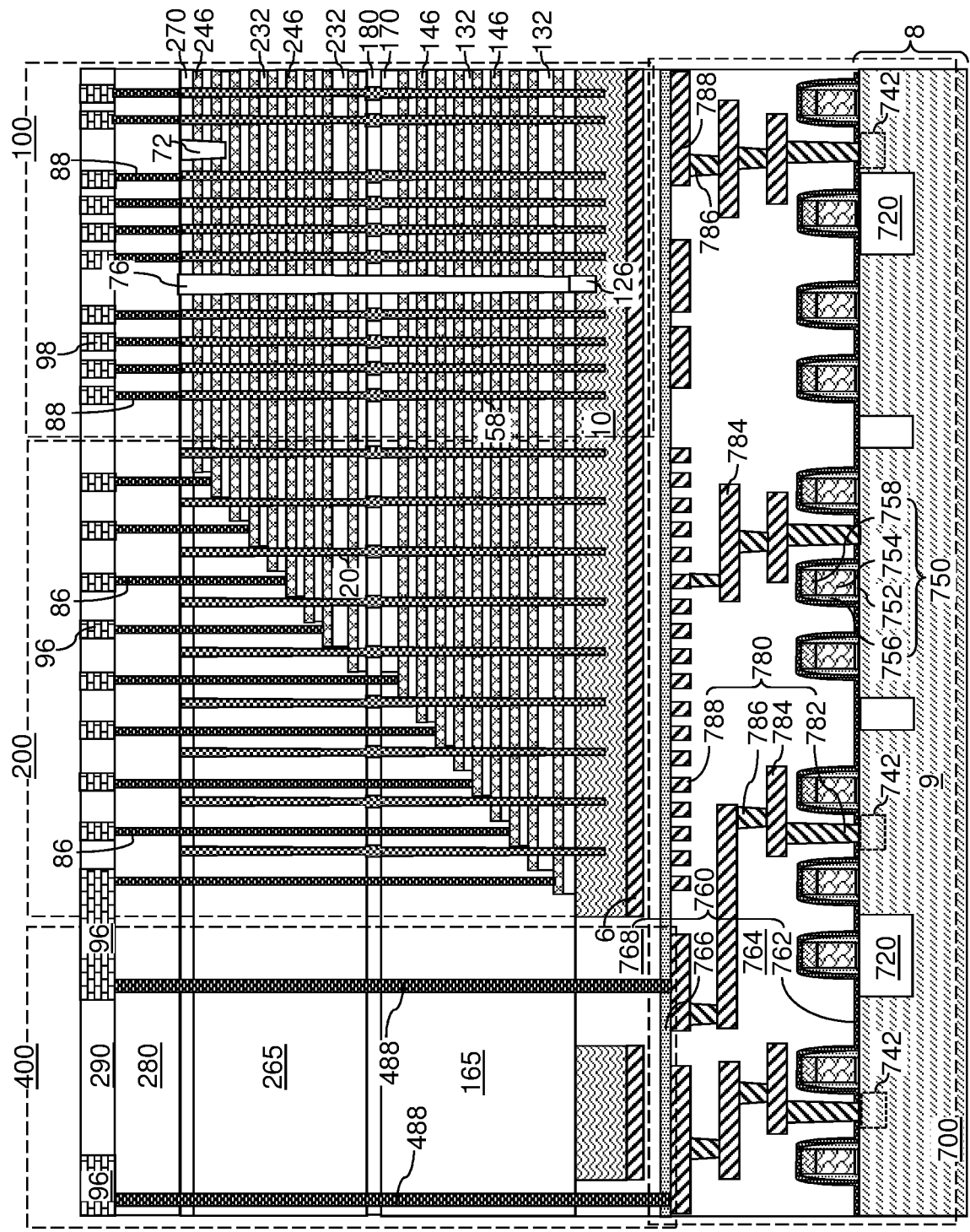
FIG. 21 is a vertical cross-sectional view of the exemplary structure after formation of upper metal line structures according to an embodiment of the present disclosure.

Referring to FIG. 21, at least one additional dielectric layer can be formed over the contact level dielectric layer 280, and additional metal interconnect structures (herein referred to as upper-level metal interconnect structures) can be formed in the at least one additional dielectric layer. For example, the at least one additional dielectric layer can include a line-level dielectric layer 290 that is formed over the contact level dielectric layer 280. The upper-level metal interconnect structures can include bit lines 98 contacting, or electrically connected to, a respective one of the drain contact via structures 88, and interconnection line structures 96 contacting, and/or electrically connected to, at least one of the staircase-region contact via structures 86, and the peripheral-region contact via structures 488.

Referring to all drawings and according to various embodiments of the present disclosure, a three-dimensional semiconductor device is provided, which comprises: source-level material layers 10 comprising a source contact layer 114 including a doped crystalline semiconductor material; an alternating stack of insulating layers (132, 232) and electrically conductive layers (146, 246) located over the source-level material layers 114; a memory opening 49 extending through the alternating stack {(132, 146), (232, 246)} and through the source contact layer 114; and a memory opening fill structure 58 including a memory film 50 and a vertical semiconductor channel 60 laterally surrounded by the memory film 50, wherein a semiconductor-to-semiconductor interface between the vertical semiconductor channel 60 and the source contact layer 114 is laterally offset farther away from a vertical axis VA passing through a geometrical center GC of the memory opening fill structure 58 than a semiconductor-to-dielectric interface between the vertical semiconductor channel 60 and the memory film 50 is from the vertical axis VA.

In one embodiment, the semiconductor-to-semiconductor interface comprises a cylindrical interface that vertically extends from a first plane HQ1 including a horizontal top surface of the source contact layer 114 to a second plane HQ2 including a horizontal bottom surface of the source contact layer 114.

In one embodiment, a predominant portion (i.e., more than 50%) of grain boundaries of the source contact layer 114 extend along lateral directions; and an average lateral dimension of the grain boundaries of the source contact layer 114 is at least a thickness of the source contact layer 114 that is a vertical distance between a top surface of the source contact layer 114 and a bottom surface of the source contact layer 114. In one embodiment, crystallographic orientations of grains of the vertical semiconductor channel 60 are aligned to crystallographic orientations of the grains of the source contact layer 114 at the semiconductor-to-semiconductor interface due to the epitaxial alignment provided by the selective semiconductor deposition process that deposits the material of the vertical semiconductor channels 60.

In one embodiment, the vertical semiconductor channel 60 contacts a bottom surface of the memory film 50. In one embodiment, the bottom surface of the memory film 50 is a tapered annular concave surface that vertically protrude further downward at a bottom periphery of an inner sidewall of the memory film 50 than at a bottom periphery of an outer sidewall of the memory film 50.

In one embodiment, the memory film 50 comprises a layer stack including: a blocking dielectric 52 contacting the alternating stack {(132, 146), (232, 246)}; a charge storage layer 54 contacting the blocking dielectric 52; and a tunneling dielectric 56 contacting the charge storage layer 54 and the vertical semiconductor channel 60. In one embodiment, the memory opening fill structure 58 comprises a bottom dielectric cap 250 that comprises: a first dielectric layer having a same composition and a same thickness as the blocking dielectric 56; a second dielectric layer having a same composition and a same thickness as the charge storage layer 54; and a third dielectric layer having a same composition and a same thickness as the tunneling dielectric 56 and contacting a bottommost surface of the vertical semiconductor channel 60.

In one embodiment, the vertical semiconductor channel 60 fills at least a volume that is laterally bounded by the memory film 50 and located between a first horizontal plane HP1 including a bottom surface of a bottommost one of the electrically conductive layers (146, 246) and a second horizontal plane HP2 including a top surface of a topmost one of the electrically conductive layers (146, 246).

In one embodiment, the source-level material layers 10 comprise: a source-level lower dielectric layer 113 contacting a bottom surface of the source contact layer 114; and at least one source-level upper dielectric layer (116, 117) contacting a top surface of the source contact layer 114. In one embodiment, the source-level lower dielectric layer 113 comprises a source-level lower silicon nitride layer; and the at least one source-level upper dielectric layer (116, 117) comprises a layer stack of a first source-level upper dielectric layer 116 and a second source-level upper dielectric layer 117 that overlies the source-level silicon nitride layer 116.

In one embodiment, a substrate 8 can underlie the source-level material layers 10; and at least one dielectric layer 760 can include metal interconnect structures 780, and can be located between the substrate 8 and the source-level material layers 10. The memory opening fill structure 58 and portions of the electrically conductive layers (146, 246) that are proximal to the memory opening fill structure 58 comprise a vertical NAND string.

In one embodiment, the three-dimensional memory device comprises a monolithic three-dimensional NAND memory device, the electrically conductive strips (146, 246) comprise, or are electrically connected to, a respective word line of the monolithic three-dimensional NAND memory device, the substrate 8 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The silicon substrate can contain an integrated circuit comprising a driver circuit for the memory device located thereon, the electrically conductive strips (146, 246) comprise a plurality of control gate electrodes having a strip shape extending substantially parallel to the top surface of the substrate 8, the plurality of control gate electrodes comprise at least a first control gate electrode located in the first device level and a second control gate electrode located in the second device level. The array of monolithic three-dimensional NAND strings comprises a plurality of semiconductor channels 60, wherein at least one end portion of each of the plurality of semiconductor channels 60 extends substantially perpendicular to a top surface of the substrate 8, and one of the plurality of semiconductor channels including the vertical semiconductor channel 60. The array of monolithic three-dimensional NAND strings comprises a plurality of charge storage elements (as embodied as portions of the memory films 50), each charge storage element located adjacent to a respective one of the plurality of semiconductor channels 60.

The vertical semiconductor channels 60 of various embodiments of the present disclosure include highly crystalline semiconductor material that can provide electrical conductivity on par with a single crystalline semiconductor material. The average grain size in the vertical semiconductor channels 60 can be on the order of the lesser of the average lateral dimension of the vertical semiconductor channels 60 and the height of the source contact layer 114. A metallic catalyst material diffuses through the semiconductor fill material layer 114' to convert the amorphous semiconductor material of the semiconductor fill material layer 114' into a highly crystalline doped semiconductor material of the source contact layer 114 having large grains. Physically exposed cylindrical surfaces of the source contact layer 114 have large grain sizes, and function as a template surface for epitaxially aligning the polycrystalline semiconductor material of the vertical semiconductor channels 60. Thus, the vertical semiconductor channels 60 can be formed with large grain sizes and provide high electrical conductivity. The vertical semiconductor channels 60 are replacement semiconductor channels that are formed with large grain sizes on a template surface having large grain areas formed by catalytic conversion of an amorphous semiconductor material. The high electrical conductivity of the vertical semiconductor channels 60 provides vertical extension of the vertical semiconductor channels 60, i.e., longer vertical semiconductor channels 60, and vertical stacking of more electrically conductive layers that function as word lines. Thus, a three-dimensional vertical NAND device can be scaled to include a greater number of word lines.

Referring to all drawings and according to various embodiments of the present disclosure, a method of forming a three-dimensional memory device is provided, which comprises: forming in-process source-level material layers over driver circuitry located on a substrate, wherein the in-process source-level material layers comprise a source-level sacrificial layer; forming an alternating stack of insulating layers and sacrificial material layers over the in-process source-level material layers; forming a memory opening through the alternating stack and down to the source-level sacrificial layer; forming a memory film and a sacrificial opening fill structure in the memory opening; replacing the source-level sacrificial layer with a source contact layer including a doped polycrystalline semiconductor material; replacing the sacrificial opening fill structure with a vertical semiconductor channel; and replacing the sacrificial material layers with electrically conductive layers. In an embodiment, the source contact layer is formed by: replacing the source-level sacrificial layer within a semiconductor fill material layer; and converting the semiconductor fill material layer into the source contact layer by diffusing a metal in a metallic catalyst material therethrough to an interface with the sacrificial opening fill structure.

One embodiment further comprises: forming a metal-semiconductor alloy portion on a surface of the semiconductor fill material layer at a location that is laterally offset from the memory opening; and laterally diffusing a metal within the metal-semiconductor alloy portion through the semiconductor fill material layer toward the sacrificial opening fill structure, wherein the semiconductor fill material layer is catalytically converted into the source contact layer. In such an embodiment, the semiconductor fill material layer may be formed amorphous; and lateral diffusion of the metal through the semiconductor fill material layer forms grain boundaries that extend predominantly along lateral directions within the source contact layer. Such an embodiment may further comprise: removing the sacrificial opening fill structure selective to the memory film; removing metal-containing regions of the source contact layer after removal of the sacrificial opening fill structure; and forming the vertical semiconductor channel by a selective semiconductor deposition process from a physically exposed surface of the source contact layer. In such an embodiment, a sidewall of the source contact layer may be laterally recessed relative to an inner sidewall of the memory film during removal of the metal-containing regions of the source contact layer, and the method further comprises forming a drain region in an upper portion of the memory opening after formation of the vertical semiconductor channel, wherein the memory opening is filled with a memory opening fill structure comprising the memory film, the vertical semiconductor channel, and the drain region; and a semiconductor-to-semiconductor interface between the vertical semiconductor channel and the source contact layer is laterally offset farther away from a vertical axis passing through a geometrical center of the memory opening fill structure than a semiconductor-to-dielectric interface between the vertical semiconductor channel and the memory film. In such an embodiment: the memory film may comprise a layer stack including a blocking dielectric contacting the alternating stack, a charge storage layer contacting the blocking dielectric, and a tunneling dielectric contacting the charge storage layer and the vertical semiconductor channel; and the vertical semiconductor channel may fill at least a volume that is laterally bounded by the memory film and located between a first horizontal plane including a bottom surface of a bottommost one of the sacrificial material layers and a top surface of a topmost one of the sacrificial material layers; and the memory opening fill structure and portions of the electrically conductive layers that are proximal to the memory opening fill structure comprise a vertical NAND string.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional semiconductor device, comprising:
    source-level material layers comprising a source contact layer including a doped crystalline semiconductor material;
    an alternating stack of insulating layers and electrically conductive layers located over the source-level material layers;
    a memory opening extending through the alternating stack and through the source contact layer; and
    a memory opening fill structure including a memory film and a vertical semiconductor channel laterally surrounded by the memory film, wherein a semiconductor-to-semiconductor interface between the vertical semiconductor channel and the source contact layer is laterally offset farther away from a vertical axis passing through a geometrical center of the memory opening fill structure than a semiconductor-to-dielectric interface between the vertical semiconductor channel and the memory film is from the vertical axis.

2. The three-dimensional memory device of claim 1, wherein:
    a predominant portion of grain boundaries of the source contact layer extend along lateral directions; and
    an average lateral dimension of the grain boundaries of the source contact layer is at least a thickness of the source contact layer that is a vertical distance between a top surface of the source contact layer and a bottom surface of the source contact layer.

3. The three-dimensional memory device of claim 2, wherein crystallographic orientations of grains of the vertical semiconductor channel are aligned to crystallographic orientations of the grains of the source contact layer at the semiconductor-to-semiconductor interface.

4. The three-dimensional memory device of claim 1, wherein the vertical semiconductor channel contacts a bottom surface of the memory film.

5. The three-dimensional memory device of claim 4, wherein the bottom surface of the memory film is a tapered annular concave surface that vertically protrude further downward at a bottom periphery of an inner sidewall of the memory film than at a bottom periphery of an outer sidewall of the memory film.

6. The three-dimensional memory device of claim 1 wherein the memory film comprises a layer stack including:
   a blocking dielectric contacting the alternating stack;
   a charge storage layer contacting the blocking dielectric; and
   a tunneling dielectric contacting the charge storage layer and the vertical semiconductor channel.

7. The three-dimensional memory device of claim 6, wherein the memory opening fill structure comprises a bottom dielectric cap that comprises:
   a first dielectric layer having a same composition and a same thickness as the blocking dielectric;
   a second dielectric layer having a same composition and a same thickness as the charge storage layer; and
   a third dielectric layer having a same composition and a same thickness as the tunneling dielectric and contacting a bottommost surface of the vertical semiconductor channel.

8. The three-dimensional memory device of claim 1, wherein the vertical semiconductor channel fills at least a volume that is laterally bounded by the memory film and located between a first horizontal plane including a bottom surface of a bottommost one of the electrically conductive layers and a second horizontal plane including a top surface of a topmost one of the electrically conductive layers.

9. The three-dimensional memory device of claim 1, wherein the semiconductor-to-semiconductor interface comprises a cylindrical interface that vertically extends from a first plane including a horizontal top surface of the source contact layer to a second plane including a horizontal bottom surface of the source contact layer.

10. The three-dimensional memory device of claim 1, wherein the source-level material layers comprise:
   a source-level lower dielectric layer contacting a bottom surface of the source contact layer; and
   at least one source-level upper dielectric layer contacting a top surface of the source contact layer.

11. The three-dimensional memory device of claim 10, wherein:
   the source-level lower dielectric layer comprises a silicon nitride layer; and
   the at least one source-level upper dielectric layer comprises a layer stack of a first source-level upper dielectric layer and a second source-level upper dielectric layer that overlies the silicon nitride layer.

12. The three-dimensional memory device of claim 1, wherein:
   the vertical semiconductor channel includes a void through which the vertical axis passing through the geometrical center of the memory opening fill structure extends; and
   the void is located between a horizontal plane including a bottom surface of the source contact layer and a horizontal plane including a top surface of the source contact layer.

13. The three-dimensional memory device of claim 1, further comprising:
   a substrate underlying the source-level material layers; and
   at least one dielectric layer including metal interconnect structures and located between the substrate and the source-level material layers,
   wherein the memory opening fill structure and portions of the electrically conductive layers that are proximal to the memory opening fill structure comprise a vertical NAND string.

* * * * *